US012564047B2

(12) United States Patent
Sahni

(10) Patent No.: US 12,564,047 B2
(45) Date of Patent: Feb. 24, 2026

(54) THERMAL CONTROL OF AN OPTICAL COMPONENT

(71) Applicant: Celestial AI Inc., Santa Clara, CA (US)

(72) Inventor: Subal Sahni, La Jolla, CA (US)

(73) Assignee: Celestial AI Inc., Santa Clara, CA (US)

( * ) Notice: Subject to any disclaimer, the term of this patent is extended or adjusted under 35 U.S.C. 154(b) by 332 days.

(21) Appl. No.: 18/123,170

(22) Filed: Mar. 17, 2023

(65) Prior Publication Data

US 2024/0145328 A1 May 2, 2024

Related U.S. Application Data

(60) Provisional application No. 63/420,330, filed on Oct. 28, 2022, provisional application No. 63/420,323, filed on Oct. 28, 2022.

(51) Int. Cl.
| | |
|---|---|
| *H01L 23/34* | (2006.01) |
| *G02F 1/015* | (2006.01) |
| *H01L 25/16* | (2023.01) |

(52) U.S. Cl.
CPC ............ *H01L 23/34* (2013.01); *G02F 1/0157* (2021.01); *H01L 25/167* (2013.01)

(58) Field of Classification Search
CPC ...... H01L 23/34; H01L 25/167; G02F 1/0157
See application file for complete search history.

(56) References Cited

U.S. PATENT DOCUMENTS

| | | | |
|---|---|---|---|
| 4,912,706 | A | 3/1990 | Eisenberg et al. |
| 4,934,775 | A | 6/1990 | Koai |

| | | | |
|---|---|---|---|
| 5,457,563 | A | 10/1995 | Van Deventer |
| 5,541,914 | A | 7/1996 | Krishnamoorthy et al. |
| 6,249,621 | B1 | 6/2001 | Sargent et al. |
| 6,714,552 | B1 | 3/2004 | Cotter |
| 6,908,856 | B2 | 6/2005 | Beyne et al. |
| 7,034,641 | B1 | 4/2006 | Clarke et al. |
| 7,778,501 | B2 | 8/2010 | Beausoleil et al. |
| 7,889,996 | B2 | 2/2011 | Zheng et al. |
| 7,894,699 | B2 | 2/2011 | Beausoleil |
| 7,961,990 | B2 | 6/2011 | Krishnamoorthy et al. |
| 8,064,739 | B2 | 11/2011 | Binkert et al. |

(Continued)

FOREIGN PATENT DOCUMENTS

| | | |
|---|---|---|
| AU | 2019100030 A | 2/2019 |
| AU | 2019100679 A | 8/2019 |

(Continued)

OTHER PUBLICATIONS

U.S. Appl. No. 17/807,692, Jan. 28, 2025, Office Action.

(Continued)

*Primary Examiner* — Omar F Mojaddedi
(74) *Attorney, Agent, or Firm* — Ray Quinney & Nebeker P.C.; James S. Bullough

(57) ABSTRACT

The present disclosure relates to thermal control systems, photonic memory fabrics, and electro-absorption modulators (EAMs). For example, the thermal control systems efficiently move data in a memory fabric based on utilizing and controlling thermally controlling optical components. As another example, the EAMs are instances of optical modulators used to efficiently move data within digital circuits while maintaining thermally-stable optical modulation across a wide temperature range.

20 Claims, 20 Drawing Sheets

(56) References Cited

U.S. PATENT DOCUMENTS

| | | | |
|---|---|---|---|
| 8,213,751 B1 | 7/2012 | Ho et al. | |
| 8,260,147 B2 | 9/2012 | Scandurra et al. | |
| 8,285,140 B2 | 10/2012 | McCracken et al. | |
| 8,326,148 B2 | 12/2012 | Bergman et al. | |
| 8,340,517 B2 | 12/2012 | Shacham et al. | |
| 8,447,146 B2 | 5/2013 | Beausoleil et al. | |
| 8,611,747 B1 | 12/2013 | Wach | |
| 9,036,482 B2 | 5/2015 | Lea | |
| 9,354,039 B2 | 5/2016 | Mower et al. | |
| 9,369,784 B2 | 6/2016 | Zid et al. | |
| 9,495,295 B1 | 11/2016 | Dutt et al. | |
| 9,791,761 B1 | 10/2017 | Li et al. | |
| 9,831,360 B2 | 11/2017 | Knights et al. | |
| 9,882,655 B2 | 1/2018 | Li et al. | |
| 10,031,287 B1 | 7/2018 | Heroux et al. | |
| 10,107,959 B2 | 10/2018 | Heroux et al. | |
| 10,117,007 B2 | 10/2018 | Song et al. | |
| 10,185,085 B2 | 1/2019 | Huangfu et al. | |
| 10,225,632 B1 | 3/2019 | Dupuis et al. | |
| 10,250,958 B2 | 4/2019 | Chen et al. | |
| 10,268,232 B2 | 4/2019 | Harris et al. | |
| 10,281,747 B2 | 5/2019 | Padmaraju et al. | |
| 10,365,445 B2 | 7/2019 | Badihi et al. | |
| 10,564,512 B2 | 2/2020 | Sun et al. | |
| 10,598,852 B1 | 3/2020 | Zhao et al. | |
| 10,651,933 B1 | 5/2020 | Chiang et al. | |
| 10,837,827 B2 | 11/2020 | Nahmias et al. | |
| 10,908,369 B1 | 2/2021 | Mahdi et al. | |
| 10,915,297 B1 | 2/2021 | Halutz et al. | |
| 10,935,722 B1 | 3/2021 | Li et al. | |
| 10,951,325 B1 | 3/2021 | Rathinasamy et al. | |
| 10,962,728 B2 | 3/2021 | Nelson et al. | |
| 10,976,491 B2 | 4/2021 | Coolbaugh et al. | |
| 11,107,770 B1 | 8/2021 | Ramalingam et al. | |
| 11,157,807 B2 | 10/2021 | Abel et al. | |
| 11,165,509 B1 | 11/2021 | Nagarajan et al. | |
| 11,165,711 B2 | 11/2021 | Mehrvar et al. | |
| 11,233,580 B2 | 1/2022 | Meade et al. | |
| 11,321,092 B1 | 5/2022 | Raikin et al. | |
| 11,336,376 B1 | 5/2022 | Xie | |
| 11,475,367 B2 | 10/2022 | Lazovich et al. | |
| 11,493,714 B1 | 11/2022 | Mendoza et al. | |
| 11,500,153 B2 | 11/2022 | Meade et al. | |
| 11,509,397 B2 | 11/2022 | Ma et al. | |
| 11,769,710 B2 | 9/2023 | Refai-Ahmed et al. | |
| 11,817,903 B2 | 11/2023 | Pleros et al. | |
| 12,061,978 B2 | 8/2024 | Zalevsky et al. | |
| 12,191,257 B2 | 1/2025 | Aggarwal | |
| 12,353,006 B2 | 7/2025 | Winterbottom et al. | |
| 2002/0118713 A1* | 8/2002 | Shirai | H01S 5/02325 |
| | | | 372/45.01 |
| 2004/0213229 A1 | 10/2004 | Chang et al. | |
| 2006/0159387 A1 | 7/2006 | Handelman | |
| 2006/0204247 A1 | 9/2006 | Murphy | |
| 2008/0067677 A1 | 3/2008 | Lin et al. | |
| 2009/0026607 A1 | 1/2009 | Huebner et al. | |
| 2010/0148210 A1 | 6/2010 | Huang et al. | |
| 2010/0266295 A1* | 10/2010 | Zheng | H04J 14/0227 |
| | | | 398/201 |
| 2011/0206379 A1 | 8/2011 | Budd | |
| 2012/0020663 A1 | 1/2012 | McLaren | |
| 2012/0251116 A1 | 10/2012 | Li et al. | |
| 2013/0275703 A1 | 10/2013 | Schenfeld | |
| 2013/0308942 A1 | 11/2013 | Ji et al. | |
| 2015/0109024 A1 | 4/2015 | Abdelfattah et al. | |
| 2015/0249073 A1* | 9/2015 | Herrmann | H01L 25/165 |
| | | | 257/459 |
| 2015/0341119 A1 | 11/2015 | Fincato et al. | |
| 2015/0354938 A1 | 12/2015 | Mower et al. | |
| 2016/0116688 A1 | 4/2016 | Hochberg et al. | |
| 2016/0131862 A1 | 5/2016 | Rickman et al. | |
| 2016/0344507 A1 | 11/2016 | Marquardt et al. | |
| 2017/0045697 A1 | 2/2017 | Hochberg et al. | |
| 2017/0115458 A1 | 4/2017 | Mekis et al. | |
| 2017/0141142 A1* | 5/2017 | Leobandung | H01L 25/50 |

| | | | |
|---|---|---|---|
| 2017/0194309 A1 | 7/2017 | Evans et al. | |
| 2017/0194310 A1 | 7/2017 | Evans et al. | |
| 2017/0207600 A1 | 7/2017 | Klamkin et al. | |
| 2017/0220352 A1 | 8/2017 | Woo et al. | |
| 2017/0237226 A1 | 8/2017 | Johnson et al. | |
| 2017/0261708 A1 | 9/2017 | Ding et al. | |
| 2017/0285372 A1 | 10/2017 | Baba et al. | |
| 2018/0107030 A1 | 4/2018 | Morton et al. | |
| 2018/0260703 A1 | 9/2018 | Soljacic et al. | |
| 2019/0026225 A1 | 1/2019 | Gu et al. | |
| 2019/0049665 A1 | 2/2019 | Ma et al. | |
| 2019/0067260 A1 | 2/2019 | Koyama et al. | |
| 2019/0089466 A1 | 3/2019 | Li et al. | |
| 2019/0205737 A1 | 7/2019 | Bleiweiss et al. | |
| 2019/0265408 A1 | 8/2019 | Ji et al. | |
| 2019/0266088 A1 | 8/2019 | Kumar | |
| 2019/0266089 A1 | 8/2019 | Kumar | |
| 2019/0294199 A1 | 9/2019 | Carolan et al. | |
| 2019/0305027 A1 | 10/2019 | Qian et al. | |
| 2019/0317285 A1 | 10/2019 | Liff | |
| 2019/0317287 A1 | 10/2019 | Raghunathan et al. | |
| 2019/0333905 A1 | 10/2019 | Raghunathan et al. | |
| 2019/0356394 A1 | 11/2019 | Bunandar et al. | |
| 2019/0372589 A1 | 12/2019 | Gould | |
| 2019/0385997 A1 | 12/2019 | Choi et al. | |
| 2020/0006304 A1 | 1/2020 | Chang et al. | |
| 2020/0125716 A1 | 4/2020 | Chittamuru et al. | |
| 2020/0142441 A1 | 5/2020 | Bunandar et al. | |
| 2020/0158967 A1 | 5/2020 | Winzer et al. | |
| 2020/0174707 A1 | 6/2020 | Johnson et al. | |
| 2020/0200987 A1 | 6/2020 | Kim | |
| 2020/0209655 A1 | 7/2020 | Roth et al. | |
| 2020/0213028 A1 | 7/2020 | Behringer et al. | |
| 2020/0250532 A1 | 8/2020 | Shen et al. | |
| 2020/0284981 A1 | 9/2020 | Harris et al. | |
| 2020/0310761 A1 | 10/2020 | Rossi et al. | |
| 2020/0327403 A1 | 10/2020 | Du et al. | |
| 2020/0409001 A1 | 12/2020 | Liang et al. | |
| 2020/0410330 A1 | 12/2020 | Liu et al. | |
| 2021/0036783 A1 | 2/2021 | Bunandar et al. | |
| 2021/0064958 A1 | 3/2021 | Lin et al. | |
| 2021/0072784 A1 | 3/2021 | Lin et al. | |
| 2021/0116637 A1 | 4/2021 | Li et al. | |
| 2021/0132309 A1 | 5/2021 | Zhang et al. | |
| 2021/0132650 A1 | 5/2021 | Wenhua et al. | |
| 2021/0133547 A1 | 5/2021 | Wenhua et al. | |
| 2021/0173238 A1 | 6/2021 | Hosseinzadeh | |
| 2021/0215897 A1 | 7/2021 | Epitaux et al. | |
| 2021/0257396 A1 | 8/2021 | Piggott et al. | |
| 2021/0266200 A1 | 8/2021 | Yang | |
| 2021/0271020 A1 | 9/2021 | Islam et al. | |
| 2021/0286129 A1 | 9/2021 | Fini et al. | |
| 2021/0305127 A1 | 9/2021 | Refai-Ahmed et al. | |
| 2021/0406164 A1 | 12/2021 | Grymel et al. | |
| 2021/0409848 A1 | 12/2021 | Saunders et al. | |
| 2022/0003948 A1 | 1/2022 | Zhou et al. | |
| 2022/0004029 A1* | 1/2022 | Meng | G02F 1/025 |
| 2022/0012578 A1 | 1/2022 | Brady et al. | |
| 2022/0012582 A1 | 1/2022 | Pleros et al. | |
| 2022/0044092 A1 | 2/2022 | Pleros et al. | |
| 2022/0091332 A1 | 3/2022 | Yoo et al. | |
| 2022/0092016 A1 | 3/2022 | Kumashikar | |
| 2022/0159860 A1 | 5/2022 | Winzer et al. | |
| 2022/0171142 A1 | 6/2022 | Wright et al. | |
| 2022/0293820 A1* | 9/2022 | Fitzgerald | H01L 25/167 |
| 2022/0302033 A1 | 9/2022 | Cheah et al. | |
| 2022/0342164 A1 | 10/2022 | Chen et al. | |
| 2022/0374575 A1 | 11/2022 | Ramey et al. | |
| 2022/0382005 A1 | 12/2022 | Rusu | |
| 2022/0405562 A1 | 12/2022 | Winterbottom et al. | |
| 2023/0006417 A1* | 1/2023 | Von Malm | G01S 7/4814 |
| 2023/0089415 A1 | 3/2023 | Zilkie et al. | |
| 2023/0197699 A1 | 6/2023 | Spreitzer et al. | |
| 2023/0251423 A1 | 8/2023 | Lopez et al. | |
| 2023/0258886 A1 | 8/2023 | Liao | |
| 2023/0282547 A1 | 9/2023 | Refai-Ahmed et al. | |
| 2023/0296838 A1 | 9/2023 | Lazovsky et al. | |
| 2023/0308188 A1 | 9/2023 | Dorta-Quinones | |
| 2023/0309353 A1* | 9/2023 | Jin | H10K 59/131 |

(56) References Cited

U.S. PATENT DOCUMENTS

| | | | |
|---|---|---|---|
| 2023/0314702 | A1 | 10/2023 | Yu |
| 2023/0376818 | A1 | 11/2023 | Nowak |
| 2023/0393357 | A1 | 12/2023 | Ranno |
| 2024/0013041 | A1 | 1/2024 | Pleros et al. |

FOREIGN PATENT DOCUMENTS

| | | | |
|---|---|---|---|
| AU | 2019100750 | A | 8/2019 |
| CN | 1484877 | A | 3/2004 |
| CN | 102281478 | A | 12/2011 |
| CN | 102333250 | A | 1/2012 |
| CN | 102413039 | A | 4/2012 |
| CN | 102638311 | A | 8/2012 |
| CN | 102645706 | A | 8/2012 |
| CN | 202522621 | U | 11/2012 |
| CN | 103369415 | A | 10/2013 |
| CN | 103442311 | A | 12/2013 |
| CN | 103580890 | A | 2/2014 |
| CN | 104539547 | A | 4/2015 |
| CN | 105451103 | A | 3/2016 |
| CN | 205354341 | U | 6/2016 |
| CN | 105812063 | A | 7/2016 |
| CN | 105847166 | A | 8/2016 |
| CN | 106068579 | A | 11/2016 |
| CN | 106126471 | A | 11/2016 |
| CN | 106331909 | A | 1/2017 |
| CN | 106407154 | A | 2/2017 |
| CN | 106533993 | A | 3/2017 |
| CN | 106549874 | A | 3/2017 |
| CN | 106796324 | | 5/2017 |
| CN | 106888050 | A | 6/2017 |
| CN | 106911521 | A | 6/2017 |
| CN | 106936708 | A | 7/2017 |
| CN | 106936736 | A | 7/2017 |
| CN | 106980160 | A | 7/2017 |
| CN | 107911761 | A | 4/2018 |
| CN | 108599850 | A | 9/2018 |
| CN | 207835452 | U | 9/2018 |
| CN | 108737011 | A | 11/2018 |
| CN | 110266585 | A | 9/2019 |
| CN | 110505021 | A | 11/2019 |
| CN | 111208690 | A | 5/2020 |
| CN | 111752891 | A | 10/2020 |
| CN | 111770019 | A | 10/2020 |
| CN | 111786911 | A | 10/2020 |
| FR | 3007537 | A | 12/2014 |
| GB | 2223867 | | 4/1990 |
| IN | 201621017235 | A | 7/2016 |
| IN | 202121008267 | A | 4/2021 |
| JP | 6747660 | B | 8/2020 |
| JP | 2020155112 | | 9/2020 |
| KR | 101242172 | B | 3/2013 |
| KR | 101382606 | B | 4/2014 |
| KR | 101465420 | B | 11/2014 |
| KR | 101465498 | B | 11/2014 |
| KR | 101541534 | B | 8/2015 |
| KR | 101548695 | B | 9/2015 |
| KR | 101766786 | B | 8/2017 |
| KR | 101766792 | B | 8/2017 |
| WO | WO2015176289 | | 11/2015 |
| WO | WO2020072925 | | 4/2020 |
| WO | WO2020102204 | | 5/2020 |
| WO | WO2020191217 | | 9/2020 |
| WO | WO2021021787 | | 2/2021 |
| WO | WO2022032105 | | 2/2022 |
| WO | WO2022133490 | | 6/2022 |
| WO | WO2023177417 | | 9/2022 |
| WO | WO2022266676 | | 12/2022 |
| WO | WO2023177922 | | 9/2023 |

OTHER PUBLICATIONS

U.S. Appl. No. 18/123,161, Mar. 20, 2025, Office Action.
U.S. Appl. No. 18/293,673, Mar. 21, 2025, Office Action.

U.S. Appl. No. 63/049,928, filed Jul. 9, 2020, Pleros et al.
U.S. Appl. No. 63/062,163, filed Aug. 6, 2020, Pleros et al.
U.S. Appl. No. 63/199,286, filed Dec. 17, 2020, Ma et al.
U.S. Appl. No. 63/199,412, filed Dec. 23, 2022, Ma et al.
U.S. Appl. No. 63/201,155, filed Apr. 15, 2021, Ma et al.
U.S. Appl. No. 63/261,974, filed Oct. 1, 2021, Pleros et al.
U.S. Appl. No. 63/212,353, filed Jun. 18, 2021, Winterbottom et al.
U.S. Appl. No. 17/807,692, filed Jun. 17, 2022, Winterbottom et al.
U.S. Appl. No. 17/807,694, filed Jun. 17, 2022, Winterbottom et al.
U.S. Appl. No. 17/807,698, filed Jun. 17, 2022, Winterbottom et al.
U.S. Appl. No. 17/807,699, filed Jun. 17, 2022, Winterbottom et al.
U.S. Appl. No. 17/807,695, filed Jun. 17, 2022, Winterbottom et al.
U.S. Appl. No. 63/321,453, filed Mar. 18, 2022, Bos et al.
U.S. Appl. No. 17/903,455, filed Sep. 6, 2022, Lazovsky et al.
U.S. Appl. No. 18/123,161, filed Mar. 17, 2023, Bos et al.
U.S. Appl. No. 17/957,731, filed Sep. 30, 2022, Pleros et al.
U.S. Appl. No. 17/957,812, filed Sep. 30, 2022, Pleros et al.
U.S. Appl. No. 63/420,323, filed Oct. 28, 2022, Sahni.
U.S. Appl. No. 63/420,330, filed Oct. 28, 2022, Sahni et al.
U.S. Appl. No. 63/428,663, filed Nov. 29, 2022, Sahni et al.
U.S. Appl. No. 63/441,689, filed Jan. 27, 2023, Winterbottom.
U.S. Appl. No. 63/579,486, filed Aug. 29, 2023, Aggarwal et al.
U.S. Appl. No. 63/535,509, filed Aug. 30, 2023, Winterbottom et al.
U.S. Appl. No. 63/535,511, filed Aug. 30, 2023, Winterbottom et al.
U.S. Appl. No. 63/535,512, filed Aug. 30, 2023, José Maia da Silva et al.
U.S. Appl. No. 63/592,509, filed Oct. 23, 2023, Aggarwal et al.
U.S. Appl. No. 63/592,517, filed Oct. 23, 2023, Winterbottom et al.
U.S. Appl. No. 18/473,898, filed Sep. 25, 2023, Pleros et al.
U.S. Appl. No. 18/523,667, filed Nov. 29, 2023, Sahni et al.
Ardestani, et al., "Supporting Massive DLRM Inference Through Software Defined Memory", Nov. 8, 2021; 14 pages.
Agrawal, Govind; "Chapter 4—Optical Receivers", Fiber-Optic Communications Systems, John Wiley & Sons, Inc., (2002), pp. 133-182.
Burgwal, Roel et al.; "Using an imperfect photonic network to implement random unitaries," Opt. Express 25(23), (2017), 28236-28245.
Capmany, Francoy et al.; "Thepgrammable processor" Nature Photonics, 109/22/20226, (2016), 5 pgs.
Carolan, Jacques et al.; "Universal Linear Optics"; arXiv: 1505.01182v1; (2015); 13 pgs.
Clements, William et al; "Optimal design for universal multiport interferometers"; Optica; vol. 3, No. 12; (2016), pp. 1460-1465.
Eltes, Felix et al.; "A BaTiO3-Based Electro-Optic Pockets Modulator Monolithically Integrated on an Advanced Silicon Photonics Platform"; J. Lightwave Technol. vol. 37, No. 5; (2019), pp. 1456-1462.
Eltes, Felix et al.; Low-Loss BaTiO3—Si Waveguides for Nonlinear Integrated Photonics; ACS Photon., vol. 3, No. 9; (2016), pp. 1698-1703.
Harris, NC et al.; "Efficient, compact and low loss thermo-optic phase shifter in colicon"; Opt. Express, vol. 22, No. 9; (2014), pp. 10487-10493.
Jiang, W.; "Nonvolatile and ultra-low-loss reconfigurable mode (De) multiplexer/switch using triple-waveguide coupler with Ge2Sb2Se4T31 phase change material"; Sci. Rep. vol. 8, No. 1; (2018), 12 pages.
Lambrecht, Joris et al.; "90-GB/s NRZ Optical Receiveer in Silicon Using a Fully Differential Transimpedance Aplifier," Journal of Lightwave Technology, vol. 37, No. 9; (2019); pp. 1964-1973.
Manolis, A. et al; "Non-volatile integrated photonic memory using GST phase change material on a fully eched Si3N4/SiO2 waveguide"; Conference on Lasers and Electro-optics; OSA Technical Digest, paper STh3R.4; (2020); 2 pages.
Miller, David A. et al.; "Perfect optics with imperfect components"; Optica, vol. 2, No. 8; (2015); pp. 747-750.
Miller, David A. et al.; "Self-Configuring Universal Linear Optical Component"; Photon. Res. 1; [Online]; Retrieved from the interent: URL: https://arxiv.org/ftp/arxiv/papers/1303/1303.4602.pdf; (2013), pp. 1-15.
Miscuglio, Mario et al.; "Photonic Tensor cores for machine learning"; Applied Physics Reviews, vol. 7, Issue 3; (2020), 16 pages.

(56) References Cited

OTHER PUBLICATIONS

Mourgias-Alexandris, George et al; "An all-optical neuron with sigmoid activation function;" Optics Express, vol. 27, No. 7; (2019), pp. 9620-9630.

Mourgias-Alexandris, George et al; Neuromorphic Photonics with Coherent Linear Neurons Using Dual-IQ Modulation Cells, Journal of Lightwave Technology, vol. 38, No. 4; Feb. 15, 2020, pp. 811-819.

Pai, Sunil et al.; "Parallel Programming of an Arbitrary Feedforward Photonic Network"; IEEE Journal of Selected Topics in Quantum Electronics, vol. 26, No. 5; (2020), 13 pages.

Perez, Daniel et al. "Reconfigurable lattice mesh designs for prgrammable photonic processors"; Optics Express vol. 24, Issue 11; (2016); pp. 12093-12106.

Raj, Mayank et al.; "Design of a 50-GB/s Hybid Integrated Si-Photonic Optical Link in 16-nm FinFET"; IEEE Journal of Solid-State Circuits, vol. 55, No. 4, Apr. 2020, pp. 1086-1095.

Reck, M. et al.; "Experimental Realization of any Discrete Unitary Operator"; Phys. Rev. Lett. 73; (1994); pp. 58-61.

Shen, Yichen et al; "Deep learning with coherent nanophotonic circuits"; https://arxiv.org/pdf/1610.02365.pdf; (2016); 8 pages.

Shi, Bin et al.; Numerical Simulation of an InP Photonic Integrated Cross-Connect for Deep Neural Networks on Chip; Applied Sciences, Jan. 9, 2020, pp. 1-15.

Shokraneh, Farhad et al; "The diamond mesh, a phase-error- and loss-tolerant fieldprogrammable MZI-based optical processor for optical neural networks" Opt. Express, vol. 28, No. 16; (2020); pp. 23495-23508.

Sun, Chen et al; "A 45 nm cmos-soi monolithic photonics platform with bit-statistics-based resonant microring thermal tuning"; IEEE Journal of Solid-State Circuits, vol. 51, No. 4; (2016); 20 pages.

Tait, Alexander et al; "Broadcast and Weight: An Intergated Network for Scalable Photonic Spike Processing"; Journal of Lightwave Technology, vol. 32, No. 21; (2014); pp. 4029-4041.

Yang, Lin et al; "On-chip CMOS-compatible optical signal processor"; Opt. Express, vol. 20, No. 12; (2012) pp. 13560-13565.

Zhuang, L. et al; Programmable photonic signal processor chip for radiofrequency applications; Optica 2; 854-859; (2015); 10 pages.

U.S. Appl. No. 17/395,849, Jan. 5, 2023, Office Action.

U.S. Appl. No. 17/395,849, Jul. 24, 2023, Notice of Allowance.

U.S. Appl. No. 17/645,001, Jul. 20, 2022, Notice of Allowance.

PCT/US2021/044956, Nov. 19, 2021, International Search Report and Written Opinion.

PCT/US2021/073003, Mar. 22, 2022, International Search Report and Written Opinion.

PCT/US2022/073039, Sep. 1, 2022, Invitation ot Pay Addtional Fees.

PCT/US2022/073039, Dec. 2, 2022, International Search Report and Written Opinon.

PCT/US2022/042621, Feb. 15, 2023, International Search Report and Written Opinion.

PCT/US2023/015680, May 23, 2023, Invitation to Pay Additional Fees.

PCT/US2023/015680, Aug. 23, 2023, International Search Report and Written Opinion.

Dakkak, A.D. et al "Accelerating Reduction and Scan Using Tensor Core Units, 2019,ACM,pp. 46-57."

U.S. Appl. No. 18/590,708, Oct. 1, 2024, Office Action.

U.S. Appl. No. 17/807,699, Oct. 1, 2024, Office Action.

U.S. Appl. No. 18/423,210, Sep. 30, 2024, Notice of Allowance.

U.S. Appl. No. 18/540,579, Oct. 8, 2024, Office Action.

U.S. Appl. No. 18/293,673, filed Jan. 30, 2024, Bos et al.

U.S. Appl. No. 18/407,408, filed Jan. 8, 2024, Aggarwal.

U.S. Appl. No. 18/407,410, filed Jan. 8, 2024, Aggarwal.

U.S. Appl. No. 18/423,210, filed Jan. 25, 2024, Winterbottom.

U.S. Appl. No. 18/540,579, filed Dec. 14, 2023, Winterbottom et al.

U.S. Appl. No. 18/590,689, filed Feb. 28, 2024, Winterbottom et al.

U.S. Appl. No. 18/590,703, filed Feb. 28, 2024, Winterbottom et al.

U.S. Appl. No. 18/590,708, filed Feb. 28, 2024, Winterbottom et al.

U.S. Appl. No. 18/540,579, Feb. 14, 2024, Office Action.

U.S. Appl. No. 17/807,692, Feb. 15, 2024, Restriction Requirement.

U.S. Appl. No. 18/407,408, Mar. 28, 2024, Office Action.

U.S. Appl. No. 18/407,410, Mar. 15, 2024, Restriction Requirement.

20220404544, Jan. 19, 2024, Foreign Office Action.

202180068303.5, Jan. 20, 2024, Foreign Office Action.

PCT/US2022/042621, Feb. 26, 2024, International Preliminary Report on Patentability.

U.S. Appl. No. 18/407,408, Oct. 2, 2024, Notice of Allowance.

2023-537068, Oct. 1, 2024, Foreign Office Action.

11202304676X, Oct. 4, 2024, Foreign Notice of Allowance.

U.S. Appl. No. 18/590,689, Nov. 7, 2024, Office Action.

U.S. Appl. No. 18/407,410, Oct. 22, 2024, Notice of Allowance.

U.S. Appl. No. 63/392,475, filed Jul. 26, 2022, Aggarwal et al.

U.S. Appl. No. 18/076,196, filed Dec. 6, 2022, Aggarwal et al.

U.S. Appl. No. 18/076,210, filed Dec. 6, 2022, Aggarwal et al.

U.S. Appl. No. 18/217,898, filed Jul. 3, 2023, Aggarwal et al.

U.S. Appl. No. 63/437,639, filed Jan. 6, 2023, Plunkett et al.

U.S. Appl. No. 63/437,641, filed Jan. 6, 2023, Plunkett et al.

Hendry, G. et al.; "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12.

Liu, Jifeng, et al; "Waveguide-integrated, ultralow-energy GeSi electro-absorption modulators", Nature Photonics, [Online] vol. 2, No. 7, May 30, 2008 (May 30, 2008), pp. 433-437.

Wu, Longsheng et al.; "Design of a broadband Ge 1-20 1-x Six electro-absorption modulator based on the Franz-Keldysh effect with thermal tuning", Optics Express, [Online] vol. 28, No. 5, Feb. 27, 2020 (Feb. 27, 2020), p. 7585.

Zhang, Yulong; "Building blocks of a silicon photonic integrated wavelength division multiplexing transmitter for detector instrumentation" , Doktors Der Ingenieurwissenschaften (Dr.-Ing. ), Dec. 15, 2020 (Dec. 15, 2020), 128 pages.

U.S. Appl. No. 18/540,579, May 1, 2024, Office Action.

U.S. Appl. No. 17/807,692, Jul. 12, 2024, Office Action.

U.S. Appl. No. 18/407,408, Jul. 30, 2024, Notice of Allowance.

U.S. Appl. No. 18/407,410, May 24, 2024, Office Action.

U.S. Appl. No. 18/407,410, Aug. 12, 2024, Notice of Allowance.

U.S. Appl. No. 17/903,455, Jun. 27, 2024, Office Action.

U.S. Appl. No. 18/590,708, Aug. 7, 2024, Notice of Allowance.

PCT/US2023/015680, Aug. 9, 2024, International Preliminary Report on Patentability.

10-2023-7007856, Aug. 21, 2024, Foreign Notice of Allowance.

202180068303.5, Jul. 31, 2024, Foreign Notice of Allowance.

11202307570T, Apr. 10, 2024, Foreign Notice of Allowance.

202280020819.7, Apr. 4, 2024, Foreign Office Action.

202180093875.9, Apr. 12, 2024, Foreign Office Action.

PCT/US2024/010774, May 3, 2024, International Search Report and Written Opinion.

EP23220883, May 7, 2024, Extended European Search Report.

PCT/US2024/013168, May 8, 2024, International Search Report and Written Opinion.

22826043.6, Jun. 14, 2024, Extended European Search Report.

21853044.2, Jul. 23, 2024, Extended European Search Report.

1020237024129, Aug. 2, 2024, Foreign Office Action.

1020237044346, Aug. 27, 2024, Foreign Office Action.

U.S. Appl. No. 18/590,708, Nov. 20, 2024, Notice of Allowance.

U.S. Appl. No. 17/903,455, Nov. 29, 2024, Notice of Allowance.

U.S. Appl. No. 18/123,161, Dec. 16, 2024, Restriction Requirement.

U.S. Appl. No. 18/293,673, Dec. 16, 2024, Restriction Requirement.

U.S. Appl. No. 18/407,408, Dec. 18, 2024, Notice of Allowance.

2023-508467, Nov. 12, 2024, Foreign Office Action.

11202300860T, Nov. 20, 2024, Foreign Office Action.

2023564535, Nov. 27, 2024, Foreign Notice of Allowance.

2021800938759, Dec. 11, 2024, Foreign Office Action.

Foulk et al.; "Broad Temperature Operation and Widely Tunable High Dynamic Range High-Speed Amplified Electroabsorbtion Modulator", IEEE Photonics Technology Letters, vol. 17, No. 10, Oct. 2005, pp. 2191-2193.

* cited by examiner

100

Circuit
Package
700

Circuit
Package
800

1000

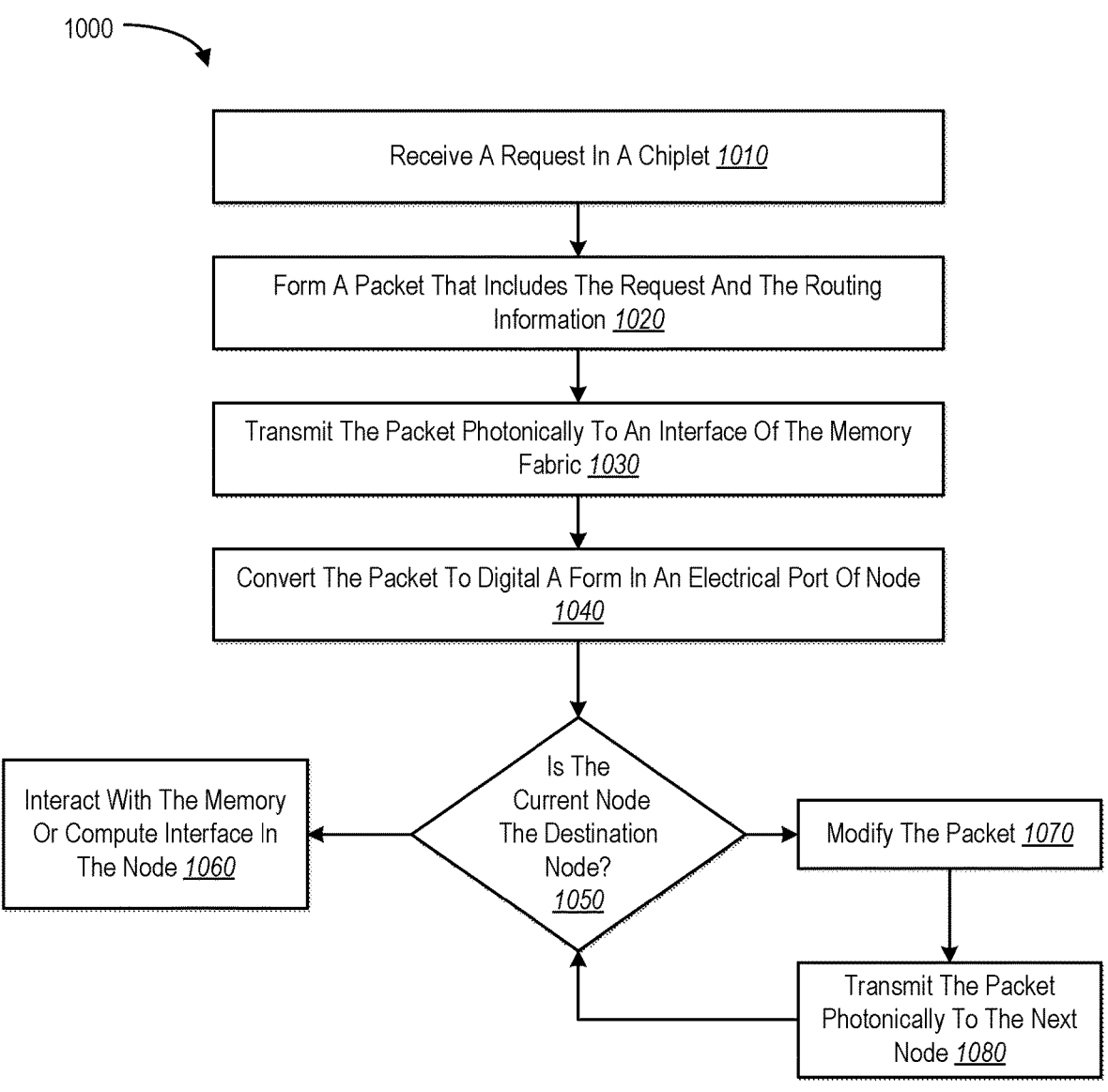

Receive A Request In A Chiplet *1010*

Form A Packet That Includes The Request And The Routing Information *1020*

Transmit The Packet Photonically To An Interface Of The Memory Fabric *1030*

Convert The Packet To Digital A Form In An Electrical Port Of Node *1040*

Is The Current Node The Destination Node? *1050*

Interact With The Memory Or Compute Interface In The Node *1060*

Modify The Packet *1070*

Transmit The Packet Photonically To The Next Node *1080*

Figure 10

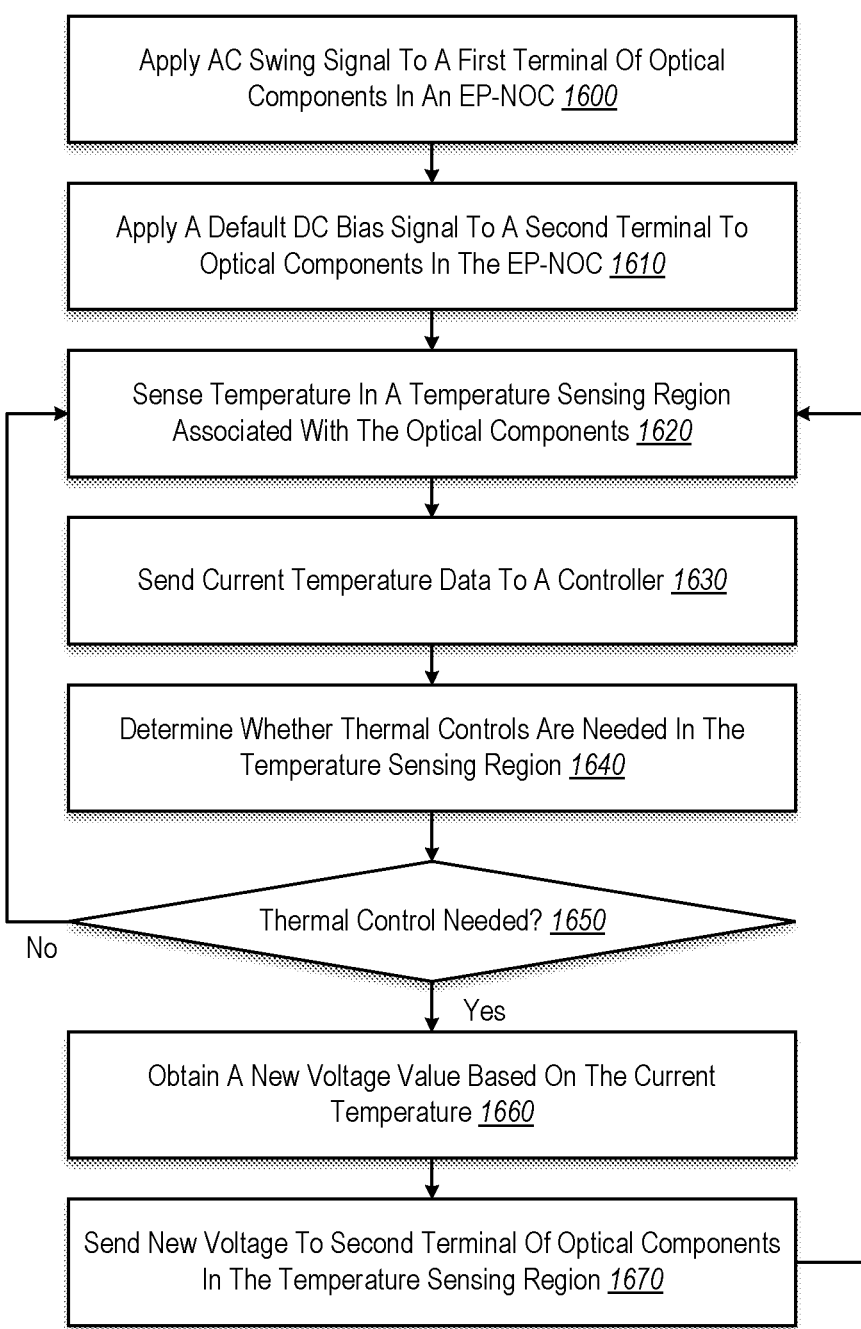

Apply AC Swing Signal To A First Terminal Of Optical Components In An EP-NOC _1600_

Apply A Default DC Bias Signal To A Second Terminal To Optical Components In The EP-NOC _1610_

Sense Temperature In A Temperature Sensing Region Associated With The Optical Components _1620_

Send Current Temperature Data To A Controller _1630_

Determine Whether Thermal Controls Are Needed In The Temperature Sensing Region _1640_

Thermal Control Needed? _1650_

No

Yes

Obtain A New Voltage Value Based On The Current Temperature _1660_

Send New Voltage To Second Terminal Of Optical Components In The Temperature Sensing Region _1670_

Providing Data From A First Router Of A First Node *2010*

Carrying The Data From The First Node To A Second Node
*2020*

Receiving The Data At A Second Router Of The Second Node
*2030*

THERMAL CONTROL OF AN OPTICAL COMPONENT

CROSS-REFERENCE TO RELATED APPLICATIONS

The present application claims priority to U.S. Patent Application Ser. No. 63/420,323, entitled "THERMAL CONTROL OF AN OPTICAL COMPONENT," filed on Oct. 28, 2022, and this application claims priority to U.S. Patent Application Ser. No. 63/420,330, entitled "THERMALLY-STABLE OPTICAL MODULATION ELEMENTS COUPLED TO ELECTRONIC ELEMENTS", filed Oct. 28, 2022.

BACKGROUND

Applications like machine learning (ML), deep learning (DL), natural language processing (NLP), and machine vision (MV) are becoming more complex over time and are being developed to handle more sophisticated tasks. Computing devices, however, have not advanced at a pace where they can effectively handle the needs of these new applications. Without sufficiently advanced computing paradigms, ML, DL, NLP, and MV applications, for example, cannot reach their full potential.

One solution is to connect many chips into a system where the chips can send data between each other with low latency and at high speed. In one approach, connections between chips are made using Serializer/Deserializer (SerDes) blocks that convert parallel messages into serial bit streams that can be sent over electrical interconnects or optical fibers between chips. In such systems, a distinction is made between on-chip and off-chip communication. For example, compute elements on the chip use a metal interconnection while messages destined for another chip must move over the chip level interconnects to the site of the interface to the SerDes where the data is converted to a bit stream and is transmitted optically. In the receive direction, bits arrive on an optical fiber or electrical interconnect, are assembled, and are then transmitted over metal interconnects inside the chip to the destination processor or memory. Significant energy is expended both in moving the data within the chip to the SerDes and then from the SerDes into other chips in the system.

Additionally, the performance of a system when processing a workload is limited by memory and interconnect bandwidth. Data movement, which leads to massive power consumption, poor performance, and excessive latency, exacerbates this problem, particularly with the exponential increase of AI workloads. Conventional digital computing environments that rely on electrical interconnects are inadequate for the required data movement of AI workloads. Accordingly, some existing systems use hybrid electrophotonic computing. However, these existing systems suffer from inefficiencies due to moving data across large distances and poor management of the thermal environment.

BRIEF DESCRIPTION OF THE DRAWINGS

FIG. 10 is a flowchart for using a memory fabric according to one or more embodiments disclosed in this disclosure.

FIG. 16 is a flowchart showing the operations involved in thermally controlling an optical component according to one or more embodiments disclosed in this disclosure.

DETAILED DESCRIPTION

Figure 1:
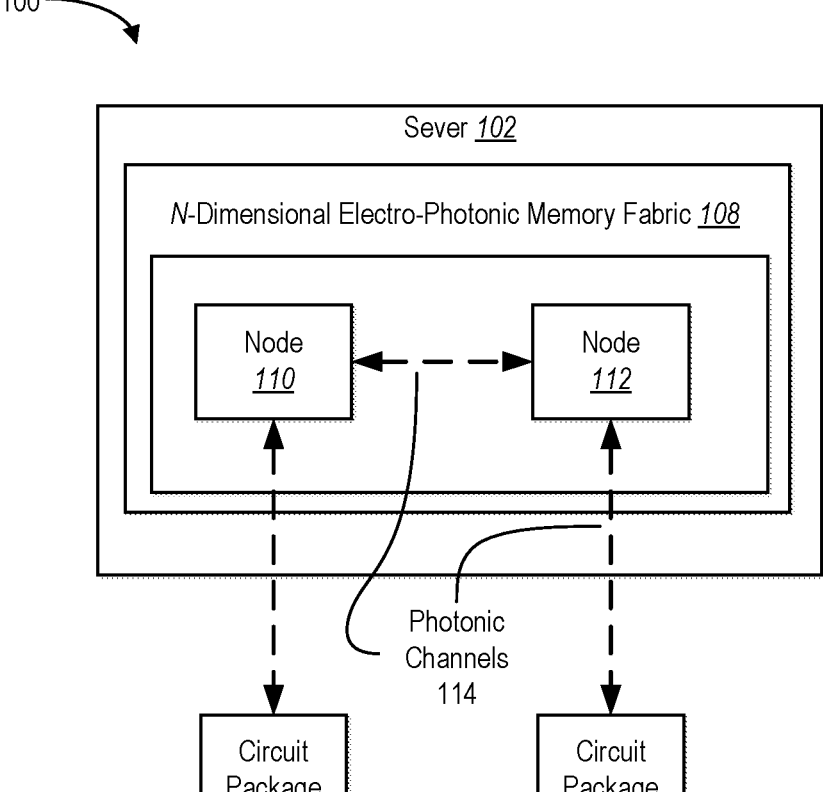
FIG. 1 shows a block diagram of an example memory fabric for connecting to one or more circuit packages according to one or more embodiments disclosed in this disclosure.

The present application discloses methods, apparatuses, and systems for a circuit package connecting to an n-dimensional electro-photonic memory fabric and/or thermal control of an optical component (e.g., a thermal control system). Regarding the circuit package and the n-dimensional electro-photonic memory fabric, a circuit package has various arrangements and is configured to receive a message packet from at least one client computing element such as a microprocessor (MPU), central processing unit (CPU), graphics processing unit (GPU), artificial intelligence (AI) accelerator, or another digital application-specific integrated circuit (ASIC).

By way of context, when moving data within a chip and between chips, the photonic fabric (e.g., the electro-photonic memory fabric) allows for a low-latency and low-power data movement. For example, the fabric is formed out of nodes that are connected by optical links, both within a chip and between chips. Data is moved from a source node to a destination node in the fabric by moving the data between the source node and any intermediate nodes until it reaches the destination node. At each node, message routers move the data along the next hop in the path. For example, when a node receives data along an optical link, the message routers perform optical-to-electrical conversion and electrical-to-optical conversion to transfer the data to the next node along the optical link. At the destination node, the signal is transformed into an electrical form and used by a processor and/or memory associated with the destination node.

As mentioned, this disclosure describes an n-dimensional electro-photonic memory fabric that improves the movement of data being processed by compute elements (e.g., client compute elements). In particular, the electro-photonic memory fabric provides a hybrid electro-photonic computing environment for moving data or instructions photonically by sending a packet of data as an electromagnetic wave in an optical carrier, such as a waveguide or fiber. By sending data or instructions optically, the system is fast and consumes minimal power. Additionally, as further described below, the electro-photonic memory fabric achieves an efficient balance of transmitting, receiving, converting, processing, and modifying data in both the optical and electrical domains.

As mentioned above, embodiments of the present disclosure aim to solve one or more of the problems mentioned above as well as other problems in the art. For example, various systems, devices, components, methods, and approaches provided the improved movement of data utilizing an n-dimensional electro-photonic memory fabric. In particular, embodiments of this disclosure describe connecting circuit packages to a memory fabric that provides an improved hybrid electro-photonic computing environment.

To illustrate, in various embodiments, the electro-photonic memory fabric achieves optimal system performance by quickly and efficiently processing workloads. For example, the electro-photonic memory fabric described in this document maximizes the use of the optical domain when processing a workload by minimizing the distance between the data and the compute capability, which reduces the amount that needs to move when processing the workload. In some embodiments, the electro-photonic memory fabric described in this document manages the thermal environment of the hardware layers to ensure systems operate efficiently without wasting available package space.

As explained in the foregoing discussion, this disclosure utilizes a variety of terms to describe the features and advantages of one or more embodiments described. For example, this document often refers to a chiplet. In this document, a chiplet refers to a small or tiny integrated circuit (IC) that performs one or more functions. Chiplets are often combined with other chiplets on an interposer in a single package (e.g., a circuit package).

Additional details in connection with an example embodiment of the chiplet or memory fabric discussed in connection with the following figures. To illustrate, FIG. 1 shows a block diagram of an example memory fabric for connecting one or more circuit packages according to one or more embodiments disclosed in this disclosure. To illustrate, FIG. 1 includes a system 100 having a server 102 and circuit packages (i.e., the circuit package 104 and circuit package 106). As shown, the system 100 includes a memory fabric (shown as an n-dimensional electro-photonic memory fabric 108) with two nodes (i.e., node 110 and node 112). While FIG. 1 shows a particular number of nodes and circuit packages, the system 100 can include any number of nodes and circuit packages.

The components in FIG. 1 show various interconnections. To illustrate, the interconnections shown in FIG. 1 include photonic channels 114. Although not explicitly shown in FIG. 1, the memory fabric and the circuit packages commonly include an electronic integrated circuit (EIC) and/or a photonic integrated circuit (PIC), such that each of the nodes and each of the circuit packages has at least one photonic transceiver whose functionality resides partially in the EIC and/or partially in the PIC. This enables the photonic transceivers to send and receive data packets in the optical domain as modulated electromagnetic waves via the photonic channels 114 or as digital packets via electrical interconnections.

Various embodiments of the photonic transceiver include, for example, active or passive components in the EIC and active or passive components in the PIC directly bonded together or stacked on top of each other, in a chip-to-chip configuration. For example, a copper pillar or another electrical connection connects the active components in the EIC to the passive components in the PIC. In this way, the copper pillar bridges the gap, typically between 2 millimeters, to less than 50 microns. In these embodiments, the copper pillar bridges are essentially perpendicular to the plane of the EIC and the PIC. Further, this direct bonding, direct coupling, or stacking of the electrical interconnects between the electrical and the optical components maximize the bandwidth of the photonic transceivers.

Figure 2:
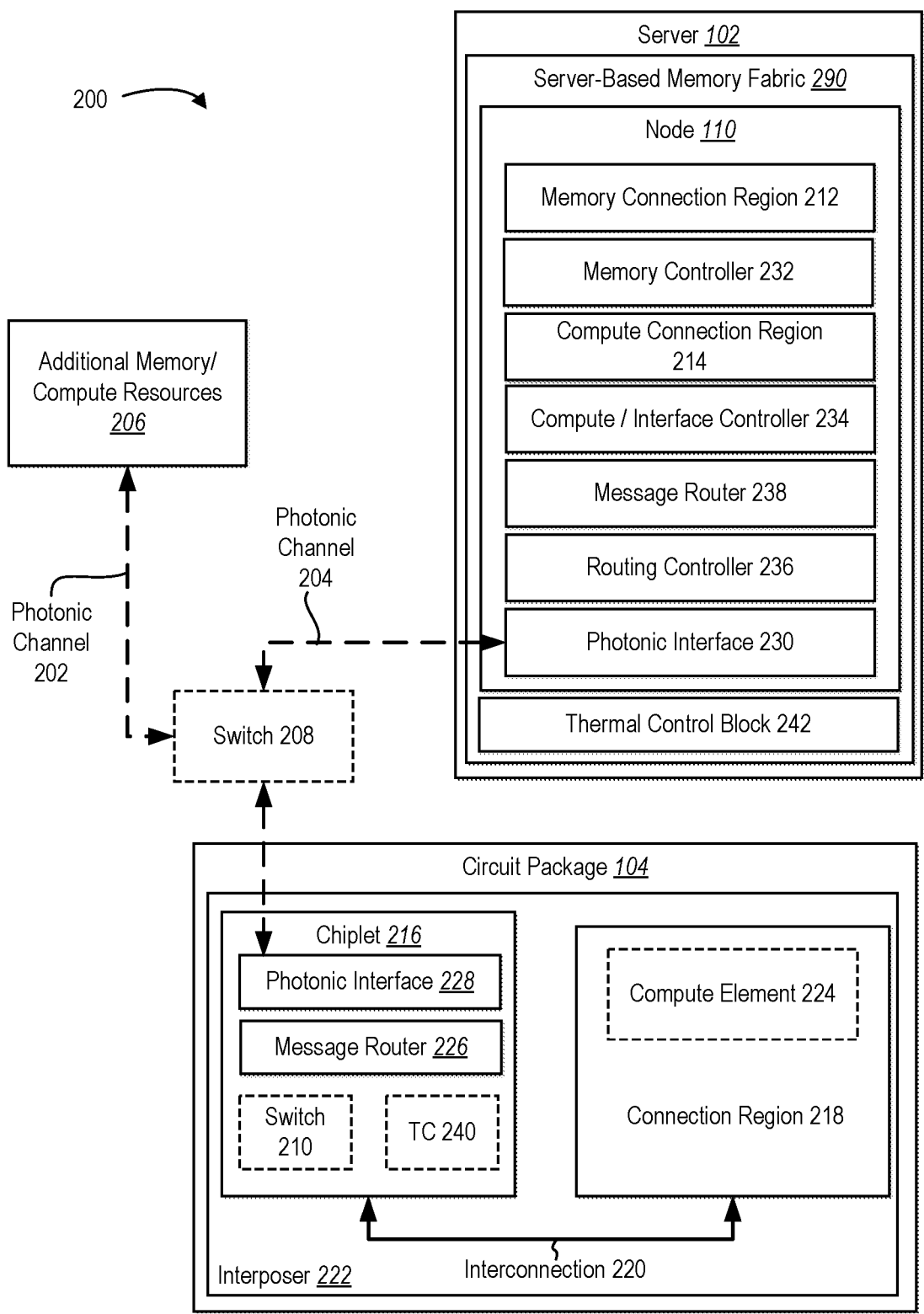
FIG. 2 shows an embodiment of a memory fabric suitable for connecting to one or more circuit packages according to one or more embodiments disclosed in this disclosure.

FIG. 2 shows a more detailed example of FIG. 1. In particular, FIG. 2 shows an embodiment of a server-based memory fabric 290 that uses circuit packages to move data within the memory fabric (e.g., to/from compute elements and memory/compute resources).

As illustrated, the system 200 includes a server 102, additional memory/compute resources 206, a switch 208, and a circuit package 104. The server 102 includes the node 110. While not shown, the system 200 and/or the server 102 may include additional nodes extending in one or more dimensions. As shown, the node 110 includes a memory connection region 212, a memory controller 232, a compute connection region 214, an interface controller 234 (e.g., a memory and/or compute interface controller), a message router 238 (i.e., a router), a routing controller 236, a photonic interface 230, and a thermal control block 242.

As also shown, the node 110 (e.g., server 102) connects to the circuit package 104 and via the switch 208 via a photonic channel 204. The circuit package 104 includes an interposer 222 that connects a chiplet 216 and compute element 224 via an interconnection 220 and/or connection region 218. In FIG. 2, the chiplet 216 includes a photonic interface 228, a message router 226, a switch 210, and a thermal control block 240. Further, the circuit package 104 and the server 102 connect to the additional memory/compute resources 206 via the switch 208 using a photonic channel 202, as shown.

In various embodiments, the circuit package 104 is connected via photonic channels (e.g., photonic channel 202 and photonic channel 204) to the server 102 and the additional memory/compute resources 206. In various embodiments, switches (e.g., switch 208 or switch 210) are used to determine when to use a photonic channel, and thus whether circuit package 104 accesses the server-based memory fabric 290 on the server 102 or additional memory/compute resources 206.

While FIG. 2 is simplified to show a single node (i.e., node 110) on the server 102, in many embodiments, a chip on the server 102 includes hundreds of nodes. Additionally, a multi-chip configuration could have hundreds of thousands of nodes (or more) connected via photonic channels in an n-dimensional memory fabric. In these instances, each of the nodes could have the features of the node 110, including a memory connection region 212 and/or a compute connection region 214.

The memory connection region 212 and the compute connection region 214 are designed to provide a standard interface for a compute element or a memory element that integrates into the system 200. In various embodiments, the memory connection region 212 and the compute connection region 214 are configured to receive a memory element or compute element using electrical connections such as copper wires, bump attach units, copper pillars, through-silicon vias, and/or other connections.

Examples of memory elements include, but are not limited to, NAND Flash memory, solid-state drive (SSD) memory, NOR Flash memory, complementary metal-oxide-semiconductor (CMOS) memory, thin film transistor-based memory, phase change memory (PCM), storage class memory (SCM), read-only memory (ROM), random-access memory (RAM), magneto-resistive RAM (MRAM), resistive RAM, static random access memory (SRAM), dynamic RAM (DRAM), synchronous dynamic random-access memory (SDRAM), Double Data Rate (DDR)-based DRAM, high bandwidth memory (HBM), and dual in-line memory module (DIMM) memory.

Examples of compute elements include, but are not limited to, CPUs, GPUs, MPUs, tensor engines, load units, store units, neural compute engines, dot-products, convolution engines, field-programmable gate arrays (FPGAs), and/or AI accelerators.

The circuit package 104 includes a chiplet 216 and a connection region 218 connected via interconnection 220. In various embodiments, the chiplet 216 has a bottom surface that is coupled to the connection region 218 via an electrical connection through the interposer 222. In some instances, the interconnection 220 can serve as the electrical connection. Additionally, in various embodiments, the interconnection 220 is a standard electrical connection that passes through an interposer 222. In one or more embodiments, the interconnection 220 includes multiple channels, which correspond with multiple ports in either the memory connection region 212 or the compute connection region 214.

A compute element 224 can be attached to the connection region 218 using various means. The chiplet 216 further includes a message router 226 for controlling the flow of packets between the chiplet and the rest of the system 200. For example, the router forms digital packets that include message requests from compute elements as well as corresponding routing information. In various embodiments, the photonic interface 228 on the circuit package 104 and the photonic interface 230 on the node 110 form an optical bi-directional path for an optical signal that represents the digital packet and can be reconstructed and/or transformed to a digital form when routed between the server 102 and the circuit package 104 to an electrical port of a message router at the final destination.

Although not specifically shown in FIG. 2, the photonic interfaces commonly include photonic transceivers having both transmit units and receive units. In various instances, transmit units convert a digital packet into an optical signal and transmit it across a photonic channel. Likewise, receive units convert the optical signal into a digital packet and transmit it across an electrical channel. For example, the photonic interface 228 in the circuit package 104 utilizes a transmit unit to connect to a receive unit in the photonic interface 230 of the node 110 via a first photonic channel and a transmit unit in photonic interface 230 of the node 110 connects to a receive unit in photonic interface 228 of the circuit package 104 via a second photonic channel. This enables bidirectional optical communications between circuit package 104 and the server 102.

In some embodiments, within the router, a transmit unit is partially in the chiplet 216 and partially in the interposer 222. In these instances, the transmit unit transmits a digital packet through a fiber array unit (FAU) in an optical form to a photonic interface to travel toward the destination indicated in the routing information of the digital packet. Similarly, in various embodiments, a receive unit is partially in the chiplet 216 and partially in the interposer 222. For example, the receive unit is partially in the chiplet 216 and partially in the interposer 222 for receiving an optical signal through the FAU in a digital form at the router.

In one or more embodiments, the circuit package 104 requests an item stored in the memory connection region 212 of the node 110, and/or utilizes the compute resources available in the compute connection region 214. In these instances, the photonic interface 230 receives the request from the circuit package 104 via the photonic channel 204 and converts the request into a digital packet, which is provided to either a memory controller 232, an interface controller 234, or a routing controller 236.

In various embodiments, the memory controller 232 is an electrical interface, such as a Joint Electron Device Engineering Council (JEDEC) compliant or compute express link (CXL) compliant interface that can be used to access a data item stored in a memory element connected in the memory connection region 212. In one or more embodiments, the interface controller 234 is an electrical interface, device, or module, that controls and configures the interface of a connected compute element in the compute connection region 214. In several embodiments, the interface controller 234 performs configurations, handles faults, provides an embodiment of algorithms to transfer data to and from the interface, and/or generates interrupt events to signal the compute connection region 214 when events relating to the interface occur.

Additionally, in one or more embodiments, the routing controller 236 is used in a memory fabric where the current node is not the destination node (not shown). In these cases, the routing controller 236 modifies the digital packet to update the routing information before sending it to a transmit unit connected to an adjacent or next node on the route to the destination node.

In various embodiments, a message router 238 transmits the digital packet photonically using one of its optical ports when the current node is not the destination node. Additionally, in one or more embodiments, the message router 238 outputs a digital packet along its electrical port when the compute or memory resources are used in the current node.

FIG. 2 also includes thermal control blocks. To illustrate, the server 102 includes a thermal control block 242 and the circuit package 104 includes a thermal control block 240. In various embodiments, the thermal control blocks provide thermal controls to the circuit package 104 and the server-based memory fabric 290.

Some embodiments use thermally-stable optical components such as electro-absorption modulators (EAMs) in the photonic integrated circuit (PIC). These optical components are commonly manufactured to have a range of operations that typically exceed 30 degrees Centigrade. These optical components have a direct coupling to active electronic components in the EIC, such as a driver, serializer/deserializer (SERDES) block, controller via a copper pillar, or another interconnection capable of providing a chip-to-chip direct bonding of the layers.

Because of the relatively small gap between active and passive components in the photonic transceiver, the heat produced by the EIC often radiates into the PIC and impacts the thermal operating environment of the EAMs. In some embodiments, the EAMs are designed with respect to the expected thermal behavior in the EIC. In these embodiments, the thermal impact of an EIC operating at max load determines the operating window of the EAM to which it is directly coupled.

Accordingly, one of the roles of the thermal control blocks (e.g., thermal control block 240 and thermal control block 242) is to provide a voltage input to the EAMs when needed to extend their operating range depending on the current thermal conditions where they are operating. Additional details regarding the thermal control blocks are provided below.

Figure 3:
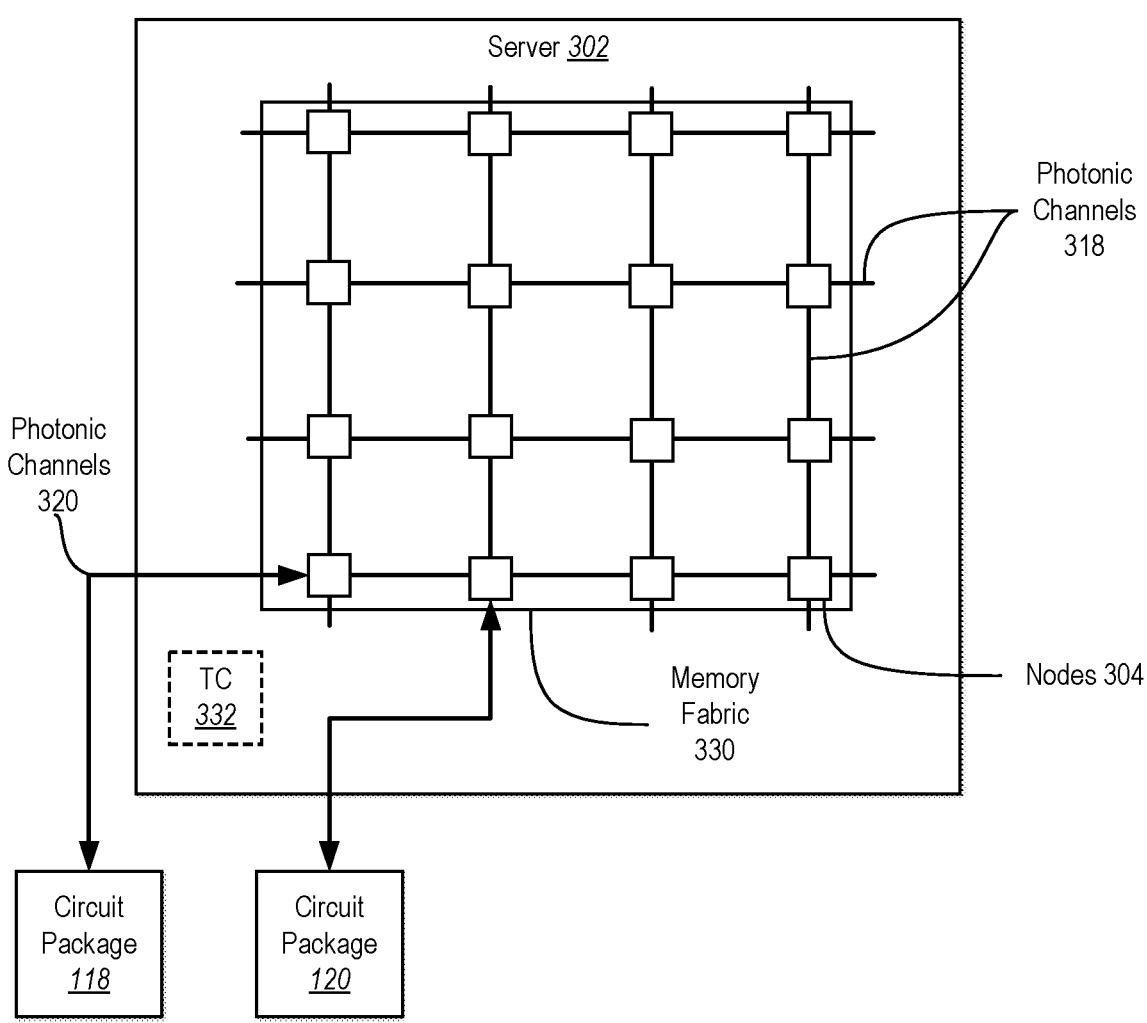
FIG. 3 shows a top view of another embodiment of a memory fabric suitable for connecting to one or more circuit packages according to one or more embodiments disclosed in this disclosure.
Figure 5:
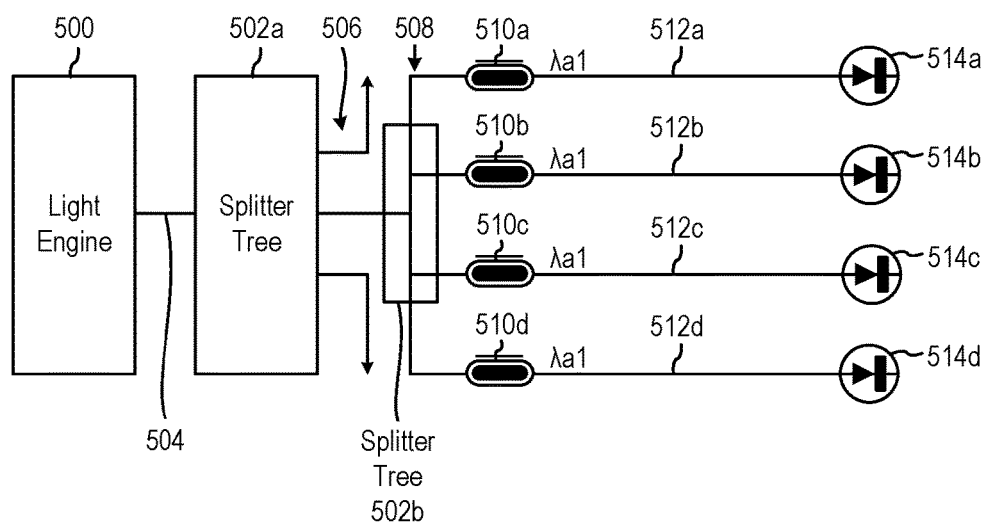
FIG. 5 is a diagram illustrating an example system showing an intra-chip link between two adjacent nodes in a memory fabric according to one or more embodiments disclosed in this disclosure.
Figure 6:
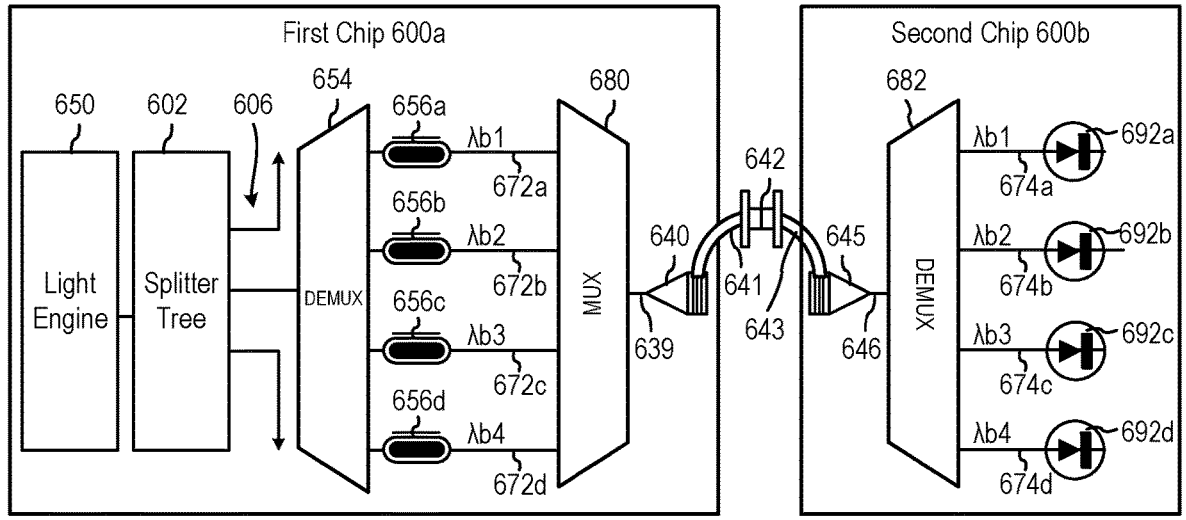
FIG. 6 is a diagram illustrating an example system showing an inter-chip link between two adjacent nodes in different chips according to one or more embodiments disclosed in this disclosure.
Figure 9:
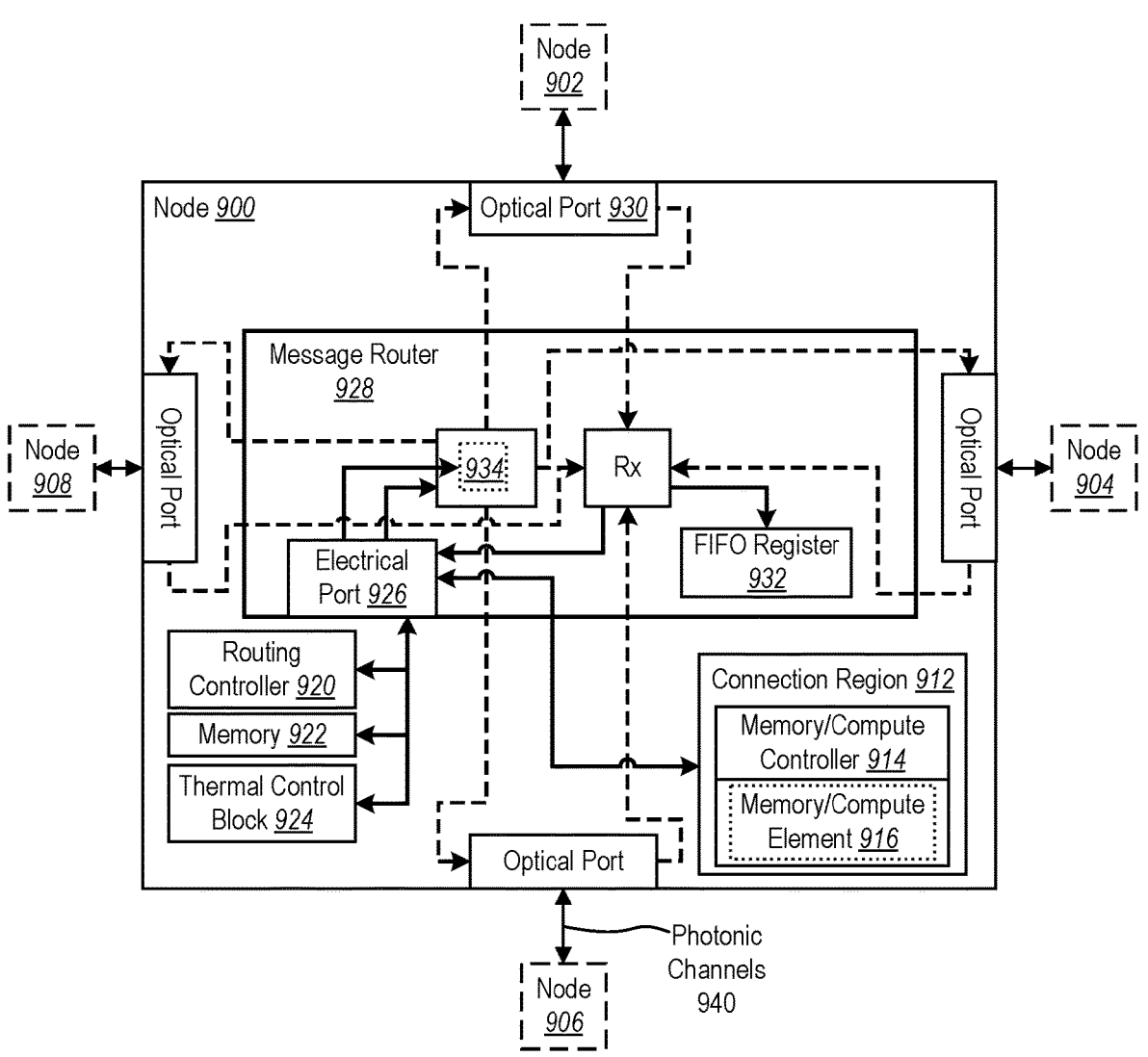
FIG. 9 is a top view of a node of a memory fabric according to one or more embodiments disclosed in this disclosure.

FIG. 3 illustrates using a memory fabric to connect circuit packages. As shown, FIG. 3 includes a memory fabric 330 and circuit packages (i.e., the circuit package 118 and circuit package 120). The memory fabric 330 is shown conceptually from a top view. As shown, the memory fabric 330 is part of a server 302 and includes multiple nodes 304, which interconnect via photonic channels 318. One or more of the multiple nodes 304 also connect directly to the circuit packages via photonic channels 320. In various embodiments, photonic channels include inter-chip links and intra-chip links. FIGS. 5 and 6 provide additional details regarding photonic channels. FIG. 9 provides additional details and internal components of nodes.

As shown, the memory fabric 330 includes sixteen nodes (i.e., the multiple nodes 304) arranged in a 4×4, 2-dimensional grid. In other embodiments, the memory fabric 330 is higher dimensional and has additional ports or switches to enable the connection of nodes in n-dimensions. In embodiments that use a 4×4 grid for the memory fabric 330, each of the multiple nodes 304 has at least 4 optical ports and one electrical port. In these embodiments, the optical ports enable the interconnection of all of the interior nodes. For example, the transmit unit and the receive units of adjacent nodes are optically connected by photonic channels to create a bi-directional optical connection between the nodes. Nodes at the periphery of the grid can have an optical port dedicated to the circuit package and/or could be used for inter-chip or intra-chip links to other nodes (not shown). Alternatively, the optical ports on nodes may not be used or not fabricated (e.g., a node has only two or three optical ports), such as a corner node, if the additional ports are not needed.

In various embodiments, each of the multiple nodes 304 of the memory fabric 330 includes one or more message routers (not shown) used with the photonic channels 318 to form an electro-photonic network. In these embodiments, the message routers are arranged in a two-dimensional, quadrilateral array or grid. The message routers of two nodes that are immediately next to each other (e.g., in either horizontal or vertical directions) are connected by a bi-directional channel. In this way, each message router in the interior of the array includes at least four photonic channel interfaces to the at least four respective bi-directional photonic channels (e.g., one for each of the directions that may be referred to as "North," "South," "East," and "West"). Additionally, along the periphery of the array, the routers need only have two (at the corners) or three (at the edges between corners) photonic channel interfaces to serve the memory fabric 330. In various embodiments, some or all of the photonic channel interfaces at the corner and edge nodes, which are not dedicated to the memory fabric 330, are used for a point-to-point connection to a circuit package, as shown with respect to the circuit package 118 and the circuit package 120.

In various embodiments, the message routers route messages between the circuit packages and the multiple nodes 304 using various addressing schemes. Regardless of the addressing scheme, the messages may be transferred primarily or exclusively through the memory fabric 330 via the photonic channels 318 and/or the photonic channels 320 in the PIC (with optical-to-electrical and electrical-to-optical conversions at each router along the path).

In one or more embodiments, packet data is provided between the multiple nodes 304 and/or circuit packets and includes routing information to indicate their destination. For example, a signed 5-bit packet data (e.g., extracted from the header or the payload of a message) provides the relative location (or distance) in the horizontal direction (East/West) to a destination node. As another example, a signed 5-bit packet data provides the relative location (or distance) in the vertical direction (North/South) to the destination node. In various embodiments, packet data of different sizes (e.g., number of bits) is used, (e.g., depending on the number of nodes and the resulting size of the address space).

As a message traverses routers to different nodes, the routing information can be modified. For example, the horizontal or vertical coordinate of the routing information is decremented for each hop depending on the dimension along which the message is being transferred. In this example, when the packet data providing the directions to the destination node decrements or decreases to zero, the message has arrived at the destination node. It is then forwarded to a local electrical port of the router in that node for utilization by the compute or memory resources. In some cases, the messages are used to carry read and write memory transactions between nodes or circuit packages.

In one or more embodiments, the server 302 includes a thermal control block 332. As mentioned, the thermal control block will be described in more detail later. In various embodiments, the thermal control block responds to changes in thermal conditions of the PIC in one or all of the multiple nodes 304. In one example, the thermal control block cycles through each of the multiple nodes 304 and provides the node's input voltage to the PIC (when needed). For example, the thermal control block provides the input voltages in a magnitude that is designed to return the EAM of the node to peak operating conditions during each time cycle.

Figure 4:
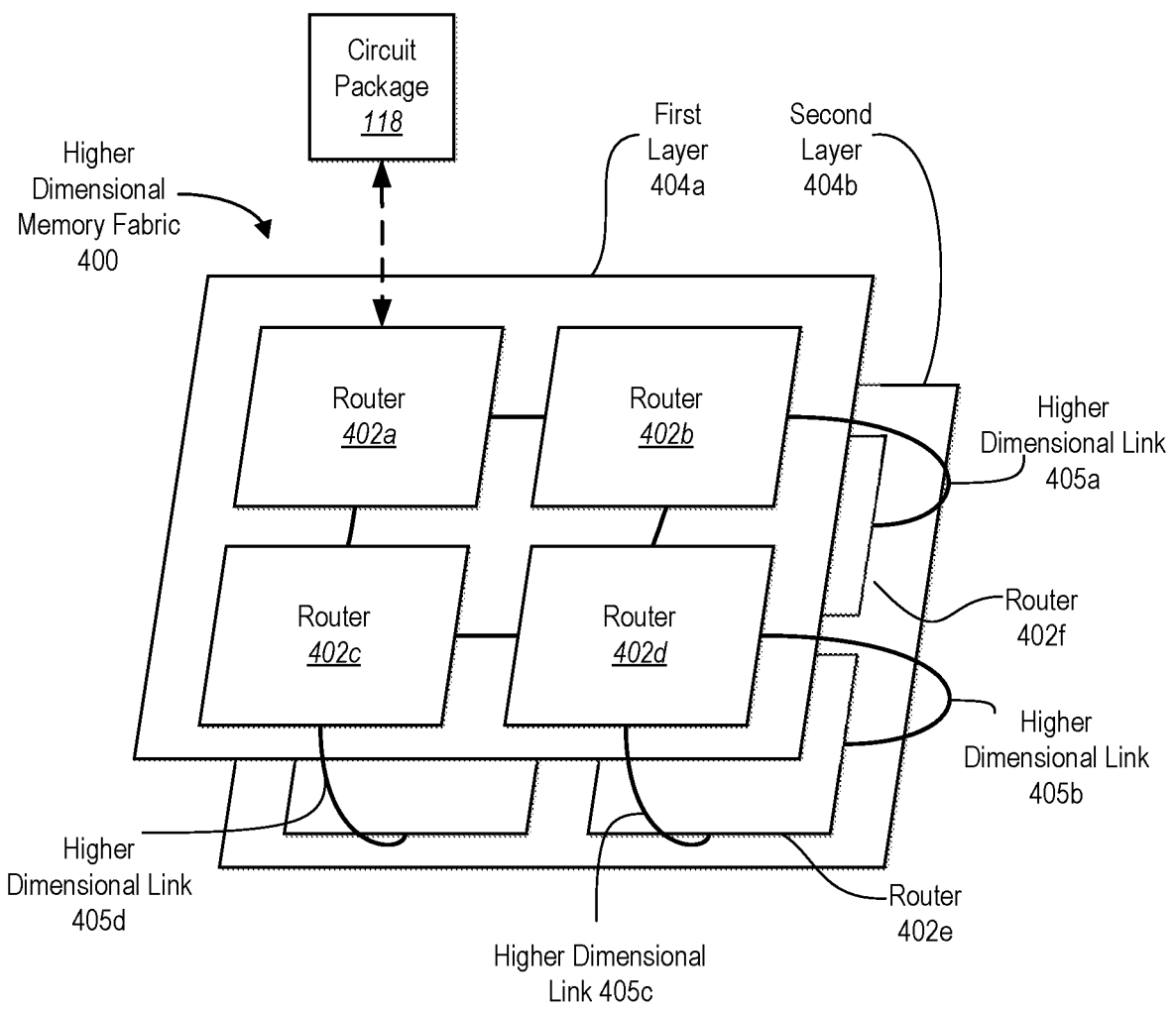
FIG. 4 shows a perspective view of an embodiment of a three-dimensional memory fabric suitable for connecting to one or more circuit packages according to one or more embodiments disclosed in this disclosure.

FIG. 4 illustrates a higher-dimensional memory fabric, such as a three-dimensional memory fabric for connecting circuit packages. As shown, FIG. 4 illustrates a perspective view of a higher-dimensional memory fabric 400 for connecting a circuit package 118.

In FIG. 4, the higher-dimensional memory fabric 400 has multiple layers 404 including a first layer 404a and a second layer 404b. Each of the multiple layers 404 includes routers 402. In particular, the first layer 404a includes routers 402a, 402b, 402c, and 402d and the second layer 404b includes routers 402e and 402f.

In the illustrated embodiment, the routers 402 include optical ports. For example, the optical ports between routers on the first layer 404a (i.e., the routers 402a-d) are augmented by higher-dimensional links 405a, 405b, 405c, and 405d. As shown in FIG. 4, the circuit package 118 connects to the higher-dimensional memory fabric 400 via one of the routers 402a on the first layer 404a. Additionally, depending on the nature and topology of the higher-dimensional memory fabric 400, any number of additional circuit packages may connect to any number of additional routers and ports.

In various embodiments, the higher-dimensional memory fabric 400 form a mesh or different shapes. Further, the higher-dimensional memory fabric 400 forms a wrapped mesh, a toroid, a wrapped toroid, or an extensible wrapped toroid.

As mentioned above, FIGS. 5 and 6 provide additional details regarding inter-chip and intra-chip links. FIG. 5 provides an example of an intra-chip link while FIG. 6 provides an example of an inter-chip link.

To illustrate, FIG. 5 shows an example of photonic links connecting nodes in a memory fabric, (i.e., an "intra-chip link"). As shown, FIG. 5 includes a light engine 500, a first splitter tree 502a, a second splitter tree 502b, a set of optical modulators 510a, 510b, 510c, and 510d, a set of respective waveguides (e.g., waveguides 512a, 512b, 512c, and 512d), and a set of photodetectors 514a, 514b, 514c, and 514d.

For intra-chip optical communication, the light engine 500, which can be an on-chip or off-chip laser light source, outputs a light 504 (e.g., a carrier light) at a single wavelength (e.g., $\lambda a1$). A first splitter tree 502a may divide the light 504 into multiple optical paths 506 leading to the optical modulators associated with different nodes and photonic channels on a chip.

As shown, FIG. 5 illustrates the light splitting and traveling along multiple optical paths 506, where one of the optical paths (i.e., the middle optical path) leads to the illustrated components. The other optical paths (shown as ending in arrows) may travel to other nodes and photonic channels (not shown) on the chip.

In various embodiments, the light traveling along one of the multiple optical paths 506 is further split. For example, a second splitter tree 502b splits the light in an optical path into additional optical paths 508 to provide the light to a set of optical modulators 510a-d. In some embodiments, the second splitter tree is a demultiplexer (demux) As shown, the set of optical modulators 510a-d corresponds to a set of photodetectors 514a-d via a set of respective waveguides 512a-d.

In some embodiments, the set of optical modulators 510a-d is associated with a set of unidirectional photonic links that are bonded together to form a bonding group. For instance, the bonding group of unidirectional photonic links travels in the same direction in a unidirectional photonic channel from one node in the memory fabric to another.

In some embodiments, two such unidirectional photonic channels in opposite directions between the same pair of nodes of the memory fabric form an intra-chip bidirectional photonic channel. To illustrate, the set of optical modulators 510a-d represent EAMs and/or modulate the light to have a single wavelength (e.g., $\lambda a1$) and transmit the modulated light via respective waveguides 512a-d to photodetectors 514a-d, which are situated in a different node of the same chip.

As mentioned above, FIG. 6 provides an example of an inter-chip link. For example, FIG. 6 illustrates a connection between two adjacent nodes in different chips (e.g., a first chip 600a and a second chip 600b), or a point-to-point connection between a memory fabric and a circuit package, according to some embodiments. (i.e., an "inter-chip link"). In various embodiments, the chips implement one or more machine-learning processors and/or photonic integrated circuits (PICs).

As shown, the first chip 600a includes a light engine 650, a splitter tree 602 that generates multiple optical paths 606, a demultiplexer 654, optical modulators 656a, 656b, 656c, and 656d connected to a multiplexer 680 (*mux*) via different waveguides 672a, 672b, 672c, and 672d, and a grating coupler 640. The first chip 600a is connected to the second chip 600b via a fiber connector 642. Additionally, the second chip 600b includes a grating coupler 645, a waveguide 646, a demultiplexer 682, and photodetectors 692a, 692b, 692c, and 692d connected via different waveguides 674a, 674b, 674c, and 674d.

More specifically, the first chip 600a includes the light engine 650, which can be an on-chip or off-chip laser light source. The light engine 650 provides light with multiple wavelengths (e.g., between 2 and 16 wavelengths). For example, the light engine 650 provides light with four wavelengths $\lambda b1$, $\lambda b2$, $\lambda b3$, and $\lambda b4$. A splitter tree 602 (e.g., similar to that of the first splitter tree 502 of FIG. 5) may divide the light into the multiple wavelengths between multiple optical paths 606. While only one of the multiple optical paths 606 is shown leading to different nodes of the first chip 600a with additional components, each of the multiple optical paths 606 may travel to different sets of similar components.

For the optical paths illustrated, it leads to the optical modulators 656a-d associated with different photonic-channel interfaces within the nodes. For example, the carrier light at the wavelengths $\lambda b1$, $\lambda b2$, $\lambda b3$, and $\lambda b4$ are provided to the optical modulators 656a-d associated with multiple peripheral photonic channel interfaces. Before reaching the optical modulators 656a-d the light is separated by the demultiplexer 654 by wavelengths (e.g., $\lambda b1$, $\lambda b2$, $\lambda b3$, and $\lambda b4$). For example, the optical modulators 656a-d represent different respective modulators (e.g., EAMs).

In various embodiments, the optical modulators 656a-d modulate the carrier light at the different wavelengths $\lambda b1$, $\lambda b2$, $\lambda b3$, and $\lambda b4$ and provide the modulated optical signals having the respective wavelengths on different waveguides 672a-d (e.g., via different optical links) to the multiplexer 680 (e.g., a WDM multiplexer). The multiplexer 680 generates a multiplexed output that contains four data streams, each encoded on a separate wavelength. As shown, the multiplexed output is provided on a single waveguide 639 to the grating coupler 640, where the multiplexed modulated optical signal is coupled off-chip via a first optical fiber 641.

As shown, the first chip 600a and the second chip 600b are connected through the fiber connector 642. In particular, the grating coupler 640 on the first chip 600a connects with the fiber connector 642 via a first optical fiber 641. The fiber connector 642 connects with the grating coupler 645 of the second chip 600b via a second optical fiber 643. In this manner, the first chip 600a can provide one or more light signals to the second chip 600b and/or other chips via an inter-chip link.

As also shown, the second chip 600b receives the multiplexed modulated optical signal from the fiber connector 642 via the second optical fiber 643. In some embodiments edge, coupled fibers may be used in place of, or in addition to, fiber array units (FAUs) and grating couplers.

In the second chip 600b, grating coupler 645 provides the multiplexed modulated optical signal to the demultiplexer 682 via a single waveguide. The demultiplexer 682 demultiplexes the multiplexed modulated optical signal and outputs four separate modulated signals having four different wavelengths, such as λb1, λb2, λb3, and λb4 (or a corresponding number of 2-16 wavelengths). In various embodiments, these four signals are provided, via different waveguides optical waveguides 674a-d to the photodetectors 692a-d, which correspond to the different wavelengths.

In various embodiments, the chips in FIG. 6 represent system-in-packages (SIPs) that use wavelength division multiplexing (WDM) for inter-chip optical communications. For example, the components shown in FIG. 6 form a unidirectional photonic channel between nodes of the different SIPs. In some instances, two such unidirectional photonic channels between the same pair of nodes of the SIPs form an inter-chip bidirectional photonic channel.

Although the embodiment discussed above is directed to a photonic channel showing four optical links in one direction and a WDM multiplexer receiving four different wavelengths, in other embodiments, two or more optical links and a WDM multiplexer receiving two or more different wavelengths may be used. In these embodiments, the demultiplexers output two or more different wavelengths in the same manner as described above.

In various instances, using intra-chip and inter-chip photonic channels, as described above, such as including one or more links per direction, the processing elements in the EIC(s) of one or more SIPs can be connected into electro-photonic networks. In these instances, the resulting network topology generally depends on the selection of pairs of nodes that are directly connected via an associated photonic channel. Indeed, various example topologies are possible. Additionally, while this disclosure generally refers to bidirectional photonic channels, which, when compared with unidirectional photonic channels, result in network structures providing greater flexibility for implementing machine-learning (ML) and other computational models, electro-photonic networks can in principle also be formed with unidirectional photonic channels. Additionally, such networks may retain many of the benefits discussed in this disclosure (e.g., power savings due to photonic data transfer over longer distances).

Figure 7:
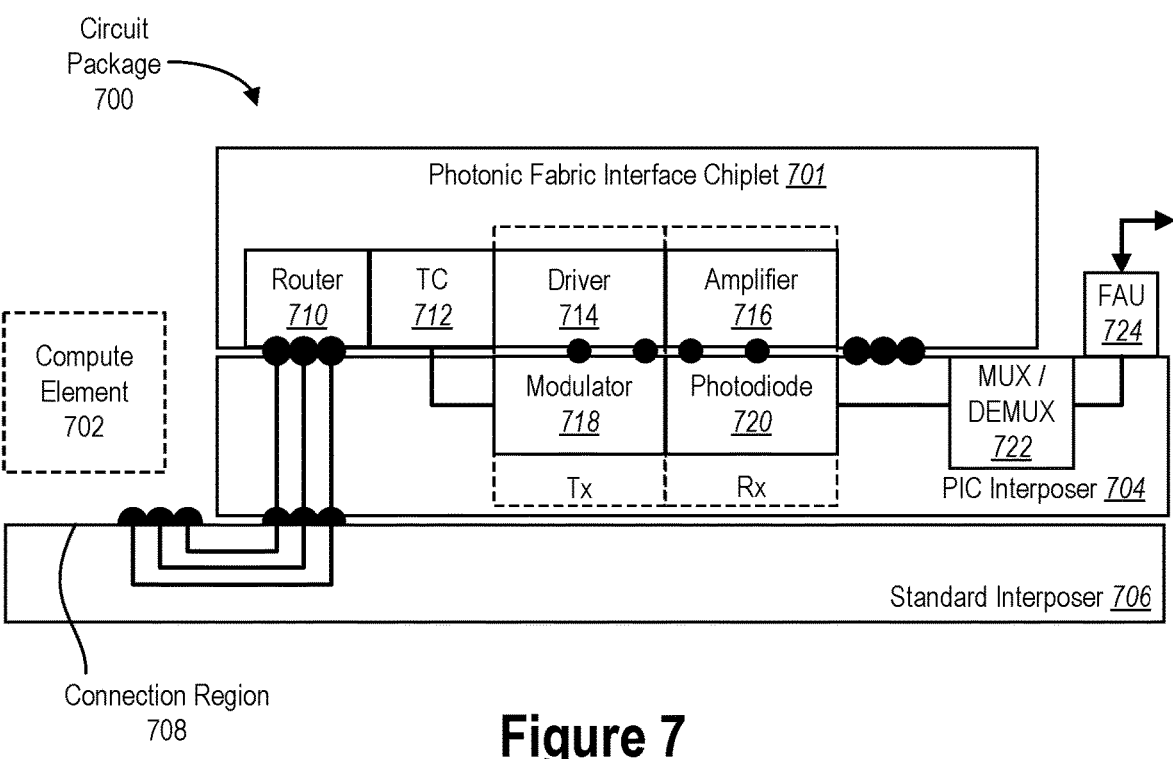
FIG. 7 is a side view of a circuit package according to one or more embodiments disclosed in this disclosure.
Figure 8:
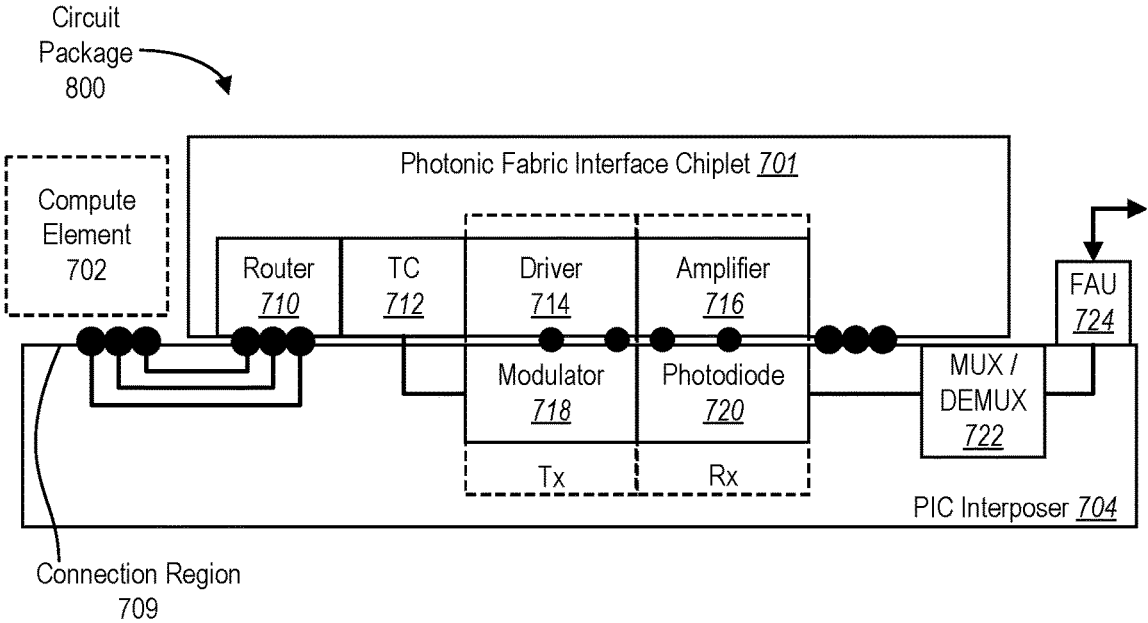
FIG. 8 is a side view of a circuit package according to one or more embodiments disclosed in this disclosure.

FIGS. 7 and 8 show different embodiments of a circuit package (including a chiplet) for photonically connecting client compute elements via a photonic interface. As shown, FIGS. 7 and 8 each includes a photonic fabric interface chiplet 701, a compute element 702, and a PIC interposer 704 (i.e., a photonic integrated circuit interposer). FIG. 7 also includes a standard interposer 706, which is absent in FIG. 8 and further described below. As mentioned above, the compute element 702 (e.g., a client compute element) may represent an MPU, GPU, CPU, AI accelerator, or another digital ASIC.

Additionally, the photonic fabric interface chiplet 701 in FIGS. 7 and 8 includes a router 710 for forming digital packets that include message requests from compute elements, a thermal control block 712, a driver 714, and an amplifier 716. The PIC interposer 704 includes a modulator 718 for transmitting, a photodiode 720 for receiving, and a multiplexer/demultiplexer 722 that is connected to a fiber array unit 724 (FAU) connected to the PIC interposer 704. As also shown, the modulator 718 and the photodiode 720 of the PIC interposer 704 connect to the driver 714 and the amplifier 716 of the photonic fabric interface chiplet 701, respectively. The modulator 718 of the PIC interposer 704 also connects to the thermal control block 712 of the photonic fabric interface chiplet 701.

As mentioned above, FIG. 7 includes the standard interposer 706. More particularly, the circuit package 700 shows the compute element 702 connected to the photonic fabric interface chiplet 701 via a connection region 708 of the standard interposer 706. The standard interposer 706 routes connections from the compute element 702 to the router 710 of the photonic fabric interface chiplet 701 via the PIC interposer 704, as shown. In various embodiments, the thermal control block 712 (e.g., an optical thermal control block sends inputs to the modulator 718 when needed.

FIG. 8 does not include a standard interposer. Rather, as shown, the circuit package 800 includes the PIC interposer 704 interfacing between the compute element 702 and the photonic fabric interface chiplet 701. For example, the PIC interposer 704 includes a connection region 709 that receives messages from the compute element 702 and provides via electrical connections to the router 710 of the photonic fabric interface chiplet 701. Indeed, in FIG. 8, the bottom surface of the photonic fabric interface chiplet 701 electronically connects to the connection region 709 of the PIC interposer 704.

In various embodiments, the router 710 in each of FIGS. 7 and 8 is a message router that resides partially in the PIC interposer 704 and partially in the photonic fabric interface chiplet 701. In these embodiments, the router 710 is configured to convert an optical signal into digital packets in a receive unit and/or convert digital packets into an optical signal in a transmit unit.

By coupling to the compute element 702, the photonic fabric interface chiplet 701 is capable of being connected photonically (e.g., via inter-chip or intra-chip links) to another photonic interface in another device. For example, the photonic fabric interface chiplet 701 photonically connects the compute element 702 to a server and/or a memory fabric. Also, while FIGS. 7 and 8 show the fiber array unit 724, the photonic fabric interface chiplet 701 may bi-directionally connect photonically to other devices via a waveguide or other optical means. Indeed, the fiber array unit facilitates bi-directional communications with connected nodes and devices (e.g., transmits and receives of laser light and/or messages occur for the photodiode via the fiber array unit 724).

FIG. 9 shows a node of the memory fabric in more detail. As shown, FIG. 9 includes multiple nodes (e.g., nodes 900, 902, 904, 906, and 908), however, only the node 900 is shown with internal components, elements, and connections. Accordingly, the description for the node 900 can be applied to the other nodes shown.

As shown, the node 900 includes various components including a routing controller 920, memory 922, a thermal control block 924, an electrical port 926, a message router 928, optical ports 930, a FIFO register 932, and thermally-stable optical modulation element 934 among other components. Some or all of these components are described above. Additionally, the node 900 communicates with other nodes through one or more photonic channels 940, as previously described.

As shown, the node 900 also includes one or more memory connection regions and/or compute connection regions (shown as the connection region 912). As shown, the connection region 912 includes a memory controller and/or a compute controller (shown as memory/compute controller 914) and a memory and/or a compute element (shown as memory/compute element 916). In various embodiments, the memory and compute connection regions receive a memory element or compute element using a standard electrical interconnection technique such as copper wires, bump attach units, copper pillars, through-silicon vias, and others. Examples of memory and/or compute elements are provided above in FIG. 2.

In one or more embodiments, the connection region 912 is coupled to a memory element, such as an HBM, which is loaded with data (e.g., embedded tables) for use in machine learning (e.g., training and/or inferencing). For example, a circuit package is capable of interacting with the data in the HBM, as required by the AI workload it is executing. In some instances, the output of the circuit package is an optical signal that has been converted from a digital packet and the digital packet is formed in a chiplet in response to a request for the data from a computing element. In these instances, the memory fabric has an inter or intra-chip link to the circuit package at one of the ports of one of its exterior 12 nodes.

In various embodiments, a node is a destination node when it is located in the memory fabric having the HBM with the requested data. In one or more embodiments, if a circuit package requests data from a destination node that has a direct photonic link, then the data is interacted with using the memory or compute controller (e.g., the memory/compute controller 914) in the node 900.

In some embodiments, if the destination node where the data resides is not directly connected by the next FAU (or waveguide, or another type of single photonic link), then a routing controller 920 (e.g., a routing control block) in the node 900 modifies the packet and outputs the modified packet to a next node in a route toward the destination node. In these instances, the process repeats until the packet arrives at the destination node, where the memory controller in the destination node can interact with the data. For example, data in the form of an embedded table is provided to a requesting client computing device via an electrical port.

In some embodiments, the node 900 also includes compute element (e.g., a CPU, GPU, MPU, etc.). For example, the interaction with the data can include using a tensor engine, a neural compute engine, and/or another type of processor in the node to perform computations and/or transform the data. In this example, the transformed data can be stored back into the HBM in the memory portion (e.g., the memory element) of the connection region 912 or another HBM in another node/Additionally, this process may continue until the AI workload completes.

In various embodiments, a compute device requests data from an HGM on a server and/or converted data that was processed by a compute element in a node. In these embodiments, the data is routed through a photonic interface in a node that has a direct connection to the circuit package to which the computing device is attached. For example, the data is routed from a current node to the node that shares a photonic channel with the circuit package.

In some embodiments, the request is returned to a client ASIC by retrieving the data from the HBM using the memory controller in the current node and forming a packet in the message router that has routing information included with the data to indicate a destination location. In these embodiments, the digital packet is converted into an optical signal and sent to the next node. Once routed to the destination node, the results can be sent along a photonic connection between the client computing device and the edge of the memory fabric (e.g., via a fiber and two FAUs). When the optical signal arrives, the message router in the chiplet can convert the result into a digital packet that can be used by the computing device, as previously described.

In various embodiments, the node 900 includes a message router 928 that includes an interface having bidirectional photonic channels (not shown) via the optical ports 930. In one or more embodiments, a message containing packet data arrives through a photonic channel of the PIC and is received at an optical-to-electrical (OE) interface between the PIC and the message router 928. In various embodiments, the OE interface is implemented using a photodetector (e.g., photodiode) in the PIC that converts the optical signal into an electronic signal, as provided above. For example, this occurs in conjunction with using related electronic circuitry in the message router 928, which may include a trans-impedance amplifier (TIA), an optional gain control to normalize the signal level, and/or a slicer to extract the bit stream. Additionally, the message can then be buffered in electronic form in a register such as the FIFO register 932.

In one or more embodiments, the routing controller 920 (e.g., a routing control block) in the node 900 includes circuitry for examining incoming messages. For example, the routing controller 920 identifies an address contained in a message header (or in the message payload) and determines which port and/or destination node to which the message should be routed. To illustrate, in some instances, the message router 928 determines that the destination of the message is the memory 922 on the node 900 (e.g., a memory element in the memory connection region). In these instances, the message is routed to the electrical port 926.

In other instances, the message router 928 determines that the destination of the message is another node within the memory fabric. In these instances, the message is routed to that destination node through the EO interface between the message router 928 and the PIC, where the message is converted back into the optical domain for transmission via another photonic channel. In various embodiments, the EO interface is implemented using an optical modulator within the PIC in conjunction with associated driver circuitry in the message router 928 (e.g., a modulator driver). A few examples of applicable modulator technology include electro-absorption modulators (EAMs), Mach-Zehnder modulators, ring modulators, and quantum-confined Stark effect EAMs (QCCE EAMs).

FIG. 10 provides additional details regarding using a memory fabric according to one or more embodiments. In particular, FIG. 10 shows an example flowchart showing how data is moved in a memory fabric. For ease of explanation, FIG. 10 is described as a series of operations or acts 1000.

As shown, the series of acts 1000 includes an act 1010 of receiving a request in a chiplet. In particular, the act 1010 may involve receiving a request in a chiplet for a compute or memory controller in a destination node of the memory fabric. For example, the request is a message request and/or an electrical request that is provided to a node in a memory fabric from a compute element electrically interconnected to a circuit package that includes the chiplet. In some instances, a chiplet receives a message request from the compute element requesting access to a memory controller or a compute controller associated with the photonic interface.

As also shown, the series of acts 1000 includes an act 1020 forming a packet that includes the request and the routing information. In some implementations, a chiplet of a circuit package connected to a connection region via an electrical connection of the interposer forms a digital packet associated with the connection region.

Additionally, the series of acts 1000 includes an act 1030 of transmitting the packet photonically, as a modulated electromagnetic wave, to an interface of the memory fabric. For instance, the act 1030 may involve transmitting the packet photonically from a first optical interface of the chiplet to a second optical interface of a node in the memory fabric, the first and second interfaces being connected via an optical fiber. For example, the packet is imparted onto an optical carrier signal by a photonic transceiver in the circuit package and is transmitted to a port of a node of the memory fabric that connects to the circuit package. In some instances, the transmit unit is partially in the chiplet and partially in the interposer for transmitting the digital packet in an optical form through a fiber array unit (FAU) to a photonic interface The series of acts 1000 also includes an act 1040 of converting the packet to a digital form in an electrical port of the node. For example, the node receives the packet and converts it from an optical signal back to an electrical form with a photonic transceiver in the node. In some instances, the routing controller sends the modified digital output to an adjacent node in the memory fabric by converting the digital output to an optical signal and sending the optical signal to the adjacent node via a photonic interface of the memory fabric. For instance, in various instances, a receive unit is partially in the chiplet and partially in the interposer for receiving an optical signal from the FAU and providing the optical signal in a digital form to an electrical portion of the chiplet.

Additionally, the series of acts 1000 also includes an act 1050 of determining whether a current node is the destination node. For example, a routing controller on the current node determines if the current node is the destination for the request. If yes, as shown, the series of acts 1000 includes an act 1060 of interacting with the memory or compute controller in the node. For example, an electrical port of the node is used to access a memory or interface controller associated with a memory or compute resource coupled to the node, (depending on the nature of the initial request).

If the act 1050 determines that the current node is not the destination node (i.e., "No"), the series of acts 1000 includes an act 1070 of modifying the packet. For example, routing controller modifies the packet (e.g., by decrementing or changing a value in the routing information). Additionally, the series of acts 1000 also includes an act 1080 of transmitting the packet photonically to the next node. For example, the electrical port sends the modified packet to the photonic transceiver, converts it to an optical signal, and sends it to the next node in the memory fabric. For instance, the modified packet is sent along the photonic link in the memory fabric that connects the current node to the next node (along the path to the destination node). Further, the act 1050 repeats until the destination node is reached.

Additional discussions will now be provided regarding methods, apparatuses, and systems for thermal control of an optical component (e.g., a thermal control system).

As further described below, this disclosure includes a thermal control system that includes one or more embodiments, which comprises a semiconductor having an optical layer stacked with an electrical layer, where the semiconductor is partitioned into an electrical-only region and an optoelectrical region. Additionally, the thermal control system includes one or more nodes in the optoelectrical region where each of the nodes resides in the optical and electrical layers. In some embodiments, the first portion of each node resides in the optical layer and has an optical modulator or heat-generating elements residing in the electrical layer and radiating heat toward the optical layer. The thermal control system also includes a temperature sensing region in a second portion of each node, where the temperature sensing region has a temperature sensor for sending a thermal signal to the electrical-only region, and the thermal signal is associated with a current temperature of at least one optical modulator. Further, the thermal control system includes a controller in the electrical-only region having an electrical interconnect to each of the nodes for receiving the thermal signal from the temperature sensor and for sending a new voltage signal to the optoelectrical region based on the thermal signal.

In some embodiments, this disclosure includes a system-in-package (SIP) that includes a photonic integrated circuit (PIC), an electronic integrated circuit (EIC) having an electrical connection with the PIC, a node (where a first portion of the node resides in the EIC and a second portion of the node resides in the PIC), a plurality of heat generating elements in the first portion of the node that radiate heat toward the second portion of the node (which cause a thermal change in the second portion of the node), a plurality of optical modulators in the second portion of the node, and a temperature sensing region in the second portion of the node for sending a current temperature to a controller. In some instances, the controller sends a first signal to each of the optical modulators based on the current temperature.

In one or more embodiments, this disclosure includes a method for controlling a thermal variable associated with a plurality of optical components. For example, the method includes applying a first signal to an anode of each of the plurality of optical components and applying a second signal to a cathode of each of the plurality of optical components. In addition, the method includes sensing a temperature in a region associated with the plurality of optical components and receiving a current temperature associated with the region. The method also includes determining when to initiate a thermal control over the plurality of optical components using the current temperature.

In various instances, when the first one of the optical components is an inter-chip modulator, the method includes obtaining a first voltage and sending the first voltage to the anode of the inter-chip modulator. In alternative embodiments, when a second one of the optical components is an intra-chip modulator, the method includes obtaining a second voltage and sending the second voltage to the anode of the intra-chip modulator, where the second voltage has a different value than the first voltage.

Figure 11A:
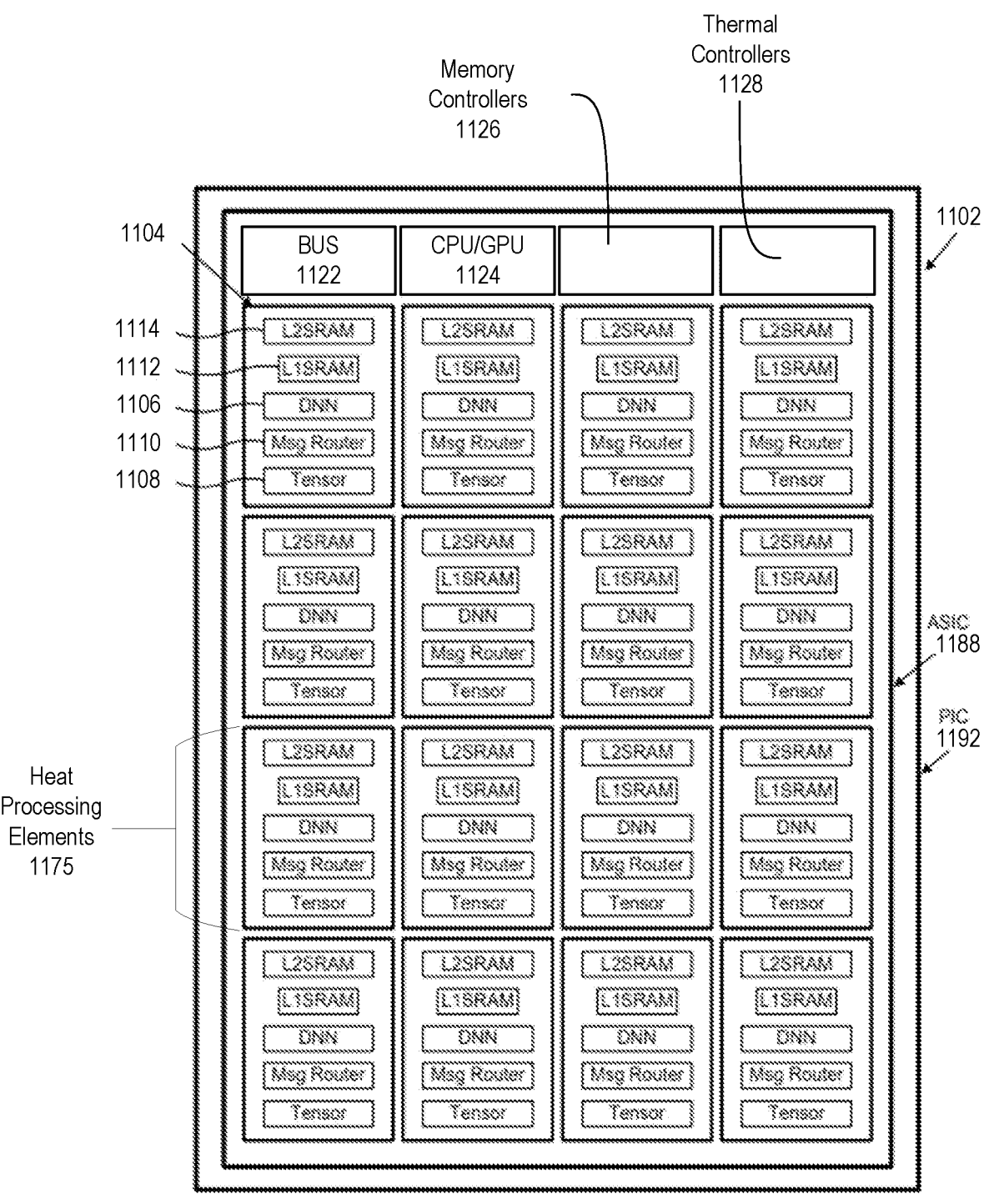
FIG. 11A shows a top view of a system-in-package (SIP) suitable for use by various embodiments.

To further illustrate, FIG. 11A shows some of the elements and features of a portion of a system-in-package (SIP 1102) that provides a suitable environment that benefits from various embodiments. For ease of reference, FIG. 11A may be referred to as a multi-processor system or a SIP 1102, although various portions, elements, and features of the SIP 1102 are not explicitly shown in FIG. 11A.

As shown in FIG. 11A, the SIP 1102 includes sixteen of the nodes 1104, arranged in a 4×4, two-dimensional grid. Each of the nodes 1104 includes heat-producing elements 1175 that generate heat 1180. While a 4×4 grid is shown in FIG. 11A, the number and arrangement of the nodes 1104 and the types of heat-producing elements 1175 contained may vary in different embodiments of the SIP 1102. Additionally, the SIP 1102 includes a laser light source (not shown), a photonic integrated circuit (PIC 1192), and an ASIC 1188 (e.g., a mixed-signal IC). In this document, the ASIC is referred to interchangeably as an electronic-integrated circuit (EIC).

In various embodiments, the laser light source is implemented either in the SIP 1102 or externally. When implemented in the SIP 1102, two alternative embodiments are either an interposer containing several lasers that can be co-packaged and edge coupled with the PIC 1192, or the lasers can be integrated directly into the PIC 1192 using hybrid or heterogeneous integration. Heterogeneous integration allows lasers to be directly implemented in the silicon photonic substrate and allows for lasers of different materials such as InP (Indium Phosphide), and architectures such as quantum dot lasers. The hybrid assembly of lasers on the PIC 1192 allows for III-V semiconductors or other materials to be precision attached to the PIC 1192 and coupled into a waveguide implemented on the PIC 1192. If implemented externally, a connection to the SIP 1102 is made by way of optical coupling, which may be a grating coupler and fiber or an edge coupler.

Further, although not explicitly shown in FIG. 11A, the SIP 1102 includes optical links and connections for one or more fiber connections. Fiber connections can be made by several means. For example, fiber array units are located over grating couplers (e.g., the first fiber array unit 1132a and the second fiber array unit 1132b shown in FIG. 11B), or the edge couplers provide connections. Additionally, in many embodiments, the SIP 1102 functions as a network-on-chip (NOC), and more particularly, a hybrid electro-photonic network-on-chip (EP-NOC).

Figure 11B:
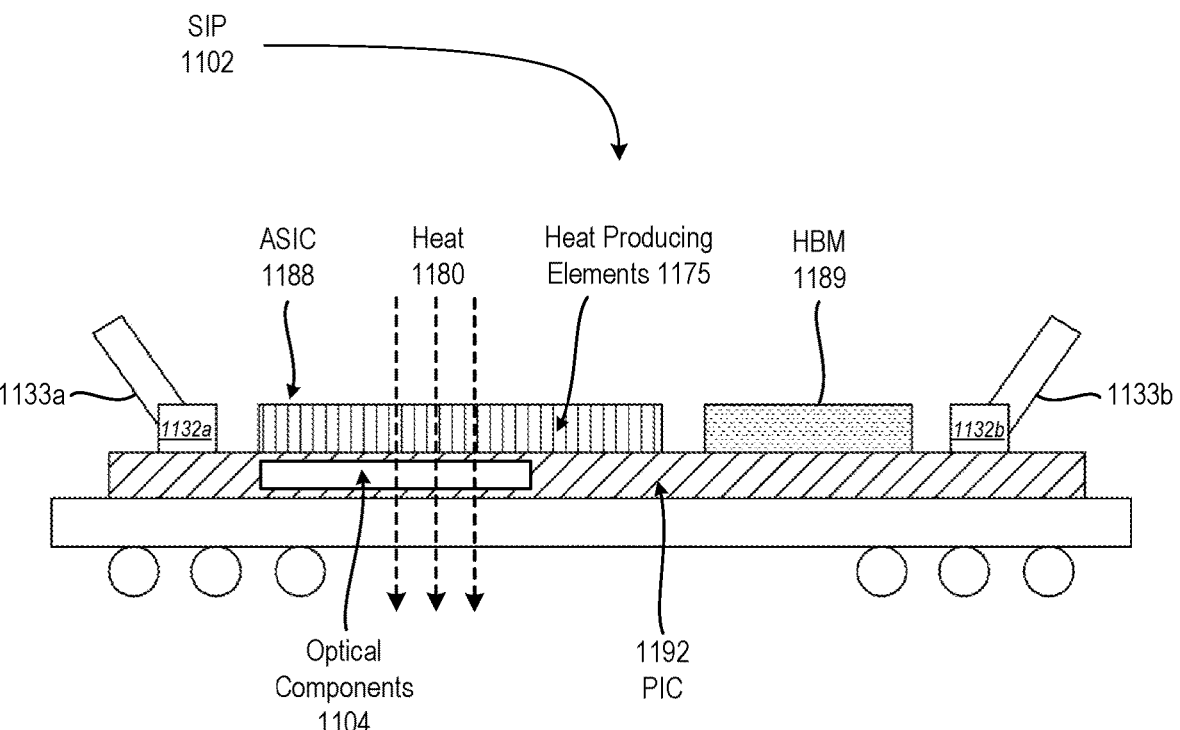
FIG. 11B depicts a side view of the SIP according to one or more embodiments disclosed in this disclosure.

FIG. 11B depicts a side view of the SIP 1102 and indicates the form of assembly of one embodiment using grating couplers and fiber array units discussed further below. It is noted that FIG. 11A generally shows portions of the ASIC 1188 and the PIC 1192 used in the SIP 1102, while the optical couplers and laser sources are omitted from FIG. 11A (FIG. 11B shows the omitted portions of the SIP 1102).

In various embodiments, the PIC 1192 provides a photonic network for interconnecting, among other things, some of the electronic elements on the ASIC 1188 (while some other electronic elements on the ASIC 1188 are interconnected electrically). As shown in FIG. 11B, the electronic elements of the ASIC 1188 include heat-producing elements 1175 that radiate the heat 1180. The heat 1180 can radiate through the PIC 1192, which results in changing the thermal characteristics in the PIC 1192. In various instances, this occurs when the ASIC 1188 is undergoing execution of a computing process or otherwise operating under a load, performing computations, and/or otherwise operating as intended.

In many instances, the heat 1180 impacts the performance of optical components in the PIC 1192. For example, optical components in the PIC 1192 are sensitive to changes in temperature, which can impact their operating characteristics. Moreover, the optical components in the PIC 1192 are directly coupled to the ASIC 1188 in a chip-to-chip manner, without using an interposer or having another means to dissipate heat through distance.

Accordingly, the current embodiment can stack the heat-producing elements 1175 with minimal distance or spacing between the optical components (typically microns). The benefits of the chip-to-chip connection of the SIP 1102 include reduced latency at the expense of added heat to the optical components. This creates an example environment suitable for various embodiments as it would be beneficial to have thermal control over the optical components in the PIC 1192 to maximize and/or optimize the performance of the SIP 1102. Additional details regarding thermally-stable optical modulators (e.g., electro-absorption modulators) that efficiently operate across a range of temperatures are below in connection with FIGS. 18A, 18B, and 19.

As shown, the PIC 1192 includes a first fiber array unit 1132a) that sends and receives optical data from a first optical fiber 1133a as well as a second fiber array unit 1132b that also sends and receives optical data from a second optical fiber 1133b. For example, the first optical fiber 1133a is connected to a first node and the second optical fiber 1133b is connected to a second node.

According to various embodiments, the heat-producing elements 1175 include, but are not limited to, central processing units (CPUs), graphics processing units (GPUs), memory units, memory controllers, message routers, tensor engines, digital neural networks (DNNs), field-programmable gate arrays (FPGAs), and generalized processing elements. In some embodiments, the semiconductor may include an optical layer stacked with an electrical layer.

In many cases, both electrical and photonic signal routings are used. As discussed below, the signal routing tasks are apportioned between electrical (or electronic) paths and photonic paths in different manners. For example, in this disclosure, several processors are interconnected (e.g., interconnected chip-to-chip or SIP-to-SIP) to result in a single system referred to as an accelerator or a multi-processor system. The photonic networks within the several processors, along with optical connections, laser light sources, passive optical components, and external optical fibers on the printed circuit board (PCB), which may be utilized in various combinations and configurations along with other photonic elements, form the photonic fabric of the accelerator and interconnect the several processors.

Figure 12:
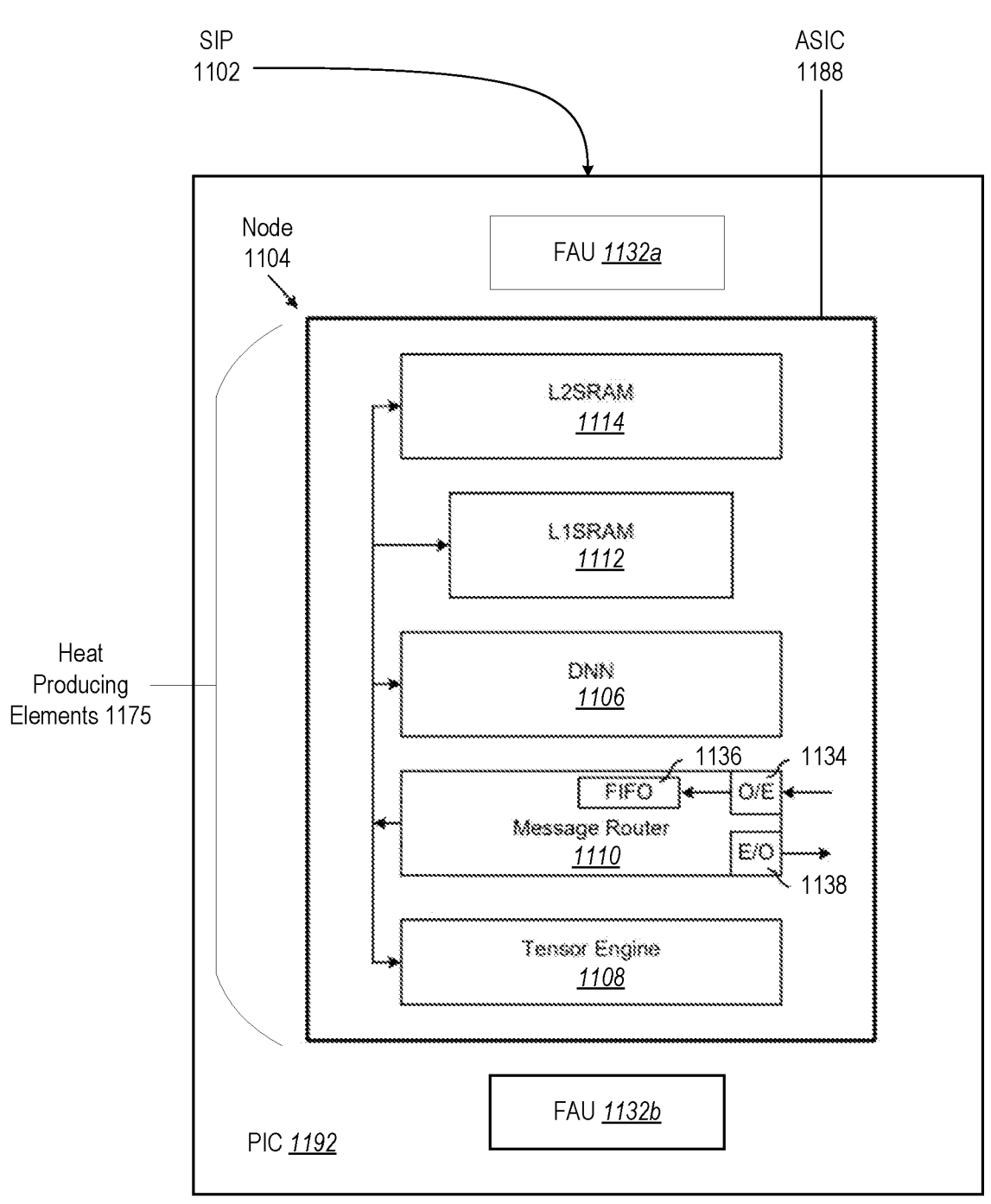
FIG. 12 depicts an example node of heat-producing elements that can be used in a photonic fabric according to one or more embodiments disclosed in this disclosure.

In addition to FIGS. 11A and 11B, FIG. 12 includes an example node of heat-producing elements that can be used in a photonic fabric according to one or more embodiments disclosed in this disclosure. As shown, FIG. 12 includes many of the components previously introduced, such as a node 1104 of the SIP 1102, the PIC 1192, the heat-producing elements 1175, the ASIC 1188, and its corresponding components. Additional descriptions regarding components of the ASIC 1188 are provided below.

To illustrate, the node 1104 in FIG. 12 includes a DNN 1106. For example, the DNN 1106 resides within the ASIC 1188 and is implemented in electronic form. In some embodiments, the DNN 1106 performs a convolution function or a dot-product function as required by neural networks of an accelerator, such as part of inference calculations performed by the accelerator. The multi-processor system of the SIP 1102, including the DNN 1106, is a suitable configuration for various embodiments and used for purposes of illustration, it is not required. In fact, various embodiments are suitable for a variety of environments that include optical components in close coupling with heat-producing elements and/or an EP-NOC, including those configured for general-purpose computing, for example.

As further shown in FIG. 12 (and FIG. 11A), the node 1104 includes a tensor engine 1108, a message router 1110, a level-one SRAM (L1SRAM 1112), and a level-two SRAM (L2SRAM 1114). In various embodiments, the L1SRAM 1112 serves as scratchpad memory for each of the nodes 1104, while the L2SRAM 1114 functions as the primary memory for each of the nodes 1104 and can store the weights of a machine-learning model in close physical proximity to the DNN 1106 and the tensor engine 1108. The L2SRAM 1114 can also store intermediate results that may be required to execute the machine-learning model. In one embodiment, the L1SRAM 1112 is optional. In some instances, the weights are used in each layer of a neural network within each SIP 1102. This can include making inference calculations. Each layer of the neural network can be implemented by several of the nodes 1104 in the SIP 1102, where each of the nodes 1104 comprises one or more neural nodes or neurons.

While operating, the components of the ASIC 1188 generate heat as a neural network processes data and/or performs more computing-intensive tasks. To that end, the DNN 1106, the tensor engine 1108, the message router 1110, the L1SRAM 1112, and L2SRAM 1114 are referred to as the heat-producing elements 1175. These heat-producing elements 1175 may be configured in any number of configurations suitable for an ASIC 1188, which also produces heat during normal operation, whether in an AI accelerator or a general-purpose computer.

Returning to FIG. 11A, the SIP 1102 includes optional elements such as a bus interface 1122, a CPU/GPU 1124, and a memory controller 1126. The bus interface 1122 is a peripheral component interconnect express (PCIE) interface, for example. The CPU/GPU 1124 can be an advanced RISC machine (ARM) core, image processor, or other processing elements. The external memory controller may support DRAM, NVRAM, SRAM, or other types of memory.

In various embodiments, the bus interface 1122 enables electrical interconnections between SIP 1102 and an external component. In particular, weights stored in the L2SRAMs 1114 are received over the bus interface 1122 from an external component, such as a dynamic random-access memory (DRAM). The CPU/GPU 1124 can interface with a memory device (not shown), which may be external to SIP 1102 and may process image data or perform other computing tasks. The memory controllers may communicate with a high bandwidth memory (HBM 1189, shown in FIG. 11B for example), which may be external to the SIP 1102 or integrated into the SIP 1102. Other forms of memory, such as non-volatile memory, may be attached in a similar manner using a corresponding memory controller in the block.

In one or more embodiments, the thermal controllers 1128 include one or more control circuits having an electrical connection to the PIC 1192 to take one or more actions and/or send one or more signals to the PIC 1192. This can be, for example, in response to a thermal characteristic and/or a thermal change in the PIC 1192, where the signal the thermal controllers 1128 can send is configured to alter the operating characteristics of one or more of the optical components of the PIC 1192 and/or to counteract the thermal change that occurred in the PIC 1192. This can typically happen when there is a change in the thermal characteristics in the PIC 1192, which requires some action to continue to operate the optical components in a more efficient and/or enhanced manner.

Referring back to FIG. 12, in one or more embodiments, a message containing the packet data arrives through the photonic network situated on the PIC 1192 and is received at the optical/electrical interface 1134. In some embodiments, the optical/electrical interface 1134 is a photodiode or a related circuit, where at least a portion of it resides in the ASIC 1188. In various embodiments, the message is buffered in electronic form in a register such as the FIFO register 1136 ("first in first out" register). Additionally, an address contained in the message header is then examined by a message router 1110, and the message router 1110 (e.g., electronic message router) determines which port and to which destination the message should be routed. For example, the message is routed to a destination node through the electrical/optical interface 1138, which can be a driver for an optical component, such as an optical modulator (not shown).

In the current example, the optical modulator (not shown) is proximate but commonly stacked below or above the driver in electrical/optical interface 1138. For example, the stacked distance between the optical modulator and the driver in the electrical/optical interface 1138 is measured in microns.

In various embodiments, the proximity of the coupling between the optical modulator and the driver in the electrical/optical interface 1138 as well as the heat generated by the heat-producing elements 1175 creates radiation that alters the thermal environment of the optical components in the PIC 1192.

Regarding FIG. 12, the optical components are not visible because they would be obscured and/or stacked below the optical/electrical interface 1134 and the electrical/optical interface 1138 in the ASIC 1188. For example, a portion of the optical components stacked below the electrical/optical interface 1138 includes a variety of different optical modulators. Examples of applicable modulator technology include electro-absorptive modulators (EAMs) including quantum confined stark effect (QCSE) EAMs, or other modulators having light-absorption characteristics that change based on the thermal characteristics of their environment where operating.

Figure 13A:
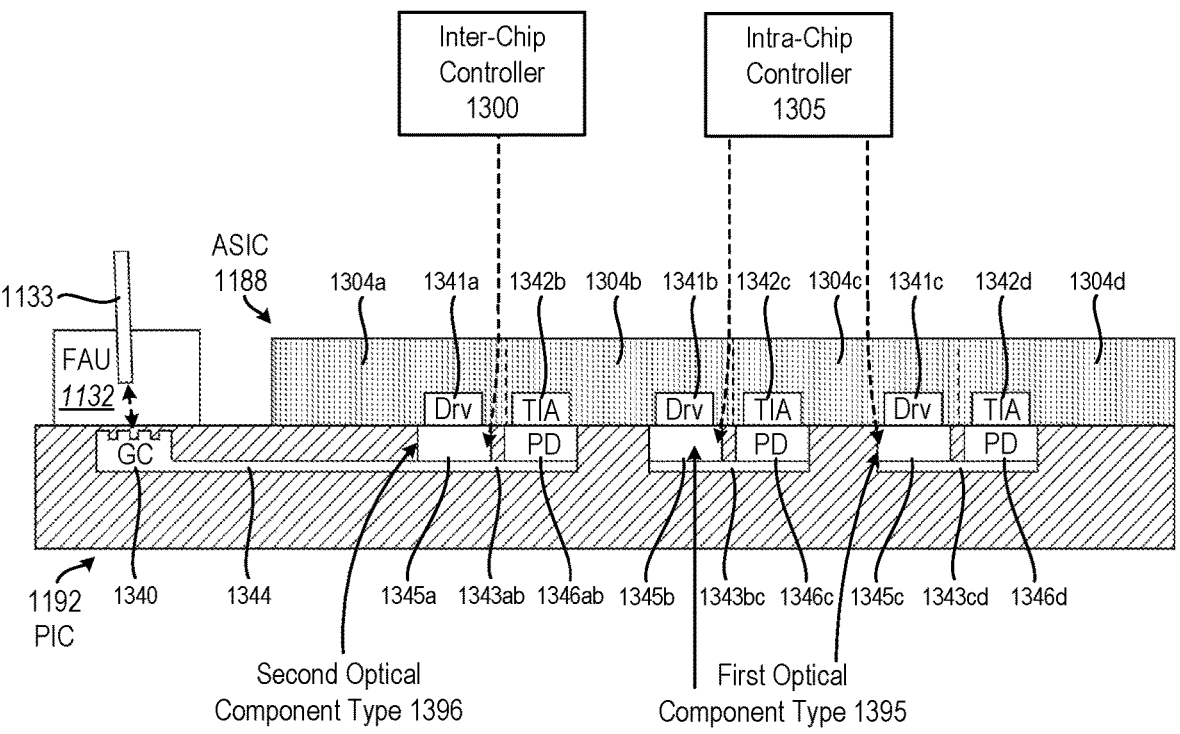
FIG. 13A shows a cross-sectional view of a portion of a thermal control system for an optical component according to one or more embodiments disclosed in this disclosure.
Figure 13B:
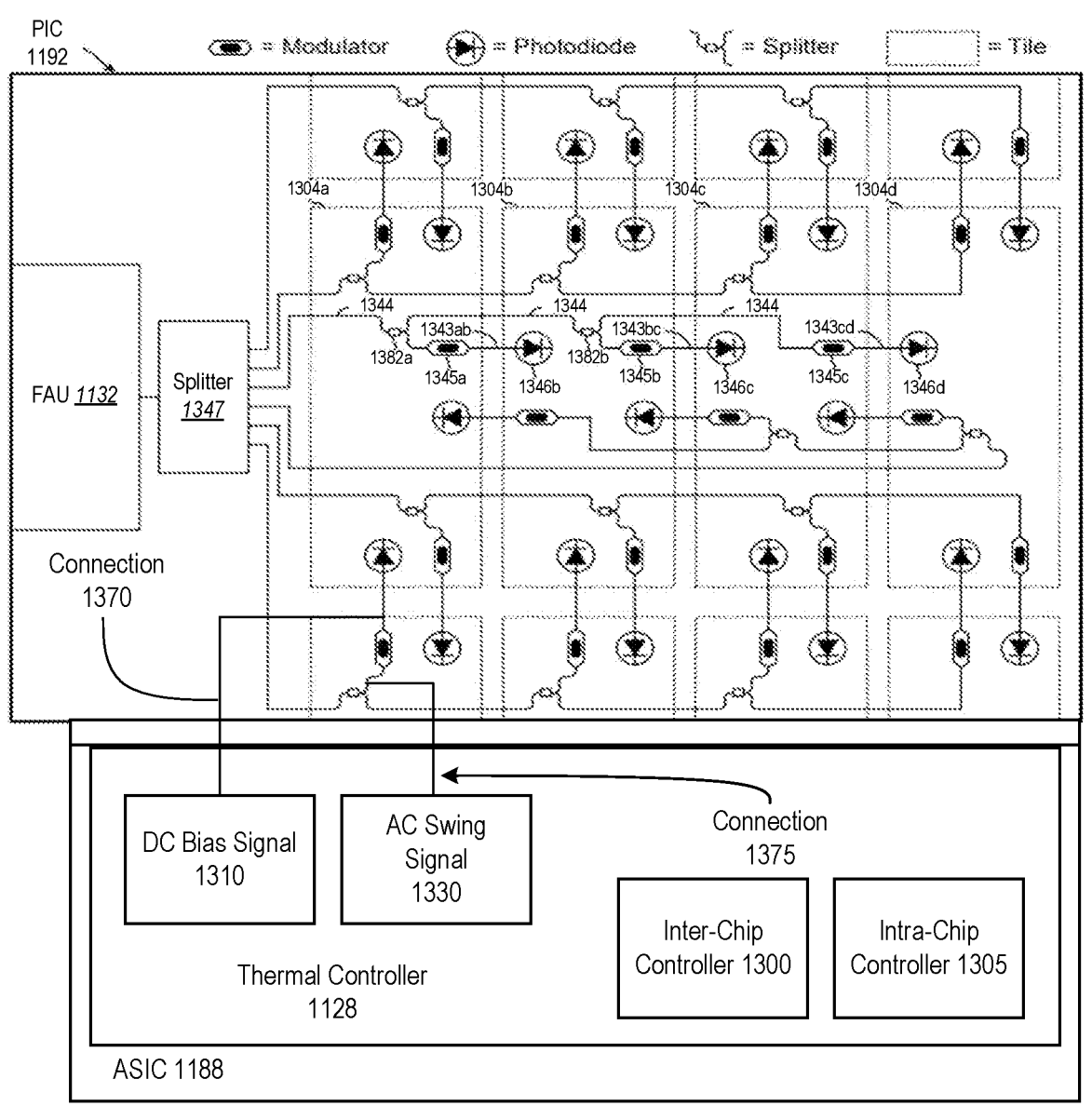
FIG. 13B shows a top view of a portion of a thermal control system for an optical component according to one or more embodiments disclosed in this disclosure.

FIG. 13A shows a cross-sectional view and FIG. 13B shows a top view of a portion of the SIP 1102, which may be used to thermally control one or more optical components according to various embodiments. Referring to FIG. 13A, the ASIC 1188 is shown as being situated over or stacked on the PIC 1192. Examples of the nodes 1304a, 1304b, 1304c, and 1304d in the ASIC 1188 are shown with modulator drivers 1341a, 1341b, and 1341c situated respectively in the nodes 1304a, 1304b, and 1304c (e.g., ASIC nodes). Transimpedance amplifiers (TIAs 1342b, 1342c, and 1342d) are situated respectively in the nodes 1304b, 1304c, and 1304d (e.g., ASIC nodes). Fabricated in the PIC 1192 are optical modulators 1345a, 1345b, and 1345c that are situated directly below respective instances of the modulator drivers 1341a, 1341b, and 1341c.

Also, in the PIC 1192 are photodetectors (e.g., PDs 1346b, 1346c, and 1346d) that are situated directly below respective instances of the TIAs 1342b, 1342c, and 1342d. Optical links, such as waveguides 1343ab, 1343bc, and 1343cd, provide optical paths in the PIC 1192 that are part of the photonic network for intra-chip communication between the nodes 1304a, 1304b, 1304c, and 1304d within the SIP 1102.

Additionally, FIG. 13A includes the optical coupling making connections between nodes. Optical coupling may be implemented using edge coupling or, as in FIG. 13A, using a fiber array unit 1132 (FAU) and an optical fiber 1133 situated over the PIC 1192 and providing optical input to a grating coupler 1340 in the PIC 1192. The optical fiber 1133 may be connected to an off-chip laser light source and/or to another processor's FAU that will provide optical input to the PIC 1192.

Each of the optical modulators 1345a, 1345b, and 1345c can be of a first optical component type 1395 or a second optical component type 1396 of an optical modulator, where the type depends on its location in the system topology. For example, the first optical component type (e.g., associated with optical modulators 1345b and 1345c) has connections internal to the PIC 1192 and routed by waveguides in the PIC 1192 (e.g., an intra-chip modulation). As shown, the optical modulators 1345b and 1345c are of the first optical component type 1395. Additionally, the second optical component type 1396 of the optical modulator is an edge or corner optical modulator, which couples, at least in part, to a fiber array unit 1132 (e.g., an inter-chip modulation). As shown, the optical modulator 1345a has the second optical component type 1396.

In many embodiments, the differences in the hardware used to couple the first and second optical modulator types result in different thermal needs to operate the two optical modulator types optimally. For example, inter-chip modulators receive and/or absorb more light and run hotter in normal operation than an intra-chip modulator. This can be, in part, because the laser light is multiplexed together at the fiber array unit 1132 so the inter-chip modulator (e.g., the optical modulator 1345a) will receive and/or absorb more light than the intra-chip modulators (e.g., the optical modulators 1345b and 1345c). As a result, the inter-chip controller 1300 and the intra-chip controller 1305 can be used in the ASIC 1188 to act with respect to the two different types of optical modulators that reside in the SIP 1102 (e.g., the first optical component type 1395 and the second optical component type 1396).

In one or more embodiments, the laser light source may be on-chip as described above. For example, the laser light does not have to be provided through the fiber array unit 1132. In various embodiments, optical links, such as a waveguide 1344 and additional waveguides not visible in the cross-sectional view of FIG. 13A, supply the light received by the grating coupler 1340 to the optical modulators 1345a, 1345b, and 1345c situated on the PIC 1192. Although the connections between the grating coupler 1340 and other connections of the optical modulators 1345b and 1345c are not explicitly shown in FIG. 13A, these connections are shown in FIG. 13B as FIG. 13A is a cross-sectional view of a portion of FIG. 13B.

As shown in FIG. 13B, the waveguide 1344 carries laser light source from the fiber array unit 1132 through an optional splitter 1347 to the splitter 1382a (the splitter 1382a is not shown in FIG. 13A). From the splitter 1382a in the node 1304a, one optical path is provided to the optical modulator 1345a, while another optical path is provided through a continuation of a waveguide 1344 to the splitter 1382b in the node 1304b (the splitter 1382b is not shown in FIG. 13A). From the splitter 1382b in the node 1304b, one optical path is provided to the optical modulator 1345b, while another optical path is provided through a continuation of the waveguide 1344 to the optical modulator 1345c in the node 1304c.

FIG. 13B further shows top views of the waveguide 1343ab connecting the optical modulator 1345a to the PD 1346b, the waveguide 1343bc connecting the optical modulator 1345b to the PD 1346c, and the waveguide 1343cd connecting the optical modulator 1345c to the PD 1346d. The top views of FIG. 13B correspond to the respective cross-sectional views in FIG. 13A. In addition to what is shown in the cross-sectional view in FIG. 13A, FIG. 13B shows a top view of other optical paths in the PIC 1192 as an additional example of optical connections between various nodes in the SIP 1102.

In various embodiments, the ASIC 1188 is electrically coupled to the PIC 1192 and includes a thermal controller 1128, as shown in FIGS. 13A and 13B. For example, the thermal controller 1128 includes an inter-chip controller 1300 (e.g., an inter-chip thermal controller), an intra-chip controller 1305 (e.g., an intra-chip thermal controller), a DC bias signal 1310, and an AC swing signal 1330. In various embodiments, the DC bias signal 1310 has an electrical connection 1370 to an anode of one of the optical modulators.

In one or more embodiments, the electrical connection 1370 is implemented with a through-silicon via (TSV), a wire, or another suitable electrical connection capable of carrying a voltage signal to the anode of one of the optical modulators. In some instances, the AC swing signal 1330 has an electrical connection 1375 to a cathode of one of the optical modulators. Additionally, in various embodiments, the electrical connection 1375 is implemented with a TSV, a wire, or another suitable electrical connection capable of carrying a voltage signal to the cathode of one of the optical modulators.

In many embodiments, for node-to-node communications between a first node and a second node, the streaming of activations from the first node in a first SIP to the second node in a second SIP is performed using the photonic network in the PIC 1192 by using optical components that include modulators and photodetectors, which are situated directly below respective modulator drivers and TIAs on the ASIC 1188. Often, the optical modulators and photodetectors are connected by optical paths on the PIC 1192, such as waveguides. Accordingly, in many instances, most or all of the node-to-node communications are not performed electronically in the ASIC 1188 but are performed optically by the photonic network provided by the PIC 1192.

Additionally, in various embodiments, on-chip optical communications are generally performed using a single wavelength light. In some embodiments, however, on-chip optical communications are performed with multiple wavelengths.

Figure 14:
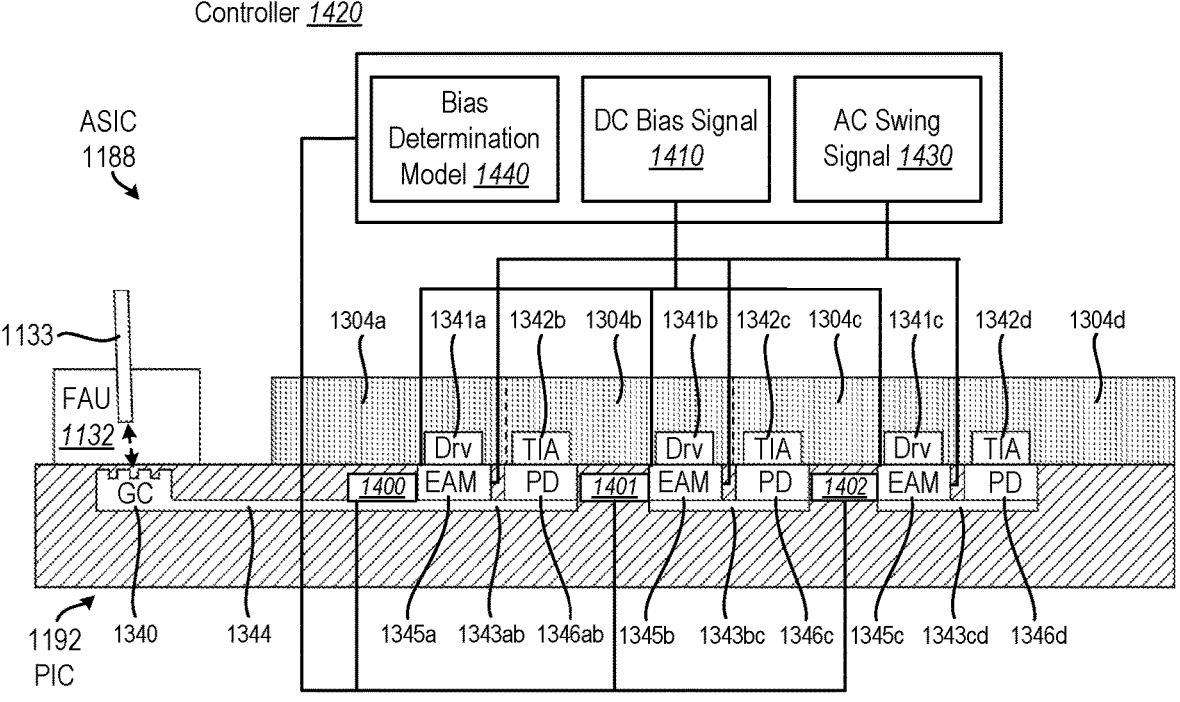
FIG. 14 shows a cross-sectional view of a portion of a SIP that has the capability for thermally controlling an optical component according to one or more embodiments disclosed in this disclosure.

FIG. 14 shows a cross-sectional view of a portion of an example SIP that for thermally controlling an optical component according to embodiments disclosed herein. FIG. 14 shows example nodes with components previously introduced. For example, FIG. 14 includes the ASIC 1188 having the nodes 1304a, 1304b, and 1304c with the modulator drivers 1341a, 1341b, and 1341c situated in respective nodes. As shown, the optical modulators 1345a, 1345b, and 1345c are situated directly below respective instances of the modulator drivers 1341a, 1341b, and 1341c.

As also shown, the temperature sensors 1400, 1401, and 1402 are associated with the optical modulators 1345a, 1345b, and 1345c. For example, each of the temperature sensors 1400, 1401, and 1402 are capable of monitoring the temperature of respective instances of the optical modulators 1345a, 1345b, and 1345c and are positioned accordingly in the PIC 1192. In some embodiments, the optical modulators 1345a, 1345b, and 1345c have a generally broad thermal range of operation (e.g., a difference of a few degrees Centigrade will have a minimal performance impact on the optical modulators 1345a, 1345b, and 1345c).

In some instances, the optical modulators 1345a, 1345b, and 1345c are manufactured to operate when the ambient temperature is at the highest specified temperature and/or the ASIC 1188 is fully throttled to maximum power (e.g., all of the nodes 1304a, 1304b, and 1304c are executing with a maximum load). When the ASIC 1188 throttles back, the ambient temperature may cool and the optical modulators 1345a, 1345b, and 1345c will no longer perform optimally. In this scenario, taking corrective action with respect to the thermal environment of the optical modulators 1345a, 1345b, and/or 1345c may be useful to return them to their optimal performance state.

When operating, the ASIC 1188 uses the optical modulators 1345*a*, 1345*b*, and 1345*c* to optically encode bits to photonically send them to a destination. As an example, the following scheme is implemented to control the behavior of the optical modulators 1345*a*, 1345*b*, and 1345*c* to enable consistent performance regardless of the thermal impact of the ASIC 1188. To illustrate, an AC swing signal from the AC swing signal 1330 (such as a swing of +/−0.9 volts) is applied to the optical modulators 1345*a*, 1345*b*, and 1345*c* at the first terminal. A DC bias signal from the DC bias signal 1310 is applied at a second terminal of the optical modulators 1345*a*, 1345*b*, and 1345*c*.

In some instances, the application of a plus or minus 0.9 voltage swing signal (or other swing signal depending on how the optical modulators are constructed) from an AC swing signal 1430 results in the optical modulators 1345*a*, 1345*b*, and 1345*c* having a swing between 0.1 to −1.9 volts when combined with a default negative 1 volt DC signal (e.g., a negative DC bias voltage) sent from the DC bias signal 1310. As the system operates, thermal energy may be transferred from the ASIC 1188 to the PIC 1192. As the ASIC 1188 throttles down, some portion of the ASIC 1188 idles and/or the load on the ASIC 1188 changes during the execution of a process, the temperature associated with the optical modulators 1345*a*, 1345*b*, and 1345*c* also changes. The temperature sensors 1400, 1401, and 1402 continually monitor respective instances of the optical modulators 1345*a*, 1345*b*, and 1345*c*. The output of the temperature sensors 1400, 1401, and 1402 is sent to a controller 1420.

In various embodiments, the controller 1420 is a software, hardware, or firmware module (or any combination of these) that implements logic capable of determining when a thermal variable, such as heat, diverges from an optimal range. For example, the controller 1420 utilizes a look-up table, accesses a database, computes a value using an activation function, or uses some other means in a bias determination module 1440 to determine when and how much voltage to apply to the optical modulators 1345*a*, 1345*b*, and 1345*c* via DC bias signal 1310. As the temperature in the PIC 1192 changes, the temperature sensors 1400, 1401, and 1402 continue to send associated signals to the controller 1420. Once a thermal threshold is diverged from sufficiently and/or the thermal conditions of the optical modulators 1345*a*, 1345*b*, and 1345*c* require intervention, the controller 1420 sends an input to the DC bias signal 1410 (which can cause the DC bias signal 1410 to send a different bias signal (corresponding to a different value) than the default −1-volt signal). In response, the DC bias signal 1410 outputs the new bias signal and provides it as input to the optical modulators 1345*a*, 1345*b*, and 1345*c*, thereby altering their performance.

In one or more embodiments, the new DC bias signal is obtained by the bias determination module 1440 by using a table, a database, or another suitable data structure. In these embodiments, using a table, it can have a plurality of rows and columns where each row has at least a first column to represent a temperature and a corresponding second column to represent an associated voltage value or voltage values. The bias determination module 1440 can be used to locate, select, or otherwise determine a row in a table that corresponds to the current temperature and to select, access, or otherwise obtain the corresponding new DC bias voltage signal in an associated column of the row. For example, the bias determination module 1440 uses the current temperature received from the temperature sensors 1400, 1401, and 1402 and compares the current temperature to each row in the table until it matches. From there, the new voltage can be obtained by accessing an associated column of the selected row that has the new voltage value. This may result in a new voltage signal that may be sent to the optoelectrical region.

In some embodiments, the bias determination module 1440 is used to apply the current temperature to an activation function that can compute the product and/or multiply the current temperature with the activation function to obtain the current voltage needed to be used as the new DC bias signal. For example, if the new DC bias voltage signal obtained by the bias determination module 1440 is −2 volts, the new swing signal of the optical modulators 1345*a*, 1345*b*, and 1345*c* will be between −2.9 volts and −1.1 volts. It should be noted that the values of the DC bias signal sent from the DC bias signal 1310 are for purposes of example only.

Additionally, the DC bias signal 1410 can be different in various embodiments depending on the nature of the system, how the optical components are constructed, what type of load the ASIC 1188 is expected to utilize, and the like. For example, the amount of heat generated by the ASIC 1188, the thermal environment of the computing device that includes the optical components, the type of application using the computing system, the types of optical components, and other factors determine what value the DC bias signal 1410 should send and what type of activation function, database, or look-up table the bias determination module 1440 utilizes, as well as the actual values contained therein.

In general, when the temperature cools, the bias signal sent by the thermal signal block can be applied to cause the optical modulators 1345*a*, 1345*b*, and 1345*c* to absorb more light sent via the optical fiber 1133 or carried by the waveguides. Likewise, as the temperature increases, the bias signal sent by the thermal signal block can be changed to cause the optical modulators 1345*a*, 1345*b*, and 1345*c* to absorb less light sent via the optical fiber 1133 or carried by the waveguides. In this manner, DC voltage control can be used to compensate for temperature drift. Thus, the temperature range for the optical modulators 1345*a*, 1345*b*, and 1345*c* can be extended by changing a DC bias via the DC bias signal 1410 when the controller 1420 takes an action with respect to the thermal condition and/or otherwise provides input to the optical modulators 1345*a*, 1345*b*, and 1345*c*.

Figure 15:
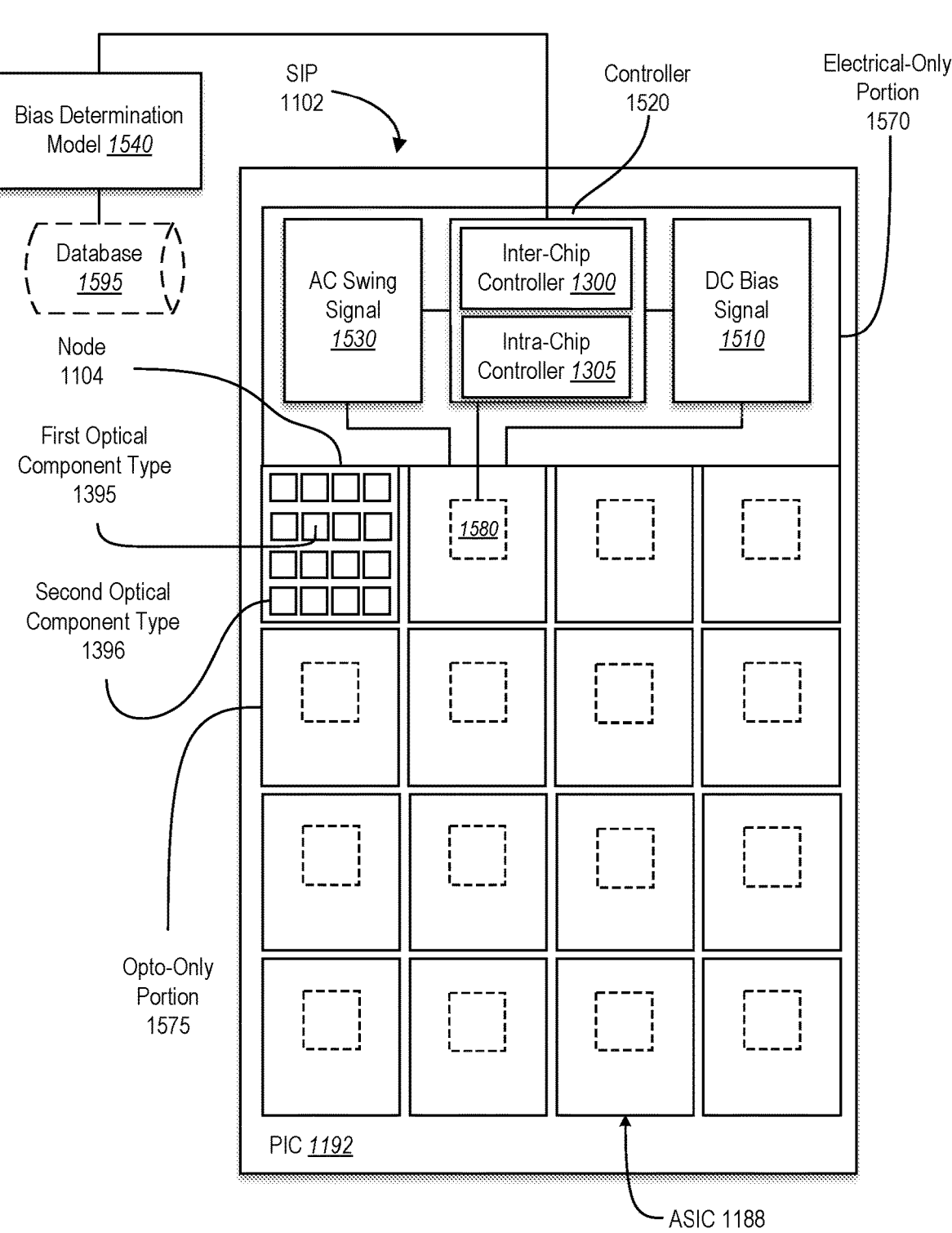
FIG. 15 shows a top view of a SIP that has the capability for thermally controlling an optical component according to one or more embodiments disclosed in this disclosure.

FIG. 15 shows another top view of an example SIP (e.g., SIP 1102) that has the capability for thermally controlling an optical component according to various embodiments. In the arrangement of FIG. 15, a PIC 1192 is stacked with an ASIC 1188 having an electrical-only portion 1570 and an opto-electrical portion 1575. The PIC 1192 may be partitioned into an electrical-only region and an optoelectrical region. The electrical-only portion 1570 of the ASIC 1188 generally corresponds to processing areas that do not rely on photonic elements in the PIC 1192 (ed stacked, adjacent, and/or directly below the heat-producing elements). Therefore, the electrical-only portion 1570 is not required to have thermal controls in this region.

In various embodiments, the electrical-only portion 1570 includes an AC swing signal 1530, a controller 1520, and a DC bias signal 1510. In some instances, these blocks (e.g., the DC bias signal 1510, the controller 1520, and the AC swing signal 1530) use a CPU or other suitable processor and/or memory in the region (not shown). Additionally, the controller 1520 can be a single unit or multiple controllers or control circuits and include the capability to control a first optical component type 1395 of the optical modulator using an intra-chip controller 1305 and/or a second optical component type 1396 of the optical modulator using an inter-chip controller 1300, for example.

As shown in FIG. 15, the first optical component type 1395 of the optical modulator includes solely optical connections to other neighbors within the node 1104 and is referred to as an intra-chip optical component, as previously mentioned. As also mentioned, the second optical component type 1396 of the optical modulator includes optical connections to the edge of the node 1104 to other chips and/or nodes via an FAU, for example. In various instances, both the first optical component type 1395 and the second optical component type 1396 of optical modulators are independently controlled by the same controller or different controllers (e.g., the controller 1520).

In many instances, the change to the DC bias signal 1510 caused by the inter-chip controller 1300 or the intra-chip controller 1305 will typically differ even when the thermal conditions are the same in the relevant temperature sensing region because of the different hardware that feeds the first optical component type 1395 and the second optical component type 1396 of optical modulators. In the current example, each node has 16 EAMs, eight of which are the first optical component type 1395 and eight of which are the second optical component type 1396. Also, the electrical-only portion 1570 includes a communicative coupling (either electrical or optical or both) to the two optical modulator types in an optoelectrical portion 1575 of the ASIC 1188. In the current embodiment, each ASIC 1188 has 1,256 EAMs, although not required. Other arrangements may be used in other embodiments.

Each node also includes a temperature sensing region 1580. As shown, the PIC 1192 has sixteen instances of the temperature sensing region 1580 that each include the first optical component type 1395 and the second optical component type 1396 of optical modulators. Typically, the spacing of the first optical component type 1395 and the second optical component type 1396 of optical modulators are measured in millimeters or fractions of millimeters, so the temperature differences between individual ones of the optical modulators in each node will not vary by a large amount.

In some embodiments, instead of high-resolution temperature sensors, the bias signals are adjusted to sixteen optical modulators at a time in each node (a new bias for the inter-chip optical modulators of the first optical component type 1395 and a new bias for the intra-chip optical modulators of the second optical component type 1396) rather than sensing the temperature at each of the optical modulators.

In some embodiments, and where applicable, such as in FIG. 15, each of the optical components can have an associated temperature sensor. Moreover, the temperature sensing region can be located on a node advantageously by utilizing available real-estate on-chip. To that end, the instances of the temperature sensing region 1580 need not be centered in the node and can be located off-center depending on the other components of the node that also reside there. As shown in FIG. 15, the temperature sensing regions are off-center and, hence, not equidistant from the four corner modulators of the node 1104.

When operating, a default version of the AC swing signal 1530 is provided to each of the 1,256 optical modulators (e.g., of the first optical component type 1395 and the second optical component type 1396) on the PIC 1192 at a cathode. In various embodiments, a default negative bias signal is also provided by the DC bias signal 1510 to each of the 1,256 optical modulators at an anode. This results in a default behavior for all of the optical modulators 1 on the PIC 1192, enabling them to encode bits and otherwise perform photonic processing of data or packets in a typical manner.

Indeed, each of the sixteen instances of the temperature sensing region 1580 has an associated temperature sensor placed within the region. Each of the temperature sensors sends output to the controller 1520 in the form of data that represents the current temperature in a particular instance of the temperature sensing region 1580. As such, the controller 1520 of the current embodiment receives sixteen signals periodically regarding the current temperature in each instance of the temperature sensing region 1580.

In various embodiments, the controller 1520 includes an inter-chip controller 1300 and an intra-chip controller 1305. For instance, the inter-chip controller 1300 is configured to control the thermal characteristics of the second optical component type 1396 of optical modulators. In some instances, the intra-chip controller 1305 is configured to control the thermal characteristics of the first optical component type 1395 of optical modulators. For purposes of example, it is assumed that the node 1104 sends data to the controller 1520 from the temperature sensor in its temperature sensing region. Additionally, the controller 1520 uses a bias determination module 1540 that can optionally be coupled to a database 1595 or other data store.

In some embodiments, the bias determination module 1540 uses the current temperature received from the temperature sensing region 1580 of the node 1104 to determine whether the optical modulators (e.g., of first optical component type 1395 and/or of the second optical component type 1396) need to have a modified bias signal to maximize its performance based on the current thermal conditions. The bias determination module 1540 can use the database 1595 to access a table or other data structure that matches temperatures to new bias signals for each of the first and second types of optical modulators.

In some embodiments, any suitable function or linear transformation can be used where the product of the current temperature and an activation value results in a new bias value. Then, once the new bias values are obtained from the bias determination module 1540, the inter-chip controller 1300 sends the new voltage value to the anode of each of the optical modulators of the second optical component type 1396. Similarly, the intra-chip controller 1305 sends the new voltage value to the anode of each of the optical modulators of the first optical component type 1395. Thereafter, the process repeats as the SIP 1102 operates as intended.

FIG. 16 is a flowchart showing the operations involved in the thermal control of an optical component according to one embodiment. At operation 1600, AC swing signals associated with optical components are applied at the first terminal of each of the optical components in an EP-NOC. At operation 1610, default DC bias signals associated with optical components are applied at a second terminal of each of the optical components in the EP-NOC. In one embodiment, operations 1600 and 1610 include applying a high-speed AC signal at a cathode of each of the optical components and applying a default DC bias of negative voltage at an anode of each of the optical components. The results of operations 1600 and 1610 in the current example result in the optical components alternating between 0.1 and −1.9 volts when encoding bits based on the applied signal.

At operation 1620, a temperature is sensed in a temperature-sensing region of the EP-NOC associated with the optical components. This could include, for example, an EP-NOC having sixteen nodes per chip and sixteen optical components per node. In some embodiments, the temperature sensing regions are positioned in association with the sixteen optical components for each region, although placing them at the same distance from each of the optical components is not necessary. In some embodiments, other configurations can be used. The temperature sensor can be any device suitable for this purpose, but some systems can save cost by using a lower level of precision in the temperature sensor since the spacing between the optical modulators is relatively small leading to minimal temperature differences within a given node.

At operation 1630, a signal associated with the sensed temperature is sent to a controller. In one embodiment, the controller can be implemented with a processor separate from the nodes of the photonic fabric such as an ARM or another family of CPU. The signal represents, for example, the current temperature in the temperature-sensing region. At operation 1640, the controller determines whether thermal controls are needed in the node based on the data received from the temperature sensing region. For example, the controller determines when to initiate thermal control over the optical components. This could include, for example, using a bias determination module that utilizes, a database, a data structure, a look-up table, and/or uses an activation function to determine if the current temperature has a value that is assigned to a DC bias voltage that differs from the default DC bias voltage sent at operation 1610.

At operation 1650, if thermal controls are needed, a new voltage is obtained at operation 1660 based on the current operating temperature in the temperature sensing region. At operation 1670, the new voltage is sent to the second terminal of the optical components associated with the temperature sensing region. If no thermal controls are needed at operation 1650 or after the new voltage is sent at operation 1670, the process repeats at operation 1620. The SIP will continue to repeat these operations whenever there is a load applied to the ASIC in the SIP and/or the system is operating as intended.

Figure 17:
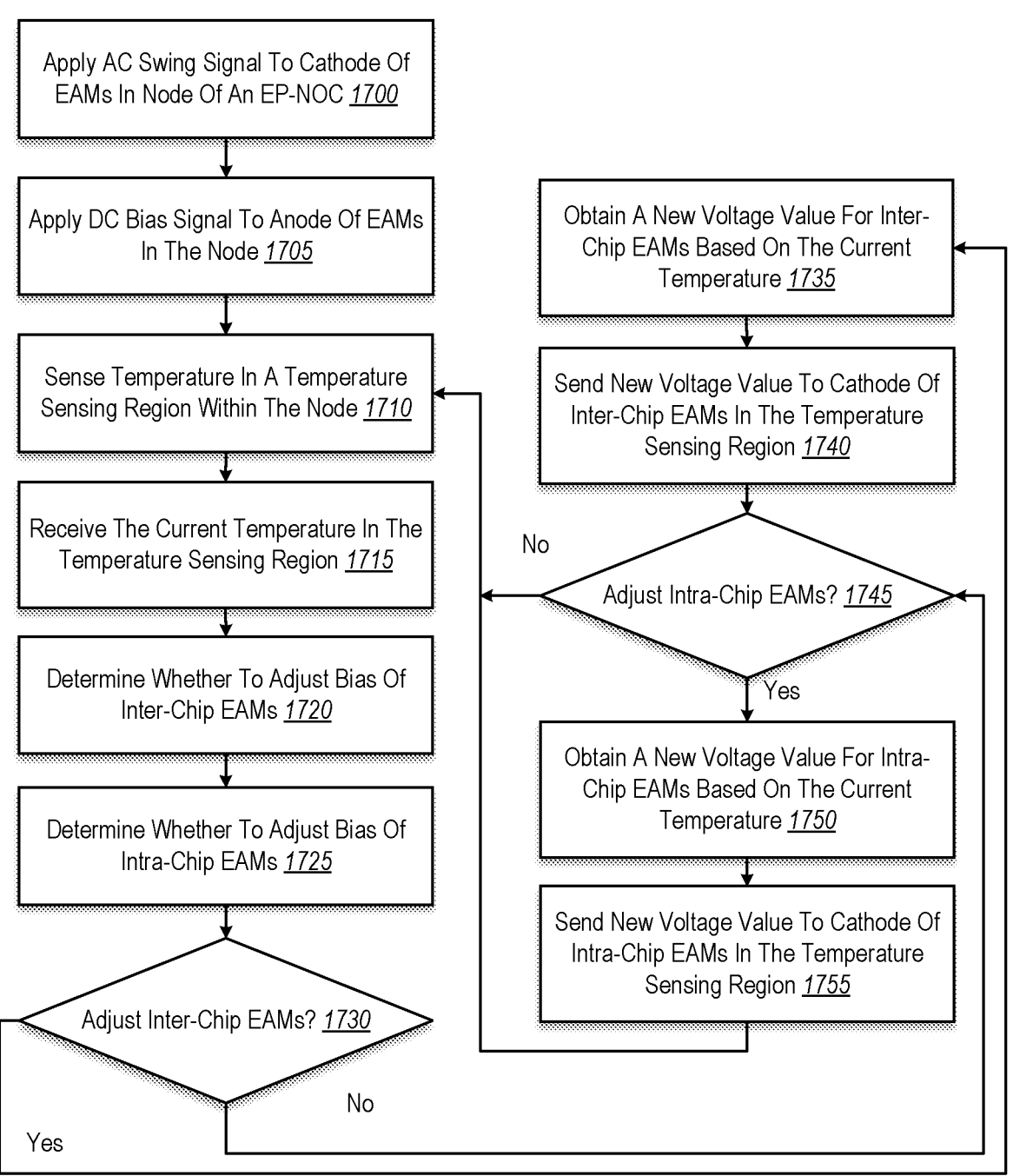
FIG. 17 is a flowchart showing the operations involved in thermally controlling an optical component according to one or more embodiments disclosed in this disclosure.

FIG. 17 is a flowchart showing the operations involved in the thermal control of an optical modulator according to another embodiment. At operation 1700, AC swing signals associated with EAMs are applied at the cathodes of each of the EAMs in one node, a portion of the nodes, or all nodes in an EP-NOC. At operation 1705, default DC bias signals associated with the EAMs are applied at the anodes of each EAM in one node, a portion of the nodes, or all nodes in the EP-NOC.

At operation 1710, a temperature is sensed in a temperature-sensing region of the EP-NOC associated with the node where the EAMs reside. The temperature sensor can be any device suitable for this purpose, and varying resolutions are possible. At operation 1715, a signal associated with the sensed temperature is sent to a controller. In one embodiment, the controller can be in an electrical-only portion of the EP-NOC where the ASIC is stacked with the PIC but has no optical components interconnected in the region, and, hence, the thermal controls are not needed. The electrical-only region can have an electrical interconnect via the ASIC to a hybrid optoelectrical region where the analog components of the ASIC are stacked above portions of the PIC that have optical components that can benefit from thermal controls.

At operations 1720 and 1725, the controller determines whether thermal controls are needed in the relevant nodes based on the data received from the temperature sensing region. This can include, for example, the determinations that adjustments should be made to both the inter-chip EAMs, the intra-chip EAMs, or both. Typically, the inter and intra-chip EAMs have different hardware that feeds their operations. For example, inter-chip EAM may receive light that has been split less and has a higher power compared to intra-chip EAMs. The differences usually result in a different thermal signal being sent to the two types of optical components, when the determination is made that a signal should be sent.

At operation 1730, the controller determines whether the inter-chip EAMs need a thermal-based adjustment. If so, a new voltage is obtained at operation 1735 based on the current operating temperature in the temperature sensing region and the associated new bias signal that needs to be added to the inter-chip EAMs based on the current thermal conditions. At operation 1740, the new voltage is sent to the anode of the inter-chip EAMs in the relevant temperature-sensing region.

If the inter-chip EAMs do not need thermal adjustment at operation 1730, or after operation 1740, the controller determines at operation 1745 whether the intra-chip EAMs need a thermal-based adjustment. If so, a new voltage is obtained at operation 1750 based on the current operating temperature in the temperature sensing region and the associated new bias signal that needs to be added to the intra-chip EAMs based on the current thermal conditions.

At operation 1755, the new voltage is sent to the anode of the intra-chip EAMs in the relevant temperature sensing region. Thereafter, or if the intra-chip EAMs did not need a thermal adjustment at operation 1745, the process repeats at operation 1710. The SIP will continue to repeat these operations whenever there is a load applied to the ASIC in the SIP and/or the system is operating as intended.

As described herein, the present EP-NOC includes a novel scheme for controlling the thermal characteristics of one or more optical modulators in the receive units of the EP-NOC. Indeed, this document Indeed, this document describes an EP-NOC that results in significant improvement in the performance of the receive units.

Additional discussion will now be provided regarding devices, systems, and methods for electro-absorption modulators (EAMs) that provide stable operation over a wide temperature range of modulation for optical components of a computing device. As provided above, an EAM is a semiconductor-based optical modulator, often used for controlling a light source using voltage. For example, an EAM uses low voltage amounts to modulate a laser beam. As noted, EAMs are based on utilizing the Franz-Keldysh effect for electrically-induced changes in optical absorption.

By way of context, heat-producing electronic elements in the ASIC exhibit a wide variation in the amount of heat they produce under different loads. Optical modulation elements in the PIC are designed to operate in a defined temperature range. The impact of widely varying heat from the electronic elements being directly coupled to optical modulation elements makes it an important consideration when designing optical components in the PIC that meet required operating parameters and are reliable in these conditions.

This becomes even more important in a photonic fabric environment, where thousands of electronic elements are next to corresponding optical modulation elements (e.g., within 50 microns). While there is a massive advantage to the speed of computations and energy efficiency that comes from implementing a direct coupling between electronic elements and optical modulation elements, the impact of varying levels of heat on the PIC can also be a disadvantage.

Indeed, a photonic fabric is designed to have optical modulation elements that can operate efficiently in a temperature range that is consistent with what it will experience when the ASIC is operating at or near the max load. Likewise, when operating at a smaller load, the amount of heat produced by the ASIC that impacts the PIC will be smaller and the temperature is lower in the region where the optical modulation elements are operating. Accordingly, it is important to have optical modulation elements that are also efficient within these lower-temperature conditions.

To elaborate, the material and type of optical modulator used should account for the expected temperature conditions in the PIC. The optical modulator should also account for the temperature fluctuations that indirectly result from an idling ASIC as well as for other characteristics of a system that could cause changes to the thermal operating environment of the optical modulation elements. Accordingly, the EAM described herein accounts for these factors and efficiently operates across a wide age of operations.

In various embodiments, to achieve a stable operation over a wide temperature range, the EAM is made of bulk semiconductor material. For example, the EAMs are made of one or more materials, such as pure Germanium or Silicon (or their alloys), or various so-called III-V materials, which primarily include indium phosphide (InP) or gallium arsenide (GaAs) material systems.

One use case for employing thermally-stable optical modulation elements is to accommodate operations over a wide temperature range, as discussed previously. Another use case includes situations involving high optical modulation amplitude (OMA) output, which is typical in narrower operating ranges while still being thermally stable. Optical modulation elements that are designed for operation over a wide temperature range typically operate in a range that exceeds 30 degrees Centigrade (although an optical modulation element with a narrower operating range is also feasible). Optical modulation elements that are designed for high OMA output typically operate in a range that is smaller than 30 degrees Centigrade (although an optical modulation element with a broader operating range is also feasible).

As discussed above, this disclosure describes EAMs that operate over a wide temperature range. In some embodiments, the EAMs are based on quantum-confinement architectures and achieve enhanced performance in terms of higher OMA output from the EAMs over a narrower temperature range. For example, an EAM that is based on the quantum confined stark effect (QCSE) achieves these results, especially when made for bulk semiconductor materials (e.g., alloys of Germanium and Silicon as well as alloys using III-V materials based on the Indium Phosphide and Gallium Arsenide systems).

In various embodiments, the EAMs disclosed in this document utilize a thermal control loop, which applies a voltage (bias voltage) to the optical modulation elements in response to a changing thermal condition in the PIC. In this manner, the voltage application causes the optical modulation elements to operate as if their thermal temperature conditions were near what they would experience at max load, even if the actual temperature in that region is cooler and/or outside the normal thermal range of the optical modulation component (e.g., absent the provided voltage signal). Moreover, the temperature range of the optical modulation component is extended via the added voltage even though the temperature conditions may have exceeded the operating range of the device.

In some embodiments, the thermally-stable optical modulator operates in a temperature range larger than 30 degrees Centigrade. For example, the thermally-stable optical modulator is an EAM that is about 50 microns in size and operates at data rates between 50-115 Gbps, at less than 1.0 volt of power. In these embodiments, the EAM enables silicon photonics packaging directly to the processor, ASIC, and memory chips. Additionally, the EAM provides optical connectivity both within a chip as well as chip-to-chip. Additionally, one or more embodiments, the EAM (i.e., the thermally-stable optical modulator) has stable operations while also having a narrow (or fairly narrow) operating range, which may be further enhanced by a thermal control loop.

In various embodiments, the EAM (i.e., the thermally-stable optical modulator) operates in a temperature range smaller than 30 degrees Centigrade. For example, the EAM is based on quantum-confinement architectures, as described. In these instances, a higher optical OMA output from the EAM is used over a narrower temperature range (e.g., less than 30 degrees Centigrade) to achieve enhanced performance. Additionally, as noted above, in some of these embodiments, the EAM is made from (e.g., consist of) materials selected from germanium, silicon, an alloy of germanium, an alloy of silicon, an III-V material based on InP, and/or an III-V material based on GaAs.

As also noted above, in certain embodiments, the EAM (i.e., the thermally-stable optical modulator) uses a quantum confined stark effect (QCSE) for an electrically-induced change in optical absorption. In this way, the EAM outputs a higher optical modulation amplitude. For example, the EAM utilizes a QCSE modulator with a high OMA to achieve a wide or fairly wide operating range, which may be further enhanced by a thermal control loop.

Additional details are now provided regarding the environment in which an EAM operates. More particularly, embodiments described in this document involve chip hardware including features and functionality that provide one or more thermally-stable optical modulation elements coupled to more or more electronic elements. In one or more embodiments, the hardware is an apparatus that includes an electronic-integrated circuit (EIC) and a photonic-integrated circuit (PIC). The PIC may be stacked in a direct coupling with the EIC.

Figure 18A:
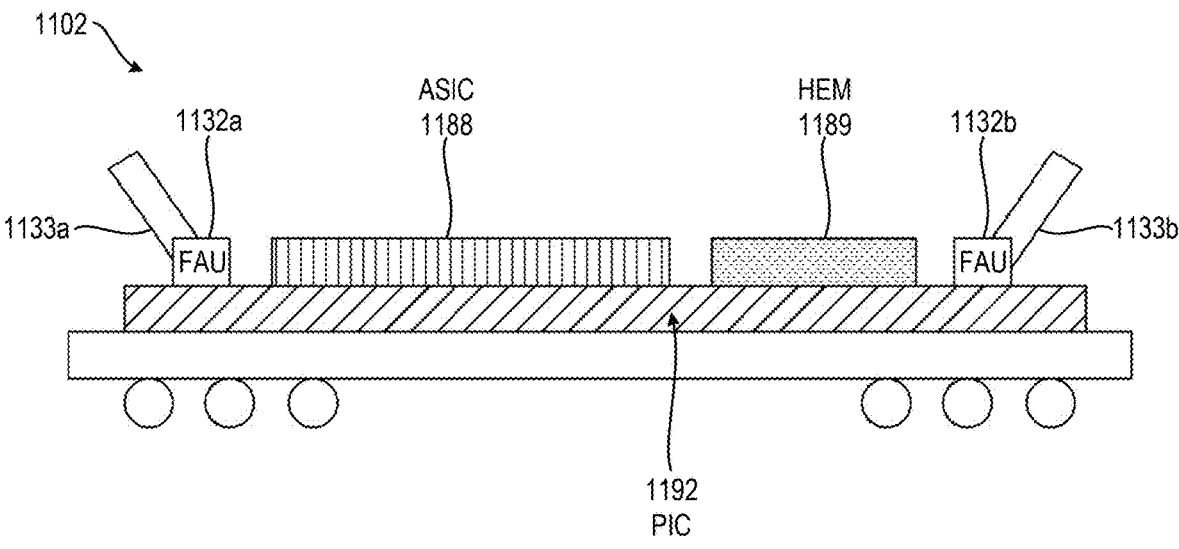
FIG. 18A shows another side view of the SIP according to one or more embodiments disclosed in this disclosure.

To illustrate, FIG. 18A shows the side view of a system-in-package (SIP). As shown, FIG. 18A shows a SIP 1102 having the PIC 1192 coupled to an EIC, which is part of the ASIC 1188. For example, the SIP 1102 is stacked in a direct coupling with the EIC.

In various embodiments, the PIC 1192 is a silicon photonic IC. Additionally, FIG. 18A includes the HBM 1189 (high bandwidth memory). As noted above, components of the ASIC 1188 generate heat when performing processing operations, such as neural network processing and various other computing tasks.

FIG. 18A also includes the SIP 1102 having the first optical fiber 1133*a*, the first fiber array unit 1132*a*, the second optical fiber 1133*b*, and the second fiber array unit 1132*b*, as introduced above. For example, a fiber array unit (FAU) and its corresponding optical fiber are situated over the PIC 1192 and provide optical input to the PIC 1192. In various embodiments, the optical fiber is connected to an off-chip laser light source (e.g., light engine) and/or to another processor's FAU that provides optical input to the PIC 1192.

Along these lines, the apparatus may further include nodes having routers each having a transmit unit and a receive unit, where the transmit unit and the receive unit reside partially in the EIC and partially in the PIC. In various embodiments, each transmit unit includes a thermally-stable optical modulator (e.g., an EAM) in a portion that resides in the PIC. The data may be moved optically in the PIC via an optical carrier between one of the thermally-stable optical modulators in a first node and one of the receive units in a second node.

As mentioned above, in one or more embodiments, the thermally-stable optical modulator is an EAM that operates in a temperature range smaller than 30 degrees Centigrade. In this example, the thermally-stable optical modulator may include (e.g., consist of) materials selected from a group consisting of germanium, silicon, an alloy of germanium, an alloy of silicon, an III-V material based on indium phosphide (InP), and an III-V material based on gallium arsenide (GaAs). In one or more embodiments, the thermally-stable optical modulator uses a quantum confined stark effect (QCSE) for an electrically-induced change in optical absorption. Additionally, in various embodiments, the EAM (e.g., the thermally-stable optical modulator) has an output that has a high optical modulation amplitude.

Figure 18B:
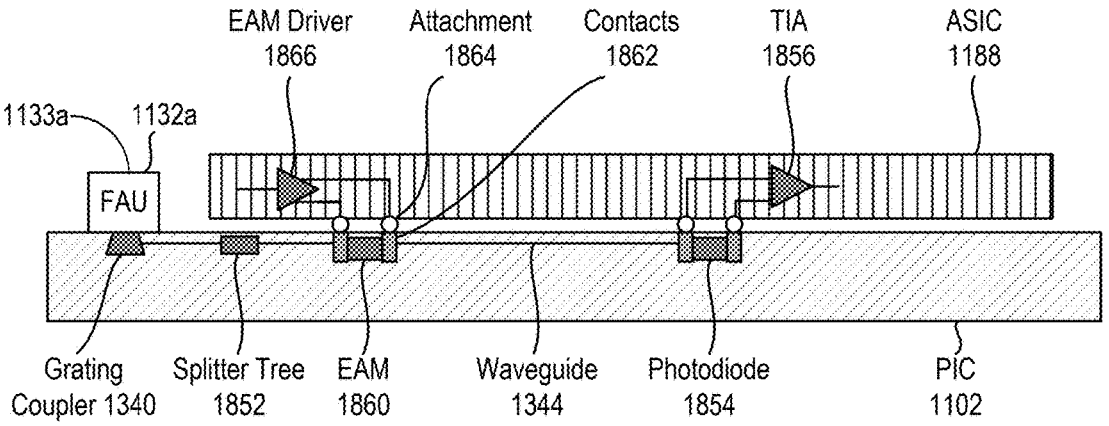
FIG. 18B shows a more detailed side view of a SIP according to one or more embodiments disclosed in this disclosure.

FIG. 18B shows a more detailed side view of a SIP. As shown, FIG. 18B includes the SIP 1102 having the first fiber array unit 1132a and being coupled to the ASIC 1188. In various embodiments, the ASIC 1188 is a 5 nm system-on-chip (SOC).

In addition, FIG. 18B shows a waveguide 1344 (e.g., a channel waveguide) as part of the SIP 1102. The waveguide 1344 includes a grating coupler attached to the first fiber array unit 1132a, a splitter tree 1852, and an EAM 1860 (electro-absorption modulator) having contacts 1862 with the ASIC 1188 via an attachment 1864. In various embodiments, the attachment is a pillar attachment, such as a 50 μm pillar. The waveguide 1344 also includes a photodiode 1854 that attaches to the ASIC 1188.

As shown, the ASIC 1188 includes an EAM driver 1866 electronically connected to the EAM 1860. Further, the ASIC 1188 includes a TIA 1856 (trans-impedance amplifier) electronically connected to the photodiode 1854.

In various embodiments, in a design like the photonic fabric, an ASIC is directly coupled to a PIC, such as shown in FIG. 18B. While FIG. 18B shows a particular configuration of a direct coupling between electronic and photonic elements, many other examples are possible. For example, while a copper pillar attachment connects an EAM driver to an EAM as well as connects a photodiode to a TIA, other embodiments for direct coupling (chip-to-chip packaging) can be used.

In various embodiments, the EAM is an optical modulation element that enables light to pass between a cathode and an anode. Additionally, the EAM provides thermal stability at over 30 degrees Centigrade and enables the SIP to be packaged directly with one or more processors of the ASIC and/or memory chips. Indeed, the EAM provides optical connectivity both within a chip and chip-to-chip. Further, the EAM may be about 50 microns in size and/or operate at data rates between 50-115 Gbps, at less than 1.0 volt of power (but up to 2.0 volts).

Figure 19:
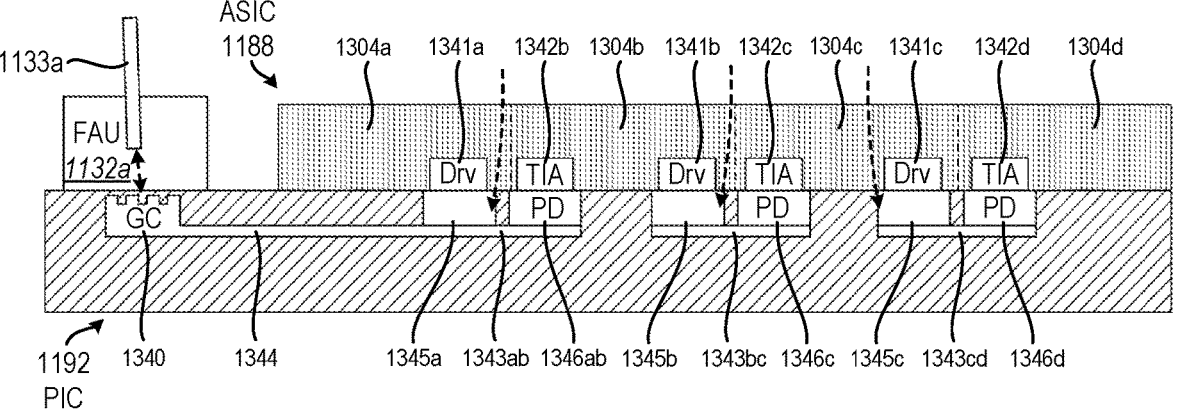
FIG. 19 shows another top view of a portion of a thermal control system for an optical component according to one or more embodiments disclosed in this disclosure.

FIG. 19 shows another top view of a portion of a thermal control system for an optical component according to one or more embodiments disclosed in this disclosure. FIG. 19 includes previously introduced components, such as the PIC 1192, ASIC 1188, optical modulators 1345a, 1345b, and 1345c, and the nodes 1304a, 1304b, 1304c, and 1304c.

As mentioned above, in various embodiments, the nodes 1304a, 1304b, 1304c, and 1304c each include routers. Additionally, in many instances, each of the routers includes a transmit unit and a receive unit. For example, the transmit unit corresponds to the modulator drivers 1341b and 1341c combined with the optical modulators 1345b and 1345c (e.g., EAMs). Also, the receive units correspond to the TIAs 1342b and 1342c combined with the PDs 1346b and 1346c. Indeed, as shown in FIG. 19, the transmit units and receive units reside partially in the EIC (e.g., ASIC 1188) and partially in the PIC 1192.

Additionally, as noted above, in various embodiments, each of the transmit units includes a thermally-stable optical modulator (i.e., the EAM) in the portion that resides in the PIC 1192. Further, data is moved optically in the PIC 1192 via an optical carrier (e.g., the waveguide 1344) between thermally-stable optical modulators (e.g., the first EAM or optical modulators 1345a) in the first node (e.g., the node 1304a) and one of the receive units (e.g., the TIA 1342b and the PD 1346b) in a second node (e.g., the node 1304b).

Figure 20:
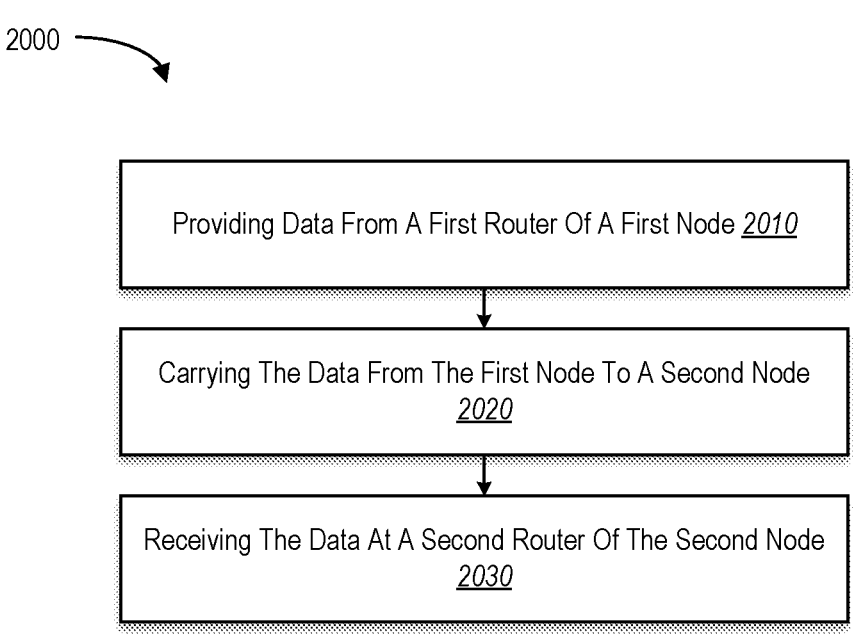
FIG. 20 is a flowchart showing data moving within digital circuits in a photonic fabric according to one or more embodiments disclosed in this disclosure.

FIG. 20 is a flowchart showing data moving within digital circuits in a photonic fabric according to one or more embodiments disclosed in this disclosure. For ease of explanation, FIG. 20 is described as a series of operations or acts 2000.

As shown, the series of acts 2000 includes an act 2010 of providing data from a first router of a first node. For instance, the act 2010 may involve providing data from a first router of a first node, wherein the first router includes a transmit unit that resides partially within a photonic-integrated circuit (PIC) of the first node, wherein the transmit unit includes a thermally-stable optical modulator that resides partially within an electronic-integrated circuit (EIC).

As also shown, the series of acts 2000 includes an act 2020 of carrying the data from the first node to a second node. For instance, the act 2020 may involve carrying the data from the first node to a second node via an optical carrier, such as an optical channel waveguide.

As also shown, the series of acts 2000 includes an act 2030 of receiving the data at a second router of the second node. For instance, the act 2030 may involve receiving the data at a second router of the second node, wherein the second router includes a receive unit that resides partially within the EIC and partially within the PIC.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

Both non-transitory computer-readable storage media (devices) and transmission media may be used temporarily to store or carry, software instructions in the form of computer readable program code that allows performance of embodiments of the present disclosure. Non-transitory computer-readable storage media may further be used to persistently or permanently store such software instructions. Examples of non-transitory computer-readable storage media include physical memory (e.g., RAM, ROM, EPROM, EEPROM, etc.), optical disk storage (e.g., CD, DVD, HDDVD, Blu-ray, etc.), storage devices (e.g., magnetic disk storage, tape storage, diskette, etc.), flash or other solid-state storage or memory, or any other non-transmission medium which can be used to store program code in the form of computer-executable instructions or data structures and which can be accessed by a general purpose or special purpose computer, whether such program code is stored as or in software, hardware, firmware, or combinations thereof.

A "network" or "communications network" may generally be defined as one or more data links that enable the transport of electronic data between computer systems and/ or modules, engines, and/or other electronic devices. When information is transferred or provided over a communication network or another communications connection (either hardwired, wireless, or a combination of hardwired or wireless) to a computing device, the computing device properly views the connection as a transmission medium. Transmission media can include a communication network and/or data links, carrier waves, wireless signals, and the like, which can be used to carry desired program or template code means or instructions in the form of computer-executable instructions or data structures and which can be accessed by a general purpose or special purpose computer.

Further, upon reaching various computer system components, program code in the form of computer-executable instructions or data structures can be transferred automatically or manually from transmission media to non-transitory computer-readable storage media (or vice versa). For example, computer-executable instructions or data structures received over a network or data link can be buffered in memory (e.g., RAM) within a network interface module (NIC), and then eventually transferred to computer system RAM and/or to less volatile non-transitory computer-readable storage media at a computer system. Thus, it should be understood that non-transitory computer-readable storage media can be included in computer system components that also (or even primarily) utilize transmission media.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process and may include values that are within 5%, 1%, 0.1%, or 0.01% of a stated value.

The terms "approximately," "about," and "substantially" as used herein represent an amount close to the stated amount that still performs a desired function or achieves a desired result. For example, the terms "approximately," "about," and "substantially" may refer to an amount that is within less than 5%, 1%, 0.1%, or 0.01% of a stated amount. Further, it should be understood that any directions or reference frames in the preceding description are merely relative directions or movements. For example, any references to "up" and "down" or "above" or "below" are merely descriptive of the relative position or movement of the related elements.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

INDUSTRIAL APPLICABILITY

Clause 1. A circuit package comprising: an interposer having a connection region for receiving a compute element; a chiplet connected to the connection region via an electrical connection of the interposer, for forming a digital packet associated with the connection region; and a transmit unit partially in the chiplet and partially in the interposer for transmitting the digital packet in an optical form through a fiber array unit (FAU) to a photonic interface.

Clause 2. The circuit package of clause 1, further comprising a receive unit partially in the chiplet and partially in the interposer for receiving an optical signal from the FAU and providing the optical signal in a digital form to an electrical portion of the chiplet.

Clause 3. The circuit package of clause 1, wherein the chiplet receives a message request from the compute element requesting access to a memory controller or a compute controller associated with the photonic interface.

Clause 4. The circuit package of clause 3, wherein: the chiplet includes a router that receives the message request from the compute element via the electrical connection of the interposer; and the router in the chiplet forms the digital packet that includes the message request from the compute element and routing information for the message request indicating a destination of the memory controller or the compute controller being requested.

Clause 5. The circuit package of clause 4, wherein the transmit unit transmits the message request in the optical form through the FAU to the photonic interface based on the routing information.

Clause 6. The circuit package of clauses 1, wherein a router on the chiplet includes the transmit unit and a receive unit.

Clause 7. The circuit package of clauses 1, wherein the photonic interface is part of an electro-photonic memory fabric that includes multiple nodes.

Clause 8. The circuit package of clause 1, wherein: the interposer is a photonic integrated circuit interposer (PIC interposer); and the chiplet has a bottom surface coupled to the connection region of the PIC interposer via the electrical connection.

Clause 9. The circuit package of clause 1, wherein: the interposer is a standard interposer connected to a PIC interposer; the chiplet has a bottom surface coupled to the PIC interposer, which is coupled to the connection region of the standard interposer; and the electrical connection passes through the PIC interposer and the standard interposer.

Clause 10. A memory fabric comprising: multiple nodes connected via photonic channels; a connection region in each of the multiple nodes for receiving corresponding compute elements; a message router in each of the multiple nodes having an electrical port for receiving a digital input from an optical receive unit and for providing a digital output to an optical transmit unit; a routing controller in each of the multiple nodes for generating modified digital input from the digital input and providing the modified digital input as modified digital output to the electrical port when a current node of the multiple nodes is not a destination node;

and a memory controller or a compute controller in each node for receiving the digital output from the electrical port at the connection region when the current node is the destination node.

Clause 11. The memory fabric of clause 10, wherein: a first node of the multiple nodes has a first optical transmit unit connected via a first photonic channel to a second optical receive unit in a second node; and the second node has a second optical transmit unit connected via a second photonic channel to a first optical receive unit in the first node.

Clause 12. The memory fabric of clause 11, wherein the first photonic channel and the second photonic channel include intra-chip links or inter-chip links.

Clause 13. The memory fabric of clause 10, wherein the memory controller or the compute controller provides data to the electrical port in response to interacting with the connection region.

Clause 14. The memory fabric of clause 10, wherein modifying the digital input include modifying routing information of a packet that includes a message request and the routing information.

Clause 15. The memory fabric of clause 14, modifying the routing information of the packet includes decrementing a value in the routing information corresponding to a location of the destination node of the multiple nodes in the memory fabric.

Clause 16. The memory fabric of clause 10, wherein the routing controller sends the modified digital output to an adjacent node in the memory fabric by: converting the digital output to an optical signal; and sending the optical signal to the adjacent node via a photonic interface of the memory fabric.

Clause 17. A method of using a memory fabric comprising: receiving a request in a chiplet for a compute or memory controller in a destination node of the memory fabric; forming a packet that includes the request and routing information of the request; transmitting the packet photonically from a first optical interface of the chiplet to a second optical interface of a node in the memory fabric, the first and second interfaces being connected via an optical fiber; converting the packet to a digital form in an electrical port of the node; based on determining that the node in the memory fabric is the destination node, interacting with the requested memory controller or the requested compute controller in the destination node; and based on determining that the node in the memory fabric is not the destination node, transmitting the packet photonically to a next node.

Clause 18. The method of clause 17, further comprising, modifying the packet to update the routing information of the request based on determining that the node in the memory fabric is not the destination node.

Clause 19. The method of clause 18, wherein transmitting the packet photonically to the next node includes converting the digital form back to a photonic form after modifying the packet and before providing the packet to the next node.

Clause 20. The method of clause 17, wherein the request is received from a compute element that is electrically interconnected to a circuit package that includes the chiplet.

Clause 21. A thermal control system comprising: a semiconductor having an optical layer stacked with an electrical layer, the semiconductor partitioned into an electrical-only region and an optoelectrical region; one or more nodes in the optoelectrical region, each of the one or more nodes residing in the optical layer and the electrical layer, a first portion of each of the one or more nodes residing in the optical layer and having at least one optical modulator and one or more heat-producing elements residing in the electrical layer and radiating heat toward the optical layer; a temperature sensing region in a second portion of each of the one or more nodes, the temperature sensing region having a temperature sensor therein for sending a thermal signal to the electrical-only region, the thermal signal associated with a current temperature of the at least one optical modulator; and a controller in the electrical-only region having an electrical interconnect to each of the one or more nodes for receiving the thermal signal from the temperature sensor and for sending a new voltage signal to the optoelectrical region based on the thermal signal.

Clause 22. The thermal control system of clause 21, wherein the controller includes a control circuit comprised of hardware, software, or firmware.

Clause 23. The thermal control system of clause 21, wherein the at least one optical modulator is selected from a group consisting of an electro-absorption modulator (EAM) and a quantum confined stark effect (QCSE) electro-absorptive modulator.

Clause 24. The thermal control system of clause 21, wherein the new voltage signal is a negative DC bias voltage that is associated with a value of the thermal signal.

Clause 25. The thermal control system of clause 21, wherein the at least one optical modulator has an anode and a cathode and wherein the controller sends an AC swing signal to the cathode and the new voltage signal to the anode.

Clause 26. The thermal control system of clause 21, further comprising a table including a plurality of voltage values associated with a plurality of temperatures, wherein the controller selects a voltage value for the new voltage signal using the table and the current temperature.

Clause 27. The thermal control system of clause 21, further comprising a function for computing the new voltage signal using a product of the current temperature and an activation function.

Clause 28. The thermal control system of clause 21, wherein the one or more heat-producing elements are selected from a group consisting of central processing units (CPUs), graphics processing units (GPUs), memory units, message routers, tensor engines, digital neural networks, field-programmable gate arrays (FPGAs), and processing elements.

Clause 29. A system-in-package (SIP) comprising: a photonic integrated circuit (PIC); an electronic integrated circuit (EIC) having an electrical connection with the PIC; a node having a first portion of the node residing in the EIC and a second portion of the node residing in the PIC; a plurality of heat-producing elements in the first portion of the node that radiates heat toward the second portion of the node, thereby causing a thermal change in the second portion of the node; a plurality of optical modulators in the second portion of the node; and a temperature sensing region in the second portion of the node for sending a current temperature to a controller, wherein the controller sends a first signal to each of the plurality of optical modulators based on the current temperature.

Clause 30. The SIP of clause 29, wherein the first signal is a DC bias voltage signal.

Clause 31. The SIP of clause 29, wherein each of the plurality of optical modulators includes a cathode and an anode, and wherein the first signal is sent to the anode of each of the plurality of optical modulators.

Clause 32. The SIP of clause 31, wherein the controller is further configured to send a second signal to the cathode of each of the plurality of optical modulators, the second signal comprising an AC swing signal.

Clause 33. The SIP of clause 29, wherein the controller includes a control circuit comprised of hardware, software, or firmware.

Clause 34. The SIP of clause 29, wherein the plurality of optical modulators is selected from a group consisting of electro-absorption modulators (EAM) and quantum confined stark effect (QCSE) electro-absorptive modulators.

Clause 35. The SIP of clause 31, wherein the controller sends an AC swing signal to the cathode of the plurality of optical modulators.

Clause 36. The SIP of clause 29, further comprising a table including a plurality of voltage values associated with a plurality of temperatures, wherein the controller selects a voltage value for the first signal using the table and the current temperature.

Clause 37. The SIP of clause 29, further comprising a function for computing the first signal using a product of the current temperature and an activation function.

Clause 38. The SIP of clause 29, wherein the plurality of heat-producing elements is selected from a group consisting of central processing units (CPUs), graphics processing units (GPUs), memory units, message routers, tensor engines, digital neural networks, field-programmable gate arrays (FPGAs), and processing elements.

Clause 39. The SIP of clause 29, wherein the temperature sensing region is off-center within the node.

Clause 40. A method for controlling a thermal variable associated with a plurality of optical components, comprising: applying a first signal to a cathode of each of the plurality of optical components; applying a second signal to an anode of each of the plurality of optical components; sensing a temperature in a region associated with the plurality of optical components; receiving a current temperature associated with the region; and determining when to initiate a thermal control over the plurality of optical components using the current temperature, wherein when a first one of the plurality of optical components is an inter-chip modulator, obtaining a first voltage and sending the first voltage to the anode of the inter-chip modulator, and wherein when a second one of the plurality of optical components is an intra-chip modulator, obtaining a second voltage and sending the second voltage to the anode of the intra-chip modulator, the second voltage has a different value than the first voltage.

Clause 41. The method of clause 40, wherein determining when to initiate the thermal control over the plurality of optical components is performed using a control circuit.

Clause 42. The method of clause 40, wherein the second signal is a DC bias voltage signal.

Clause 43. The method of clause 40, wherein the first signal comprises an AC swing signal.

Clause 44. The method of clause 41, wherein the control circuit includes hardware, software, or firmware.

Clause 45. The method of clause 41, wherein the plurality of optical components is selected from a group consisting of electro-absorption modulators (EAM) and quantum confined stark effect (QCSE) electro-absorptive modulators.

Clause 46. The method of clause 40, further comprising a table including a plurality of voltage values associated with a plurality of temperatures, wherein determining when to initiate the thermal control over the plurality of optical components further comprises accessing the table.

Clause 47. The method of clause 46, wherein determining when to initiate the thermal control over the plurality of optical components further comprises comparing the current temperature to the plurality of temperatures.

Clause 48. The method of clause 47, wherein sending the first voltage and the second voltage comprise selecting one or more rows in the table and obtaining a value from one or more columns associated with the one or more rows.

Clause 49. The method of clause 40, further comprising one or more functions, wherein sending the first voltage to the anode of the inter-chip modulator and sending the second voltage to the anode of the inter-chip modulator comprise calculating the first voltage and the second voltage by multiplying the current temperature with an activation function.

Clause 50. An apparatus, comprising: an electronic-integrated circuit (EIC); a photonic-integrated circuit (PIC) stacked in a direct coupling with the EIC; and a plurality of nodes having routers, each of the routers including a transmit unit and a receive unit, wherein the transmit unit and the receive unit reside partially in the EIC and partially in the PIC, wherein each transmit unit includes a thermally-stable optical modulator in a portion that resides in the PIC, and wherein data is moved optically in the PIC via an optical carrier between a thermally-stable optical modulator in a first node and a receive unit in a second node.

Clause 51. The apparatus of clause 50, wherein the thermally-stable optical modulator operates in a temperature range larger than 30 degrees Centigrade and consists of materials selected from germanium, silicon, an alloy of germanium, an alloy of silicon, an III-V material based on indium phosphide (InP), or an III-V material based on gallium arsenide (GaAs).

Clause 52. The apparatus of clause 51, wherein the thermally-stable optical modulator is an electro-absorption modulator (EAM) that uses a Franz-Keldysh effect for electrically-induced changes in optical absorption.

Clause 53. The apparatus of clause 50, wherein the thermally-stable optical modulator is an EAM that operates in a temperature range smaller than 30 degrees Centigrade.

Clause 54. The apparatus of clause 53, wherein the thermally-stable optical modulator is an EAM that consists of materials selected from a group consisting of germanium, silicon, an alloy of germanium, an alloy of silicon, an III-V material based on InP, and an III-V material based on GaAs.

Clause 55. The apparatus of clause 53, wherein the thermally-stable optical modulator uses a quantum confined stark effect (QCSE) for an electrically-induced change in optical absorption.

Clause 56. The apparatus of clause 50, wherein the thermally-stable optical modulator has an output that has a high optical modulation amplitude and consists of materials selected from a group consisting of germanium, silicon, an alloy of germanium, an alloy of silicon, an III-V material based on InP, and an III-V material based on GaAs.

Clause 57. The apparatus of clause 56, wherein the thermally-stable optical modulator uses a QCSE for an electrically-induced change in optical absorption.

Clause 58. The apparatus of clause 50, wherein the thermally-stable optical modulator is configured for stable operation over a wide temperature range and consists of materials selected from a group consisting of germanium, silicon, an alloy of germanium, an alloy of silicon, an III-V material based on InP, and an III-V material based on GaAs.

Clause 59. A method of moving data within digital circuits in a photonic fabric comprising: providing data from a first router of a first node, wherein the first router includes a transmit unit that resides partially within a photonic-integrated circuit (PIC) of the first node, wherein the transmit unit includes a thermally-stable optical modulator that resides partially within an electronic-integrated circuit (EIC); carrying the data from the first node to a second node via an optical carrier; and receiving the data at a second router of the second node, wherein the second router includes a receive unit that resides partially within the EIC and partially within the PIC.

Clause 60. The method of clause 59, wherein the thermally-stable optical modulator is an EAM optical modulator is an electro-absorption modulator (EAM) that uses a Franz-Keldysh effect for electrically-induced changes in optical absorption.

Clause 61. The method of clause 60, wherein the thermally-stable optical modulator is an EAM that operates in a temperature range smaller than 30 degrees Centigrade.

Clause 62. The method of clause 60, wherein the EIC is directly coupled with the PIC.

Clause 63. The method of clause 62, wherein the EAM on the PIC is thermally-stable within 50 microns of the EIC.

Clause 64. The method of clause 59, wherein the first node and the second node are a same node.

Clause 65. The method of clause 59, wherein the first node and the second node are different nodes.

Clause 66. The method of clause 59, wherein the thermally-stable optical modulator uses a quantum confined stark effect (QCSE) for an electrically-induced change in optical absorption.

Clause 67. The method of clause 59, wherein the thermally-stable optical modulator has an output that has a high optical modulation amplitude.

Clause 68. The method of clause 67, wherein the thermally-stable optical modulator uses a QCSE for an electrically-induced change in optical absorption.

Clause 69. The method of any of clauses 59-68, wherein the thermally-stable optical modulator operates in a temperature range larger than 30 degrees Centigrade and consists of materials selected from germanium, silicon, an alloy of germanium, an alloy of silicon, an III-V material based on indium phosphide (InP), or an III-V material based on gallium arsenide (GaAs).

Clause 70. The method of clause 59, wherein the EIC operates on a digital application-specific integrated circuit (ASIC).

What is claimed is:

1. A thermal control system comprising:
a semiconductor having an optical layer stacked with an electrical layer, the semiconductor partitioned into an electrical-only region and an optoelectrical region;
one or more nodes in the optoelectrical region, each of the one or more nodes residing in the optical layer and the electrical layer, a first portion of each of the one or more nodes residing in the optical layer and having at least one optical modulator and one or more heat-producing elements residing in the electrical layer and radiating heat toward the optical layer;
a temperature sensing region in a second portion of each of the one or more nodes, the temperature sensing region having a temperature sensor therein for sending a thermal signal to the electrical-only region, the thermal signal associated with a current temperature of the at least one optical modulator; and
a controller in the electrical-only region having an electrical interconnect to each of the one or more nodes for receiving the thermal signal from the temperature sensor and for sending a new voltage signal to the optoelectrical region based on the thermal signal.

2. The thermal control system of claim 1, wherein the at least one optical modulator is selected from a group consisting of an electro-absorption modulator (EAM) and a quantum confined stark effect (QCSE) electro-absorptive modulator.

3. The thermal control system of claim 1, wherein the new voltage signal is a negative DC bias voltage that is associated with a value of the thermal signal.

4. The thermal control system of claim 1, wherein the at least one optical modulator has an anode and a cathode and wherein the controller sends an AC swing signal to the cathode and the new voltage signal to the anode.

5. The thermal control system of claim 1, further comprising a table including a plurality of voltage values associated with a plurality of temperatures, wherein the controller selects a voltage value for the new voltage signal using the table and the current temperature.

6. The thermal control system of claim 1, further comprising a function for computing the new voltage signal using a product of the current temperature and an activation function.

7. The thermal control system of claim 1, wherein the one or more heat-producing elements are selected from a group consisting of central processing units (CPUs), graphics processing units (GPUs), memory units, message routers, tensor engines, digital neural networks, field-programmable gate arrays (FPGAs), and processing elements.

8. A system-in-package (SIP) comprising:
a photonic integrated circuit (PIC);
an electronic integrated circuit (EIC) having an electrical connection with the PIC;
a node having a first portion of the node residing in the EIC and a second portion of the node residing in the PIC;
a plurality of heat-producing elements in the first portion of the node that radiates heat toward the second portion of the node, thereby causing a thermal change in the second portion of the node;
a plurality of optical modulators in the second portion of the node; and
a temperature sensing region in the second portion of the node for sending a current temperature to a controller, wherein the controller sends a first signal to each of the plurality of optical modulators based on the current temperature.

9. The SIP of claim 8, wherein the first signal is a DC bias voltage signal.

10. The SIP of claim 8, wherein each of the plurality of optical modulators includes a cathode and an anode, and wherein the first signal is sent to the anode of each of the plurality of optical modulators.

11. The SIP of claim 10, wherein the controller is further configured to send a second signal to the cathode of each of the plurality of optical modulators, the second signal comprising an AC swing signal.

12. The SIP of claim 10, wherein the controller sends an AC swing signal to the cathode of the plurality of optical modulators.

13. A method for controlling a thermal variable associated with a plurality of optical components, comprising:
applying a first signal to a cathode of each of the plurality of optical components;
applying a second signal to an anode of each of the plurality of optical components;
sensing a temperature in a region associated with the plurality of optical components;
receiving a current temperature associated with the region;

determining when to initiate a thermal control over the plurality of optical components using the current temperature; and wherein when a first one of the plurality of optical components is an inter-chip modulator, obtaining a first voltage and sending the first voltage to the anode of the inter-chip modulator;

wherein when a second one of the plurality of optical components is an intra-chip modulator, obtaining a second voltage and sending the second voltage to the anode of the intra-chip modulator, the second voltage has a different value than the first voltage.

14. The method of claim 13, wherein determining when to initiate the thermal control over the plurality of optical components is performed using a control circuit.

15. The method of claim 13, wherein the second signal is a DC bias voltage signal.

16. The method of claim 13, wherein the first signal comprises an AC swing signal.

17. The method of claim 14, wherein the plurality of optical components is selected from a group consisting of electro-absorption modulators (EAM) and quantum confined stark effect (QCSE) electro-absorptive modulators.

18. The method of claim 13, further comprising a table including a plurality of voltage values associated with a plurality of temperatures, wherein determining when to initiate the thermal control over the plurality of optical components further comprises accessing the table.

19. The method of claim 13, wherein sending the first voltage and the second voltage comprise selecting one or more rows in a table and obtaining a value from one or more columns associated with the one or more rows.

20. The method of claim 13, further comprising one or more functions, wherein sending the first voltage to the anode of the inter-chip modulator and sending the second voltage to the anode of the inter-chip modulator comprise calculating the first voltage and the second voltage by multiplying the current temperature with an activation function.

* * * * *